United States Patent [19]
Satoh et al.

[11] Patent Number: 5,841,145
[45] Date of Patent: Nov. 24, 1998

[54] METHOD OF AND SYSTEM FOR EXPOSING PATTERN ON OBJECT BY CHARGED PARTICLE BEAM

[75] Inventors: Takamasa Satoh; Yoshihisa Oae; Soichiro Arai; Kenichi Miyazawa; Hiroshi Yasuda; Manabu Ohno; Hitoshi Watanabe; Junichi Kai; Tomohiko Abe; Akio Yamada; Yasushi Takahashi, all of Kawasaki, Japan

[73] Assignee: Fujitsu Limited, Kawasaki, Japan

[21] Appl. No.: 610,350

[22] Filed: Mar. 4, 1996

[30] Foreign Application Priority Data

| Mar. 3, 1995 | [JP] | Japan | 7-044651 |
| May 29, 1995 | [JP] | Japan | 7-130683 |
| Aug. 23, 1995 | [JP] | Japan | 7-214498 |
| Nov. 10, 1995 | [JP] | Japan | 7-292650 |

[51] Int. Cl.$^6$ .................................................. H01J 37/302
[52] U.S. Cl. ................................................ 250/492.22
[58] Field of Search .................. 250/492.22, 492.2, 250/398

[56] References Cited

U.S. PATENT DOCUMENTS

| 5,448,075 | 9/1995 | Fueki et al. | 250/492.22 |
| 5,528,048 | 6/1996 | Oae et al. | 250/492.22 |

FOREIGN PATENT DOCUMENTS

| 2-265236 | 10/1990 | Japan . |
| 4-211111 | 8/1992 | Japan . |

*Primary Examiner*—Kiet T. Nguyen
*Attorney, Agent, or Firm*—Staas & Halsey

[57] ABSTRACT

By using a blanking aperture array BAA, the density of the bit map data in the portions where adjacent areas are linked is decreased toward the outside. On the lower surface of the holder of the BAA chip, a ball grid array wired to blanking electrodes is formed, to be pressed in contact against pads on a wiring base board. The registered bit map data for an isosceles right triangle are read out from address $A=A0+[RA \cdot i]$ (A0 and i are integers, [ ] is an operator for integerizing), masked, and then shifted by bits to be deformed. From registered bit map data for proximity effect correction, the area which corresponds to the size of the object of correction and the required degree of proximity affect correction is extracted, and logic operation with the bit map data of the object of correction is performed to achieve proximity affect correction. Before figures data are expanded into bit map, a checksum is determined in units of bit map data corresponding to the range of one session of scanning over which continuous exposure is possible. A sine wave voltage is provided to an electrostatic deflector and during a one-shot exposure period, an electron beam is caused to scan for an integer number of times on a block of a mask and the positional misalignment of the electron beam at the lower aperture stop is corrected.

45 Claims, 47 Drawing Sheets t = 0 t = 3T t = 6T

☒ : '1'
☐ : '0'

FIG.30(A) 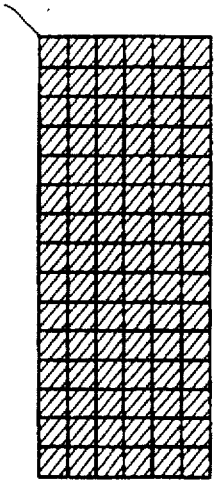 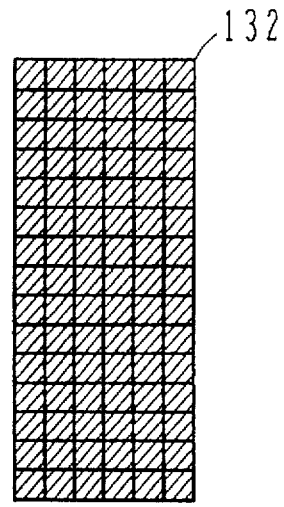
FIG.30(B) 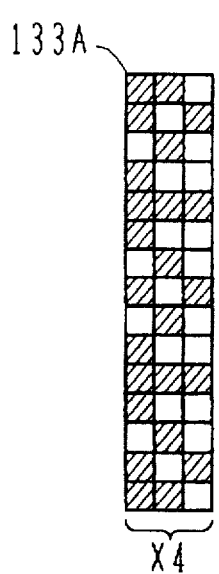 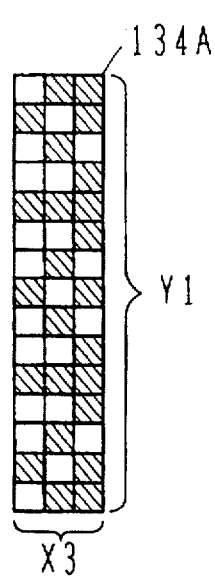
FIG.30(C) 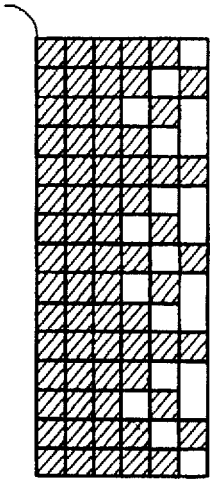 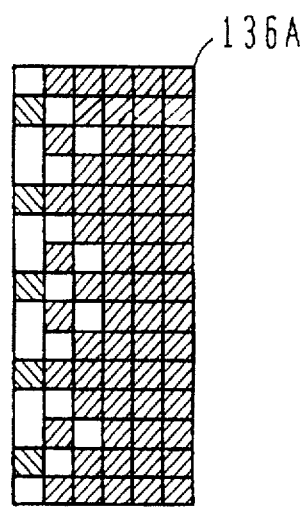

FIG.43(A1) prior art
FIG.43(A2) prior art
FIG.43(A3) prior art
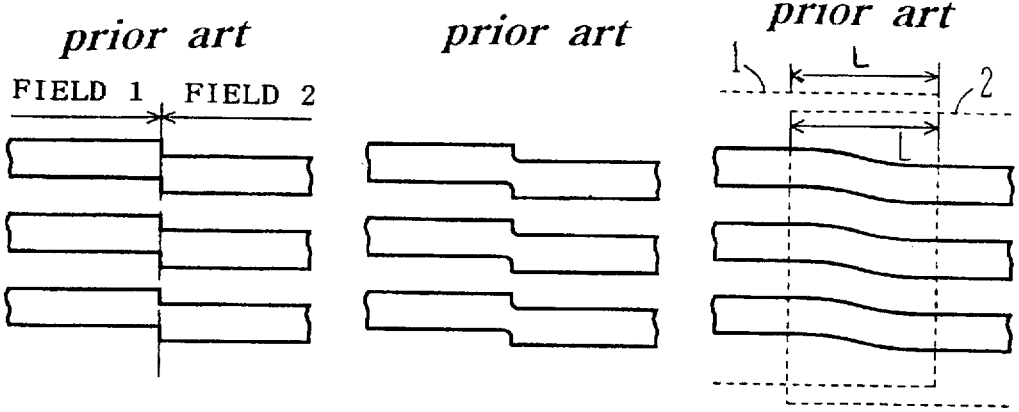
FIG.43(B1) prior art
FIG.43(B2) prior art
FIG.43(B3) prior art
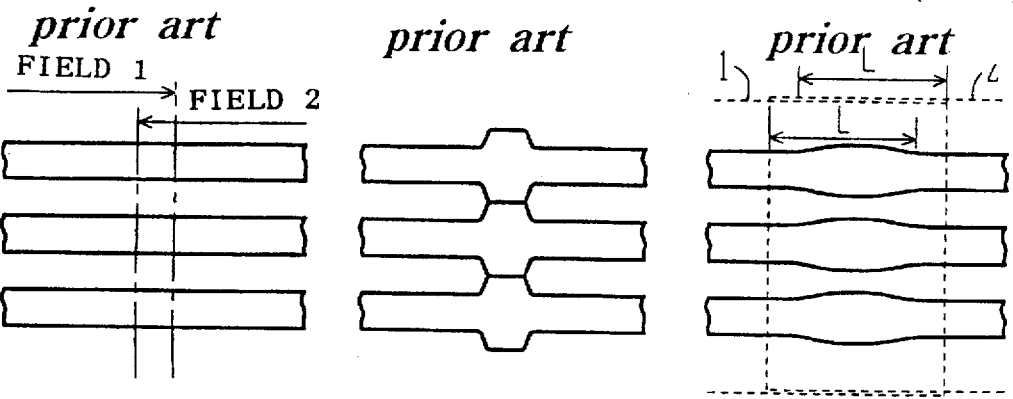
FIG.43(C1) prior art
FIG.43(C2) prior art
FIG.43(C3) prior art
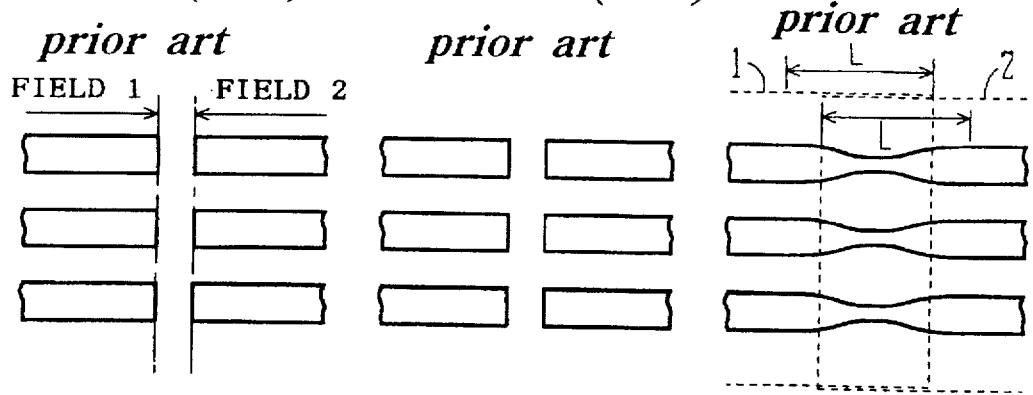

*FIG.44(A)*
prior art
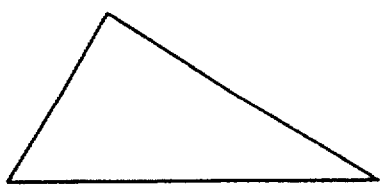
*FIG.44(B)*
prior art
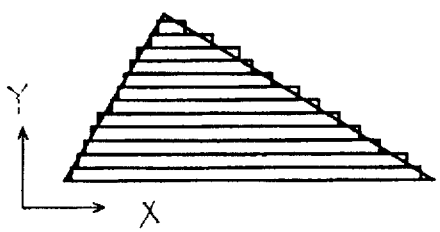
*FIG.44(C)*
prior art
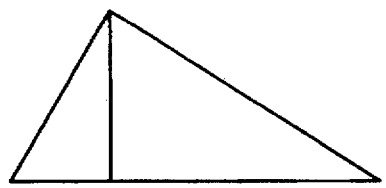
*FIG.44(D)*
prior art
*FIG.44(E)*
prior art
*FIG.44(F)*
prior art
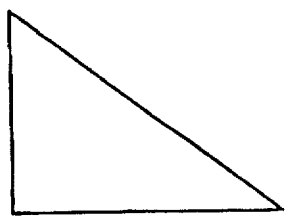 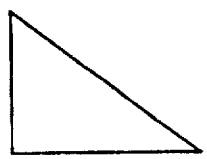 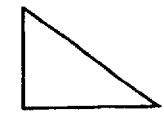

METHOD OF AND SYSTEM FOR EXPOSING PATTERN ON OBJECT BY CHARGED PARTICLE BEAM

BACKGROUND OF THE INVENTION

1. Field of the Invention

The present invention relates to a method of and a system for exposing a pattern on an object, such as a semiconductor wafer or a mask coated with resist, by a charged particle beam.

2. Description of the Related Art

In the current trend for miniaturization of the elements used in semiconductor integrated circuits, application of charged particle beam exposure systems in mass production is eagerly awaited. Generally, electrons are used for charged particles. In such a system, it is possible to perform fine processing at 0.05 μm or smaller with a positioning precision of 0.02 μm or smaller.

In the prior art method, in which one spot is exposed in one shot, as shown in FIG. 42(A), the inside of the field 2 is exposed by moving the stage in steps after exposing the inside of the field 1, which is the range of electron beam deflection. Consequently, a misalignment is created in the area where the wiring pattern W1 in the field 1 and the wiring pattern W2 in the field 2 are linked, due to errors in stage movement and deflection, as well as thermal drift in the analog circuit, drift of the electron beam and so on.

As shown in FIG. 43(A1), when the field 1 and the field 2 are misaligned in the direction of their boundary, the resist pattern is as shown in FIG. 43(A2), and if the misalignment is great, there may be a shorting in the connecting area. As shown in FIG. 43(B1), when the field 1 and the field 2 are misaligned in the direction in which they approach each other at a right angle to their boundary, because of the proximity effect, the resist pattern is as shown in FIG. 43(B2) with a shorting occurring in the connecting area. As shown in FIG. 43(C1), when the field 1 and the field 2 are misaligned in the direction in which they recede from each other at a right angle to their boundary, the resist pattern is as shown in FIG. 43(C2), resulting in disconnection in the connecting area. These problems become more pronounced as the resist pattern becomes more minute.

To deal with these problems, a method has been disclosed (First Publication No. 2-265236 of Japanese Patent Application), in which the resist pattern is caused to change gently in the connecting area, as shown in FIG. 42(C) by increasing the range of the field 1 and the field 2 by the length L toward the outside and by reducing the dose in these enlarged areas linearly toward the outside as shown in FIG. 42(B).

By employing this method, instead of the resist patterns shown in FIGS. 43(A2), (B2) and (C2), resist patterns as shown in FIGS. 43 (A3), (B3) and (C3) respectively are obtained and since the resist patterns in the connecting area change gently, the problems of shorting and disconnection described above are avoided.

However, in a method through which one spot is exposed in one shot, the throughput of the exposure system is low, even without employing the method described above and if it is employed, since exposure must be performed one shot at a time while reducing the dose in steps, as shown in the bar graph, in the enlarged areas with the length L as shown in FIG. 42(B), the throughput is further reduced.

On the other hand, there is a method that uses a blanking aperture array to make electron beam multi-beam (U.S. Pat No. 4,153,843 corresponding to First Publication No. 53-117387 of Japanese Patent Application). With this method, exposure of minute patterns at high speed of approximately 1 $cm^2$/sec is expected.

Since the method of FIG. 42(B) described above cannot be applied to a method that uses a blanking aperture array, expansions of a method and a system for exposure in which a blanking aperture array is used and which can make the resist pattern in the connecting areas change gently, is much needed.

In an exposure system using the blanking aperture array, since a charged particle beam is scanned, exposure time is longer compared to optical exposure, and it is necessary to improve the throughput of the charged particle beam exposure system.

For instance, there are 1024 pairs of blanking electrodes on a BAA chip and since one blanking electrode in each pair is commonly connected with 0V applied, at least 1025 lead wires are required to apply a voltage to these electrodes from the outside.

In the prior art, the BAA chip is bonded to a package as in the case of an LSI, and wire bonding is performed between the pads on the BAA chip and the pads on the package. The package is then plugged into a socket secured on a PCB, flexible wiring is connected to a terminal at the edge of the board, the board is placed inside a lens barrel and the flexible wiring is lead out to the outside of the lens barrel to be connected to the output of a driver (First Publication No. 7-254540 of Japanese Patent Application).

However, a BAA chip is consumable, and when replacing it, bonds are required for more than 1000 wires. Also, since the wiring from the output of the driver to the electrodes on the BAA chip is long, at 300 mm or more, the waveform of the voltage pulse applied to the electrodes becomes dulled, limiting the data transfer rate which, in turn, results in reduced throughput in exposure. As the current target for data transfer rate is 400 MHz, it is crucial that no dulling of the waveform of the voltage pulse applied to the electrodes should occur, in order to achieve an improvement in the throughput of exposure.

In order to facilitate replacement of the BAA chip, a structure in which approximately 1000 L-shaped probes are placed in contact with the pads on the BAA chip is used (First Publication No. 7-254540 above). In such a structure, in order to ensure ohmic contact between the pads on the BAA chip and the probes, a 10 g force is required to bear upon each probe, with this force on all the probes totalling approximately 10 kg. In order to make approximately 1000 miniature pads on the BAA chip press against the probes in contact, it is necessary to arrange the pads in 4 columns and, in correspondence to those 4 columns, divide the probes into 4 levels in the direction of the optical axis by employing L-shaped probes with their bends at 4 different positions. This weakens the structure and, as in the case described above, the wiring becomes long, limiting data transfer rate and reducing throughput of exposure.

In a charged particle beam exposure system, a bit map data is used. The bit map data is created by first resolving a pattern into basic figures such as rectangles and triangles and then further expanding these into a bit map data. For instance, when expanding a regular triangle as shown in FIG. 44(A) into a bit map data, the triangle is resolved into band rectangles with their lengths running parallel to the bottom side as shown in FIG. 44(B) with their width equivalent to 1 bit and in such a case, the time required for expanding is long.

In order to deal with this, as shown in FIG. 44(C), the regular triangle is divided into two right triangles and the bit map data obtained by expanding these are registered in storage in advance. Then, by reading out the registered bit map data corresponding to the specified basic figure, the processing is speeded up compared to the method shown in FIG. 44(B).

However, since one triangle must be first divided into two right triangles, and then each of the right triangles obtained by the division must be expanded into a bit map data, the increase in processing speed is still not fully achieved.

Moreover, even with triangles that are analogous to each other, as shown in FIG. 44(D) to 44(F), the bit map data for each triangle must be separately registered in the library. The same applies to triangles whose angles are different from each other and to other basic figures. This requires registering bit map data for many basic figures in the library, complicating the registration processing and specification of the registered data, resulting in reduction in efficiency.

As patterns become finer, the problem caused by a proximity effect expanded resist patterns are distorted due to dispersion of the charged particle beam on the semiconductor wafer 10. Thus, it becomes necessary to correct the bit map data to ensure that the resist pattern obtained is the desired pattern. Since the proximity effect on a given pattern varies depending upon the forms of the surrounding patterns and the space between them, varied correction must be performed accordingly.

FIG. 45(A) shows the bit map of patterns 3 and 4 in close proximity to each other, for which correction for the proximity effect has been performed. For instance, a hatched square indicates bit '1' where the charged particle beam is irradiated and a unhatched square indicates bit '0' where the charged particle beam is not irradiated. The dose quantity on the semiconductor wafer corresponding to line B—B is FIG. 45(A), is as indicated with the curve 6P in FIG. 45(B) The curve 3P represents the dose distribution when there is only pattern 3 with '0' in pattern 3 replaced by '1' and the curve 4P represents the dose distribution when there is only pattern 4 with '0' in pattern 4 replaced by '1'. The curve 6P is the sum of 3P and 4P and represents the dose distribution before correction of the proximity effect has been performed. The expanded resist pattern will be the pattern in the area where the dose quantity is equal to or exceeds the threshold value TL.

FIG. 45(C) shows a bit map of patterns 3A and 3B in closer proximity to each other than those in FIG. 45(A), for which proximity effect correction has been performed. The dose quantity on the semiconductor wafer corresponding to line D—D in FIG. 45(C) is as shown in FIG. 45(D). Curves 3Q to 6Q correspond to the curves 3P to 6P in FIG. 45(B) respectively, and the expanded resist pattern will be almost the same as that in the case shown in FIG. 45(A).

In the prior art, as with the patterns 3 and 3A, bit map data of a plurality of patterns with differing required quantities for proximity effect correction are prepared for each of the basic figures and are registered in a storage. For instance, no proximity effect correction will be made on the bit map when the lower order four bits of the pattern identification code are at 0 and the bit map will require different quantities of proximity effect correction with the lower order four bits corresponding to values in the range of 1 to 15.

Because of this, the bit map data of a number of basic figures must be registered in the library, making the registration processing and the specification of registered data complicated and reducing efficiency.

FIG. 46 shows the schematic structure of a system for charged particle beam exposure in the prior art. In order to illustrate the problems more clearly, the structure employs a stencil mask 30A instead of the BAA 30.

A charged particle beam irradiated from a charged particle gun 300 is focused and irradiated on a semiconductor wafer 10 at a selected block on the stencil mask 30A, with its lateral cross section shaped by the aperture pattern. With one shot of the charged particle beam, a minute pattern is exposed on a resist film on the semiconductor wafer 10.

In FIG. 46, AX indicates the optical axis, reference number 301 indicates a polygonal approximation of the locus of the charged particle beam and the reference number 301A shows the locus 301 enlarged in the direction running at a right angle to the optical axis AX to clearly illustrate the refraction of the charged particle beam imparted by electromagnetic lenses. ML1 to ML7 indicate electromagnetic lenses and reference numbers 302 and 18 indicate aperture stops. The electromagnetic lens ML5 causes a crossover in the charged particle beam at the aperture of the aperture stop 18. Electromagnetic lenses ML5 and ML6 are for demagnification projection and the electromagnetic lens ML7 is an objective lens. The aperture stop 18 restricts the angle of the charged particle beam at crossover and its aperture is circular. Reference numbers 20 and 22 indicate a main deflector and a sub deflector respectively for scanning the charged particle beam on the semiconductor wafer 10, and reference number 15 is a blanking deflector for blanking the charged particle beam at the aperture stop 18 during a period of time when exposure is not in progress. For the sake of simplification, the deflector for selecting a block on the stencil mask 30A, the deflector for returning the charged particle beam that has passed through a block onto the optical axis and the like, are omitted in FIG. 46.

The blocks of the stencil mask 30A are rectangular and in correspondence to this, the aperture of the aperture stop 302 is rectangular. The current density through a lateral cross section of the charged particle beam emitted from the charged particle gun 300, is distributed in an almost Gaussian distribution, as shown in FIG. 46, and with the hem of the Gaussian distribution cut by the aperture stop 302. The current density is made more constant compared to that before the cut.

However, since the even distribution of the current density is not sufficient when, for instance, the block for one shot is 5 μm×5 μm and the width of the pattern to be formed within the block is 0.1 μm on the semiconductor wafer 10, the error of the pattern width between the center and the peripheral portion of the block is approximately 0.03 μm, which limits how minute the pattern can be. In order to reduce this error, if the length of the aperture of the aperture stop 302 and the length of one side of the block on the stencil mask 30A are set at, for instance, 1/1.4, the number of shots will be approximately doubled, greatly reducing the throughput of exposure. Moreover, since the energy intercepted at the aperture stop 302 increases, the temperature of the aperture stop 302 goes up and a portion of it evaporates, reducing its service life. These problems also arise when a rectangular mask or a BAA is used instead of a stencil mask.

SUMMARY OF THE INVENTION

Accordingly, a first object of the present invention is to provide a method of and a system for exposing a pattern on an object by a charged particle beam using a blanking aperture array that can change the resist pattern in the connecting area gently.

The second object of the present invention is to provide a system for exposing a pattern on an object by a charged particle beam, with a strong structure in which the blanking aperture array chip can be replaced easily.

The third object of the present invention is to provide a method of and a system for exposing a pattern on an object by a charged particle beam in which the throughput of exposure is improved.

The fourth object of the present invention is to provide a method of and a apparatus for pattern expansion for the charged particle beam exposure system, which makes it possible to expand figure data into bit map data efficiency.

According to the 1st aspect of the present invention, there is provided a method of exposing a pattern on an object by a charged particle beam, the method using: a blanking aperture array means having a plate such as a Si chip, aperture array on the plate and a pair of electrodes on the plate for each aperture, the blanking aperture array being positioned in a path of the charged particle beam; a charged particle beam radiating apparatus for making a multibeam by projecting said charged particle beam on to said blanking aperture array means; multibeam control means for providing a voltage between each of the pairs of electrodes based upon pattern bit map data in order to radiate or not the charged particle beam passed through the apertures on the object; and a deflector for deflecting said multibeam; wherein the method includes the steps of: forming a first band area by scanning the multibeam in a band direction with the deflector; forming a second band area by scanning the multibeam in the band direction with the deflector, making one end of the second band area overlap one end of the first band area, using same the pattern bit map data corresponding to both the one ends; modulating the pattern bit map data corresponding to the one end of the first band area by validating/invalidating individual bits of the pattern bit map data with first modulation data; and modulating the pattern bit map data corresponding to the one end of the second band area by validating/invalidating individual bits of the pattern bit map data with second modulation data; wherein the first modulation data and the second modulation data are approximately complementary at corresponding bits and the sum of values of bits, corresponding on a line running at a right angle to the band direction, of the first modulation data and the second modulation data increase or decrease along a direction corresponding to the band direction.

With the 1st aspect of the invention, in an exposure method using a blanking aperture array means, it is possible to change the resist pattern in the connecting area of adjacent areas gently so that shorting or disconnection is prevented.

In addition, since the ratio of the length of the modulated area to the length of the band area is relatively small, and the scanning speed for the unmodulated area within the band area and the scanning speed for the modulated area are approximately the same, a reduction in throughput of the exposure system is prevented.

Furthermore, since, the pattern bit map data must merely be modulated in the modulated area, the processing of the connecting area is easy.

In the 1st mode of the 1st aspect of the present invention, the pattern bit map data has a plurality of sets for a pattern in order to make the number of times the charged particle beam is radiated at approximately the same spot on the object variable; and the first modulation data and the second modulation data are provided for each set of the plurality of sets of the bit map data.

With the 1st mode, the pattern in the connecting area can be made to change even more gently, which is desirable from the point of view of preventing shorting and disconnection.

In the 2nd mode of the 1st aspect of the present invention, the first modulation data and the second modulation data are obtained by reading out the same data alternately, in reverse direction.

With the 2nd mode, since the first modulation data and the second modulated data are obtained using the same data, the structure is simplified.

In the 3rd mode of the 1st aspect of the present invention, the first modulation data and the second modulation data are obtained by reading out the same data alternately, in reverse direction.

With the 3rd mode, since the length of the band area is equal to the range of deflection of the electromagnetic deflector, at 2 mm, for instance, which is relatively long, the ratio of the length of the modulated area relative to the length of the band area is further reduced, further preventing reduction of throughput of the exposure system.

According to the 2nd aspect of the present invention, there is provided a system for exposing a pattern on an object by a charged particle beam, including: a blanking aperture array means having a plate, aperture array on the plate and a pair of electrodes on the plate for each aperture, the blanking aperture array being positioned in a path of the charged particle beam; a charged particle beam radiating apparatus for making a multibeam by projecting said charged particle beam on to said blanking aperture array means; a deflector for deflecting said multibeam; deflecting control means for providing a drive signal to the deflector to form a first band area by scanning the multibeam in a band direction with the deflector, to form a second band area by scanning the multibeam in the band direction with the deflector, and to make one end of the second band area overlap one end of the first band area; bit map data outputting means for outputting the bit map data, the bit map data outputting means outputting same the pattern bit map data corresponding to both the one ends; modulating means for modulating the pattern bit map data corresponding to the one end of the first band area by validating/invalidating individual bits of the pattern bit map data with first modulation data and for modulating the pattern bit map data corresponding to the one end of the second band area by validating/invalidating individual bits of the pattern bit map data with second modulation data, the first modulation data and the second modulation data being approximately complementary at corresponding bits, the sum of values of bits, corresponding on a line running at a right angle to the band direction, of the first modulation data and the second modulation data increasing or decreasing along a direction corresponding to the band direction; and multibeam control means for providing a voltage between each of the pairs of electrodes based upon pattern bit map data modulated by the modulating means partially.

According to the 3rd aspect of the present invention, there is provided a system for exposing a pattern on an object by a charged particle beam, including: a blanking aperture array means having a chip, aperture array on the chip, a pair of electrodes on the chip for each aperture, and a lead pattern extending from the electrodes to a peripheral area of a surface on the chip, the blanking aperture array being positioned in a path of the charged particle beam; a charged particle beam radiating apparatus for making a multibeam by projecting the charged particle beam on to the blanking aperture array means; an aperture plate positioned at a downstream side of the blanking aperture array means, the aperture plate having an aperture for allowing an on-beam not deflected by the pair of electrodes pass through and having a plate for blocking an off-beam deflected by the pair of electrodes, each of the on-beam and off-beam being a part of the multibeam; and multibeam control means for making the on-beam and off-beam by providing a voltage to the pair of electrodes in correspondence to pattern bit map data; the system further including: a holder for holding the blanking aperture array means, the holder having a surface around the aperture array, a first terminal array being formed on the surface, the first terminal array being connected via a wiring pattern to the lead pattern of the blanking aperture array means; a wiring board positioned in such a manner that a surface of the wiring board faces to the first terminal array, the wiring board having a second terminal array formed on the surface corresponding to the first terminal array, having an opening being formed in a center of the wiring board corresponding to the aperture array and having a wiring pattern formed extending from the second terminal array toward an outside, the wiring pattern providing a voltage from outside of a lens barrel to the electrodes of the blanking aperture array means; a supporter for fixing the wiring board to a lens barrel, outer end of the wiring board being out of the lens barrel; and a Z stage for holding the holder and for moving the holder along to an optical axis to connect the first terminal array to the second terminal array, wherein a front end of either the first terminal array or the second terminal array is thinner than a bottom surface thereof and the blanking aperture array means, the holder, the Z stage, an inner portion of the wiring board and the aperture plate are provided inside the lens barrel, inside of which is a vacuum during use.

With the 3rd aspect of the invention, since, by making the holder that holds the blanking aperture array means press on the wiring board by operating the Z stage, a first terminal array formed on the holder is placed in ohmic contact in correspondence to a second terminal array on the wiring board fixed to the lens barrel via the supporter, the structure is strong. In addition, there is an advantage in that replacement of the blanking aperture array means is facilitated, since it has only to be removed from the holder after releasing the pressing by operating the Z stage.

In the 1st mode of the 3rd aspect of the present invention, the lens barrel includes an upstream side portion and a downstream side portion; and wherein the supporter includes: a first member adhered to a upstream side surface of the wiring board, outer end portion of the first member being jointed to the upstream side portion of the lens barrel; a second member adhered to a downstream side surface of the wiring board, an outer end portion of the second member being jointed to the downstream side portion of the lens barrel; a first sealing member for sealing between the first member and the wiring board; and a second sealing member for sealing between the second member and the wiring board.

With the 1st mode, the length of the wiring between the electrodes on the blanking aperture array means and the outside of the lens barrel can be made smaller than the radius of the lens barrel, reducing the wiring capacitance. This makes it possible to provide a voltage with a higher frequency to the electrodes on the blanking aperture array means, achieving an improvement in the throughput of expose. There is another advantage in that it is possible to mount the driver, which is connected to the wiring pattern on the wiring board, outside the lens barrel and within the radius of the lens barrel.

In the 2nd mode of the 3rd aspect of the present invention, the system includes: a terminating resistor provided at the wiring board, the terminating resistor being connected to the wiring pattern of the wiring board; a coaxial cable connected to an outer end portion of the wiring pattern, the coaxial cable being out of the lens barrel; and a cooling device for cooling the wiring board.

With the 2nd mode, since the terminating resistor is connected to the wiring board and the coaxial cable is connected to the wiring pattern of the wiring board, it is possible to mount a driver for driving the electrodes on the blanking aperture array means at a position remote from the blanking aperture array means, to facilitate maintenance of the driver. In addition, since impedance matching is achieved nearly up to the blanking electrodes on the blanking aperture array means, a voltage with a higher frequency can be applied to the electrodes on the blanking aperture array means, achieving a further improvement in throughput of exposure.

In the 3rd mode of the 3rd aspect of the present invention, the system includes: a connector mounted at outer end of the wiring board to connect the wiring pattern with the coaxial cables.

With the 3rd mode, connection and maintenance of the coaxial cable are facilitated.

In the 4th mode of the 3rd aspect of the present invention, the system includes: a driver provided at the wiring board in an area communicating with an outside portion of the lens barrel, an output of the driver being connected to the wiring pattern of the wiring board; and a cooling device for cooling the driver.

With the 4th mode, since the heat generated by the driver is reduced more drastically than the heat generated by the terminating resistor, fluctuation of heat generation decreases and fluctuation of the beam radiation point on the object due to thermal expansion and contraction is reduced.

In the 5th mode of the 3rd aspect of the present invention, the system further includes: a heater for heating the wiring board corresponding to a supplied electric power to the wiring pattern; and a heater control device for supplying electric power to the heater corresponding to number σ of the on-beams in order to reduce temperature fluctuations of the wiring board.

With the 5th mode, since fluctuation of the total of the heat generated by the terminating resistor or the driver and the heat generated by the heater is reduced, fluctuation of the beam radiation point on the object due to thermal expansion and contraction is reduced.

In the 6th mode of the 3rd aspect of the present invention, the electric power is $(a\sigma+b)$, where a and b are variable constants.

With the 6th mode, since primary correction is performed to make the total of the heat described above even more constant, fluctuation of the beam radiation point on the object due to thermal expansion and contraction is reduced even further.

In the 7th mode of the 3rd aspect of the present invention, the system includes: a blanking deflector, provided between the blanking aperture array means and the aperture plate, for deflecting all of the multibeam in order to block the multibeam by the aperture plate during standby, wherein the multibeam control device provides a deflecting voltage simultaneously to approximately half of all the pairs of the electrodes of the blanking aperture array means during the standby.

With the 7th mode, since the heat generated by the terminating resistor or the driver in the standby state is approximately half the maximum value, the range of maximum fluctuation of heat generation is approximately halved compared to a case in which the heat generated during stand by is 0 and, as a result, fluctuation of the beam radiation point on the object due to thermal expansion and contraction is reduced even further.

In the 8th mode of the 3rd aspect of the present invention, during the standby, the multibeam control device provides a deflecting voltage alternately to a first group of approximately half of all the pairs of electrodes of the blanking aperture array means and a second group of the rest the pairs of electrodes of the blanking aperture array means.

With the 8th mode, since the thermal distribution on the wiring board is more constant, fluctuation of the beam radiation point on the object due to thermal expansion and contaction is reduced even further.

According to the 4th aspect of the present invention, there is provided a method of exposing a pattern on an object using a system that includes: a blanking aperture array means having a chip, aperture array on the chip, a pair of electrodes on the chip for each aperture, and a lead pattern extending from the electrodes to a peripheral area of a surface on the chip, the blanking aperture array being positioned in a path of the charged particle beam; a charged particle beam radiating apparatus for making a multibeam by projecting the charged particle beam on to the blanking aperture array means; an aperture plate positioned at a downstream side of the blanking aperture array means, the aperture plate having an aperture for a lowing an on-beam not deflected by the pair of electrodes pass through and having a plate for blocking an off-beam deflected by the pair of electrodes, each of the on-beam and off-beam being a part of the multibeam; multibeam control means for making the on-beam and off-beam by providing a voltage to the pair of electrodes in correspondence to pattern bit map data; a holder for holding the blanking aperture array means, the holder having a surface around the aperture array, a first terminal array being formed on the surface, the first terminal array being connected via a wiring pattern to the lead pattern of the blanking aperture array means; a wiring board positioned in such a manner that a surface of the wiring board faces to the first terminal array, the wiring board having a second terminal array formed on the surface corresponding to the first terminal array, having an opening being formed in a center of the wiring board corresponding to the aperture array and having a wiring pattern formed extending from the second terminal array toward an outside, the wiring pattern being for providing a voltage from outside of a lens barrel to the electrodes of the blanking aperture array means; a supporter for fixing the wiring board to a lens barrel, outer end of the wiring board being out of the lens barrel; a Z stage for holding the holder and for moving the holder along to an optical axis to connect the first terminal array to the second terminal array; a driver provided at the wiring board in an area communicating with outside of the lens barrel, an output of the driver being connected to the wiring pattern of the wiring board; a heater for heating the wiring board; and a cooling device for cooling the driver; the method includes the step of: supplying electric power to the heater corresponding to number σ of the on-beams in order to reduce temperature fluctuations of the wiring board.

In the 1st mode of the 4th aspect of the present invention, the electric power is (aσ+b), where a and b are variable constants, the method includes the steps of: changing the number of the on-beams prior to actual exposure; and determining the constants a and b in such a manner that fluctuation of a beam position on the object becomes smaller under the changing.

With the 1st mode, since the response speed in temperature detection is low due to the heat capacity of the temperature detector itself, by determining the constants a and b, as in the ninth mode, fluctuation of the beam radiation point on the object is reduced even further, compared to a case in which the constants a and b are determined so as to ensure that the detected temperature is constant.

In the 2nd mode of the 4th aspect of the present invention, the system includes a blanking deflector, provided between the blanking aperture array means and the aperture plate, for deflecting all of the multibeam in order to block the multibeam by the aperture plate during standby, the method includes the step of: providing a deflecting voltage simultaneously to approximately half of all the pairs of the electrodes of the blanking aperture array means during the standby.

In the 3rd mode of the 4th aspect of the present invention, the system includes a blanking deflector, provided between the blanking aperture array means and the aperture plate, for deflecting all of the multibeam in order to block the multibeam by the aperture plate during standby, the method including the steps of: during the standby, providing a deflecting voltage alternately to a first group of approximately half of all the pairs of electrodes of the blanking aperture array means and a second group of the rest the pairs of electrodes of the blanking aperture array means.

According to the 5th aspect of the present invention, there is provided a method of expanding a figure data corresponding to an exposure pattern into a bit map data, including the steps of: registering a bit map data of a first figure in a storage in advance; setting a value for A0, RA; (1) addressing the storage with read address A to read out a portion of the bit map data of the first figure, where A=A0+⌊RA·i⌋, A0, i being an integer and ⌊ ⌋ being an operator for rounding a value within to an integer; (2) incrementing or decrementing i one by one; and repeating a loop of steps (1) and (2) in order to generate a bit map data of a second figure by multiplying the first figure by approximately 1/RA in a data read-out direction Y.

With the 5th aspect of the invention, since the bit map data is read out from the storage, the figure data can be expanded (converted) into a bit map data at high speed. Since, various bit map data of the second figures are obtained by using one bit map data of the first figure registered in the storage, the number of the first figures to be registered in the storage is reduced, facilitating addressing of the registered bit map data and improving the efficiency with which a figure data is expanded into a bit map data.

In the 1st mode of the 5th aspect of the present invention, the method includes the step of: (3) masking one word of the data read out from the address A; the step (3) is in the loop and after the step (1) in order to get a bit map data of a third figure.

With the 1st mode, since more various bit map data of the third figures than that of the second figures are obtained by using the bit map data of the first figure registered in the storage, the number of the first figures to be registered in the storage is reduced, facilitating addressing of the registered bit map data and improving the efficiency with which a figure data is expanded into a bit map data In the 2nd mode of the 5th aspect of the present invention, the method includes the steps of: (4) loading one word of the bit map data of the second or third figure to a shift register;

and (5) shifting the shift register by S bit(s), where S=S0+ [RS·i] and S0 is an integer; steps (4) and (5) are in the loop and after step (1) in order to get a bit map data of a fourth figure from the shift register by transforming the second or third figure in a direction X perpendicular to the direction Y.

With the 2nd mode, since more of the various bit map data of the fourth figures are obtained than of the third figures using the bit map data of the first figure registered in the storage, the number of the first figures to be registered in the storage is reduced, facilitating addressing of the registered bit map data and improving the efficiency with which a figure data is expanded into a bit map data In the 3rd mode of the 5th aspect of the present invention, the first figure is a right triangle having sides of the directions X and Y.

With the 3rd mode, since the bit map data of a triangle of any given size and shape can be obtained by using the bit map data of one right triangle registered in the storage, a figure data can be expanded into a bit map data efficiently.

In the 4th mode of the 5th aspect of the present invention, at step (1), the portion of the bit map data read out from the storage is a trapezoid in order to make the fourth figure a desired trapezoid.

With the 4th mode, since the bit map data of a trapezoid of any given size and shape can be obtained by using the bit map data of a right triangle registered in the storage, a figure data can be expanded into a bit map data efficiently.

In the 5th mode of the 5th aspect of the present invention, at the step (1), the portion of the bit map data read our from the storage is one line in order to make the fourth figure a parallelogram.

With the 5th mode, since the bit map data of a parallelogram of any given size and shape can be obtained by using the bit map data of a right triangle registered in the storage, a figure data can be expanded into a bit map data efficiently.

In the 6th mode of the 5th aspect of the present invention, the method includes the steps of: (6) addressing a canvas memory with a read address AC=YS+i; (7) performing a logic operation between one word of the bit map data of the fourth figure and one word read out from the canvas memory; and (8) writing a result of the logic operation to the address AC of the canvas memory; steps (6) to (8) are in the loop and after step (5) in order to make a block of a exposure bit map data in the canvas memory.

In the 7th mode of the 5th aspect of the present invention, the fourth figure is expressed by a record essentially having items of IDC, OPC, XS, the YS, COI, the RA and the RS, where IDC is a ID code of the first figure; OPC is a operation code of the logic operation; XS is a bit position, in the X direction, of an origin of the fourth figure the canvas memory; and COI is a cut out information of the portion from the first figure.

In the 8th mode of the 5th aspect of the present invention, the fourth figure is expressed by a combination of a first record and second record; the first record essentially having items of IDC, OPC, XS, the YS and COI; where IDC is a ID code of the first figure; OPC is a operation code of the logic operation; XS is a bit position, in the direction X, of an origin of the fourth figure in the canvas memory; COI is a cut out information of the portion from the first figure; and the second record essentially have items of the RA and the RS, the second record is usable in common with plural the first records until renewal.

Since, generally, the number of times RA and RS are used is low and the same value is used many times continuously,
with the 8th mode, the entire number of the records can be reduced. Furthermore, since most of the figures are expressed in the same format of the simple first record, data amount becomes smaller and data processing speed becomes higher.

In the 9th mode of the 5th aspect of the present invention, the item COI have sub-items W and H, where W is a width of the fourth figure in the direction X and relates to the masking; and H is a width of the fourth figure in the direction Y and equal to a repeat number of the loop.

According to the 6th aspect of the present invention, there is provided an apparatus for expanding figure data corresponding to an exposure pattern into a bit map data, including: a storage, a bit map data of a first figure being registered in the storage in advance; addressing means for a dressing the storage with read address A to read out a portion of the bit map data of the first figure as a bit map data of a second figure got by multiplying the first figure by approximately 1/RA in a data read-out direction Y, where A=A0+[RA·i], A0 and i being integers and [ ] being an operator for rounding a value within to an integer; masking means for masking one word of the data read out from the address A with mask bit pattern in order to get a bit map data of a third figure; a shift register, one word of the bit map data of the second or third figure being load to the shift register; shift count means for making the shift register shift by S bit(s), where S=S0+ [RS·i] and XS being an integer in order to get from the shift register a bit map data of a fourth figure by transforming the second or third figure in a direction X perpendicular to the direction Y; a canvas memory for making a block of a exposure bit map data; pattern writing means for addressing the canvas memory with a read address AC=YS+i, for performing a logic operation between one word of the bit map data of the fourth figure and one word read out from the canvas memory, and for writing a result of the logic operation to the address AC of the canvas memory; and control means for incrementing or decrementing the i one by one, or providing the A0 and RA to the addressing means, for providing the mask bit pattern to the masking means, for providing the S0 and RS to the shift count means and for providing the YS to the pattern writing means.

In the 10th mode of the 5th aspect of the present invention, the bit map data of the first figure is a bit map data or proximity effect correction; and the logic operation is for the proximity effect correction.

With the 10th mode of the 5th aspect, since the proximity effect correction can be made in a same way as the bit map expansion of normal figure data, the data processing becomes simple. Since various patterns are corrected by using one bit map data registered in the storage, the number of the first figures to be registered in the storage is reduced, facilitating addressing of the registered bit map data or proximity effect correction and improving the efficiency of the proximity effect correction.

In the 11th mode of the 5th aspect of the present invention, the bit map data of the first figure is a bit map data or proximity effect correction; wherein the logic operation is for the proximity effect correction; and wherein the cut out information is determined corresponding to a size of an object pattern to be corrected and a degree of proximity effect of the object pattern.

With the same reason as above described, data amount becomes smaller and data processing speed becomes higher.

According to the 6th aspect of the present invention, there is provided a method of expanding a figure data corresponding to an exposure pattern into a bit map data, including the steps of: registering a bit map data for a proximity effect correction in a storage in advance; extracting a portion of the bit map data in the storage corresponding to a size of an object pattern to be corrected and a degree of proximity effect of the object pattern; and performing a logic operation between a bit map data of the object pattern and the portion extracted.

In the 1st mode of the 6th aspect of the present invention, the logic operation is essentially (bit A) AND ≠(bit B), where bit A is of the object pattern; bit B is of the portion extracted; and ≠ is a NOT operation.

With the 1st mode, since the portion of bit map data for proximity effect correction between object patterns to be correct is invalid automatically, the correction is facilitated and data processing speed becomes higher.

According to the 8th aspect of the present invention, there is provided a method of exposing a pattern on an object using a system, the system including: a charged particle gun for emitting the charged particle beam; a first aperture stop having a first aperture for allowing a portion of the charged particle beam to pass through; a mask having an aperture for shaping a cross section of the charged particle beam having passed through the first aperture; a second aperture stop having a second aperture for allowing a portion of the charged particle beam having passed through the aperture to pass through; an electron lens system for making the charged particle beam cross over at the position of the second aperture, and for getting demagnificated projection of a shaped charged particle beam on the object; a first electrostatic deflector, positioned between the charged particle gun and the mask, for deflecting the charged particle beam; and a second electrostatic deflector, positioned between the first electrostatic deflector and the mask, for deflecting the charged particle beam; the method including the step of: scanning the charged particle beam on the mask, in order to make a time averaged current density of the charged particle beam within an area where the charged particle beam is to be radiated on the mask approximately constant, by providing a first voltage to the first electrostatic deflector and by providing a second voltage to the second electrostatic deflector in order to ensure that the charged particle beam passes through the second aperture, the second voltage being in proportion to the first voltage.

With the 8th aspect according to the present invention, since, without reducing the size of the area on the mask to be irradiated with the charged particle beam, the time averaged current density distribution of the charged particle beam on that area can be made more constant, an advantage is achieved in that more minute patterns can be drawn without reducing the throughput of exposure. In addition, another advantage is achieved, in that the throughput of exposure is improved by increasing the size of the area.

In the 1st mode of the 8th aspect of the present invention, the system for charged particle beam exposure includes a third electrostatic deflector, positioned between the charged particle gun and the second aperture stop, for deflecting the charged particle beam; the method including the steps of: providing a third voltage to the third electrostatic deflector in order to correct positional misalignment of the charged particle beam at the second aperture, the third voltage being in proportion to the first voltage.

With the 1st mode, since the voltage to be provided to the third electrostatic deflector is made sufficiently smaller than the voltage to be provided to the first electrostatic deflector, the deviation correction accuracy at the second aperture is improved.

In the 2nd mode of the 8th aspect of the present invention, the mask is a stencil mask having blocks of aperture patterns, wherein the scanning is performed approximately an integer number of times on the blocks during one shot.

In the 3rd mode of the 8th aspect of the present invention, the mask is a blanking aperture array mask having an aperture array and having a pair of blanking electrodes formed for each aperture of the aperture array, wherein the scanning is performed approximately an integer number of times on the blanking aperture array mask during one cycle of a voltage pattern to be provided to all of the pairs of blanking electrodes.

In the 4th mode of the 8th aspect of the present invention, the first electrostatic deflector is provided via a first amplifier, the method includes the steps of, before exposure: irradiating the charged particle beam having passed through the second aperture on an object having a pattern on a substrate, a secondary electron emission rate of the pattern being higher than that of the substrate, and making the charged particle beam swing to cross the pattern; measuring a quantity S of the secondary electrons from the object during a swing of the charged particle beam; and adjusting a gain of the first amplifier so that an amplitude of oscillation contained in S or a differential for S is minimized.

With the 4th mode, optimization of the process of making the time averaged current density distribution on that area constant can be achieved with ease.

In the 5th mode of the 8th aspect of the present invention, the third electrostatic deflector is provided via a second amplifier, the method includes the steps of, before exposure: adjusting a gain of the second amplifier so that an electric current of the charged particle beam having passed through the second aperture is maximized.

With the 5th mode, optimization of deviation correction at the second aperture is facilitated.

According to the 9th aspect of the present invention, there is provided a system for exposing a pattern on an object using a system, including a charged particle gun for emitting the charged particle beam; a first aperture stop having a first aperture for allowing a portion of the charged particle beam to pass through; a mask having an aperture for shaping a cross section of the charged particle beam having passed through the first aperture; a second aperture stop having a second aperture for allowing a portion of the charged particle beam having passed through the aperture to pass through; and an electron lens system for making the charged particle beam cross over at the position of the second aperture, and for getting demagnificated projection of a shaped charged particle beam on the object; the system further includes a first electrostatic deflector, positioned between the charged particle gun and the mask, for deflecting the charged particle beam; and a second electrostatic deflector, positioned between the first electrostatic deflector and the mask, for deflecting the charged particle beam; and deflecting control circuit for scanning the charged particle beam on the mask, in order to make a time averaged current density of the charged particle beam within an area where the charged particle beam is to be radiated on the mask approximately constant, by providing a first voltage to the first electrostatic deflector and by providing a second voltage to the second electrostatic deflector in order to ensure that the charged particle beam passes through the second aperture, the second voltage being in proportion to the first voltage.

In the 1st mode of the 9th aspect of the present invention, the system includes a third electrostatic deflector, positioned between the charged particle gun and the second aperture stop, for deflecting the charged particle beam; wherein the deflecting control circuit provides a third voltage to the third electrostatic deflector in order to correct positional misalignment of the charged particle beam at the second aperture, the third voltage being in proportion to the first voltage.

In the 2nd mode of the 9th aspect of the present invention, the first, second and third electrostatic deflectors are positioned at first aperture stop side, wherein the third electrostatic deflector is positioned between the first electrostatic deflector and the second electrostatic deflector, and the deflecting control circuit includes a circuit for generating a periodic signal; a first amplifier for amplifying the periodic signal to provide the first and second voltages to the first and second electrostatic deflectors respectively in such a way that the first and second voltages become reverse phase to each other; and a second amplifier for amplifying the periodic signal to provide the third voltages to the third electrostatic deflector.

With the 2nd mode, since the first electrostatic deflector is positioned near the first aperture stop, deflection efficiency on the mask relative to the deflecting voltage is large, and the voltage to be provided to the first electrostatic deflector can be reduced, enabling faster scanning of the charged particle beam on the mask. Since the first to third electrostatic deflectors are provided near the first aperture stop and the third electrostatic deflector is positioned between the first electrostatic deflector and the second electrostatic deflector, the entire configuration of the first to third electrostatic deflectors can be made more compact. Furthermore, since the output from the first amplifier is commonly used by the first electrostatic deflector and the second electrostatic deflector, the structure is simplified and there is an added advantage in that adjustments of the difference in the characteristics between the amplifiers which would be required if one output from a single amplifier were not commonly used, are unnecessary.

BRIEF DESCRIPTION OF THE DRAWINGS

FIG. 30(A) shows another set of bit map data to be corrected, FIG. 30(B) shows the bit map data obtained by extracting a partial area of the bit map data shown in FIG. 29(A) and FIG. 30(C) shows the bit map data for which proximity effect correction has been performed using the AND of the bit map data in FIGS. 30(A) and 30(B);

FIG. 43(A1) to 43(A3), 43(B1) to 43(B3) and 43(C1) to 43(C3) show prior art problems and effect of the exposure method illustrated in FIG. 42(B);

FIGS. 44 (A) to 44(F) illustrate the problems in the prior art;

DESCRIPTION OF THE PREFERRED EMBODIMENTS

1. First Embodiment

Figure 1:
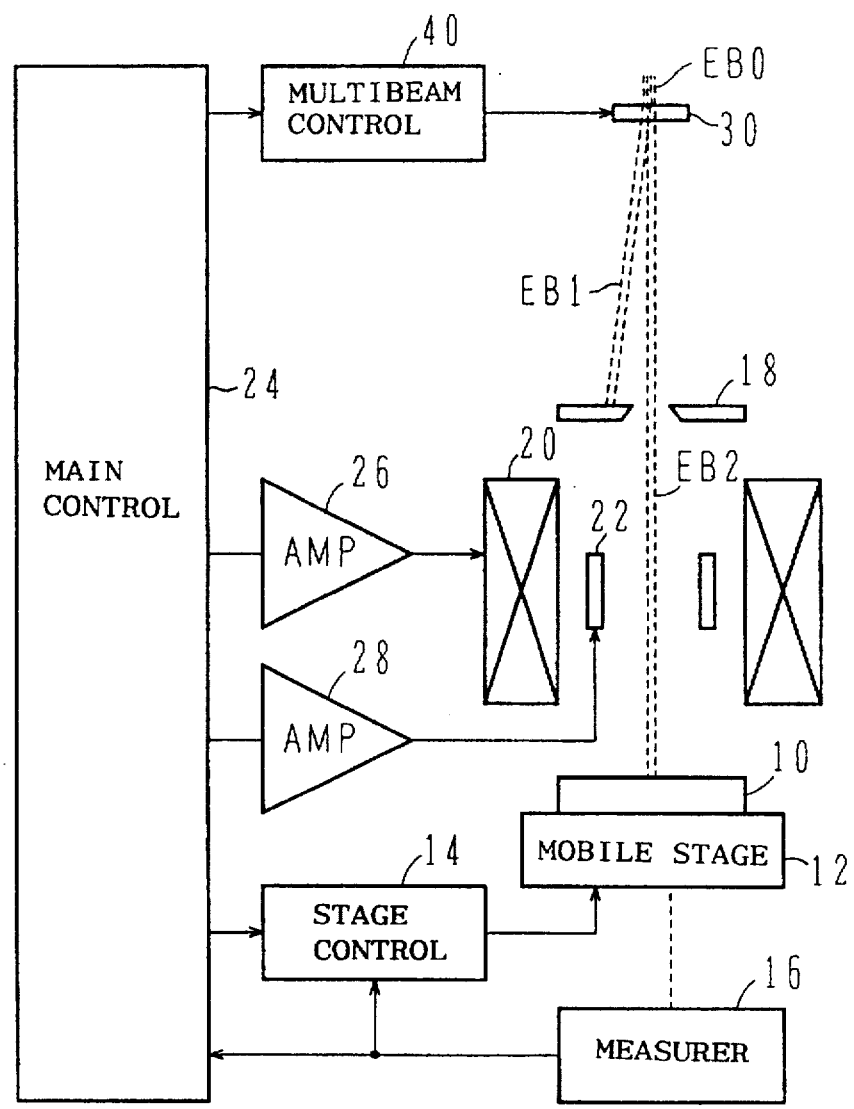
FIG. 1 is a block diagram of parts of a charged particle beam exposure system in the first embodiment according to the present invention.

FIG. 1 shows main parts of a charged particle beam exposure system in the first embodiment.

A semiconductor wafer 10, which is the object of exposure, is mounted on a mobile stage 12. The movement of the mobile stage 12 is controlled by a stage control circuit 14 with the position of the mobile stage 12 being detected by a laser interferometric measuring machine 16 and fed back to the stage control circuit 14. The semiconductor wafer 10 is coated with a resist film and exposure is performed by radiating an electron beam EB2, which has passed through a round aperture formed in a plate 18, on to the wafer.

Scanning of the electron beam EB2 over the semiconductor wafer 10 is performed by an electromagnetic main deflector 20 and an electrostatic sub deflector 22 which are positioned above the mobile stage 12 as well as by the mobile stage 12 itself. The scanning ranges attainable by these systems at the required precision are in the order of, from largest to smallest: the mobile stage 12, the main deflector 20 and the sub deflector 22. The scanning speeds attainable from highest to lowest are in the reverse order, and by taking advantage of this characteristic, scanning as shown in FIG. 5 is performed.

Specifically, the electron beam EB2 is continuously deflected in the main scanning direction X by the main deflector 20 and while this is in progress, the mobile stage 12 is continuously moved in the sub scanning direction Y, which runs at a right angle to the main scanning direction X. In addition, the electron beam EB2 is continuously deflected by the sub deflector 22 in direction Y with the movement of the mobile stage 12 so that a band 102, which is the area over which main scanning of a simultaneous exposure area 101 is performed once lies in the direction X on the semiconductor wafer 10. The size of one band may be, for instance, 2 mm in length and 10 μm in width with the scanning time for one band, at 100 μs. In this case, the speed at which the mobile stage 12 moves in the direction Y is high, at 10 μm/100 μs=100 mm/s.

Figure 5:
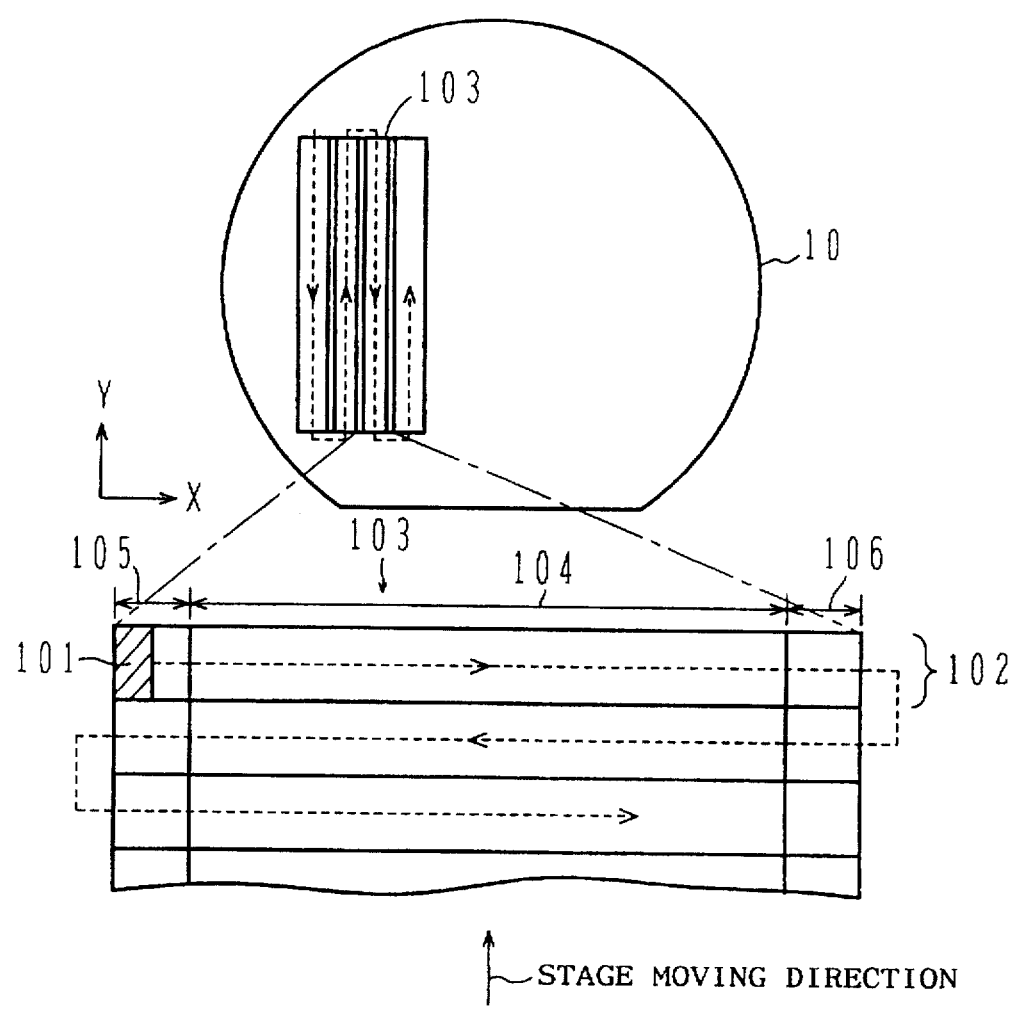
FIG. 5 illustrates a method of electron beam scanning.

The electron beam EB2 is scanned by the main deflector 20 and the sub deflector 22 along the dotted lines in the enlargement shown in the FIG. 5 on the outside of the semiconductor wafer 10 and, as indicated with the arrows on the dotted lines, the main scanning direction is reversed for each band. The mobile stage 12 is scanned along the dotted lines in the Y direction on the semiconductor wafer 10, and by scanning in this manner once, a frame 103 is formed. As indicated with the arrows on the dotted lines, the scanning direction of the mobile stage 12 is reversed for each frame. In the band 102 at the two ends of an umodulated area 104, modulated areas 105 and 106, whose lengths in the direction X are equal to each other are present and, ideally, the modulated areas 105 and 106 align perfectly with the modulated areas of their adjacent frames.

In FIG. 1, a main control circuit 24 provides a target position to the stage control circuit 14, provides a cyclical sawtooth wave signal to an amplifier circuit 26, receives the stage detection position from the laser interferometric measuring machine 16 and provides a signal that is in proportion to the sub deflection distance to an amplifier circuit 28. The drive signal, whose current and voltage have been amplified by the amplifier circuits 26 and 28 respectively, is then provided to the main deflector 20 and the sub deflector 22.

Figure 2:
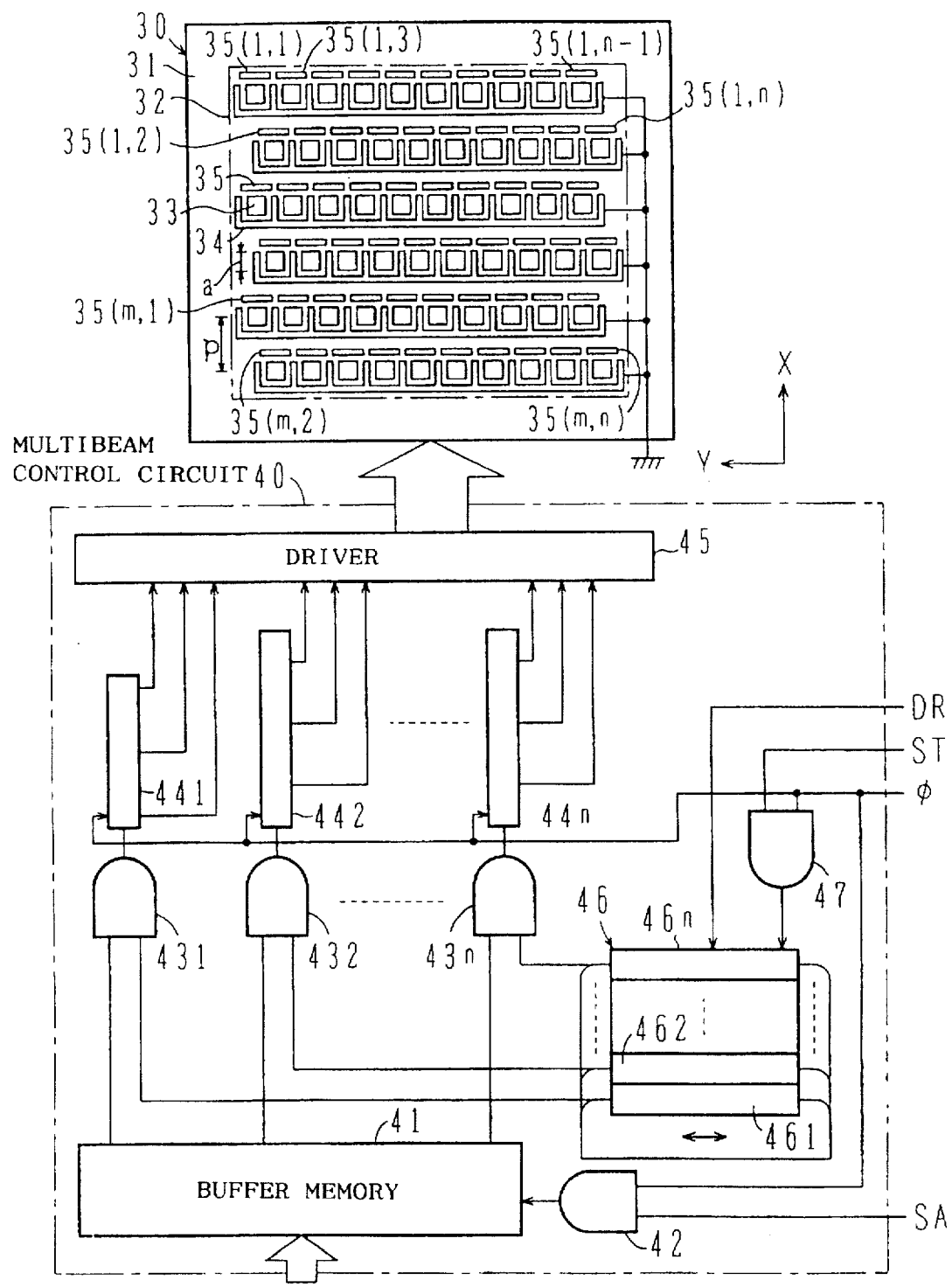
FIG. 2 shows structure of a blanking aperture array in FIG. 1 and its control circuit.
Figure 6A:
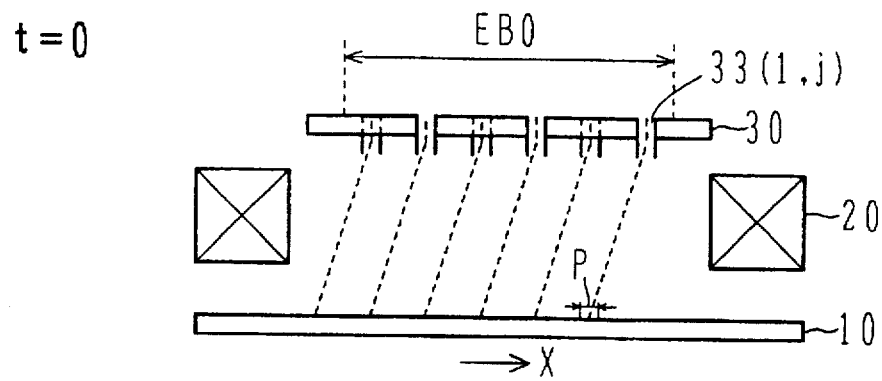
FIGS. 6(A) to 6(C) are schematic side views of election beam scanning process.
Figure 6B:
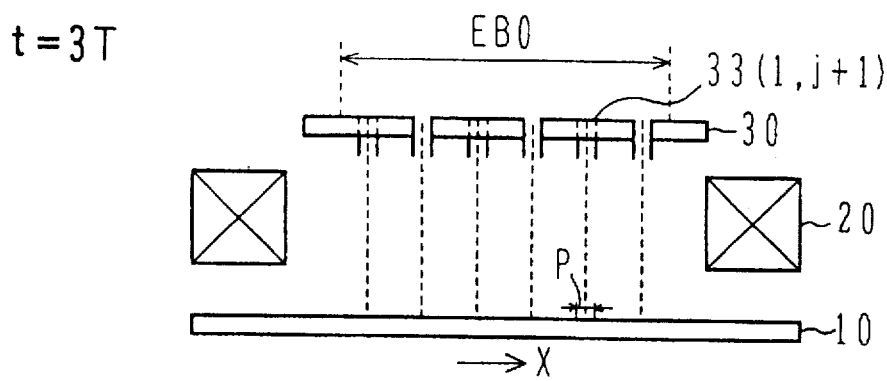
Figure 6C:
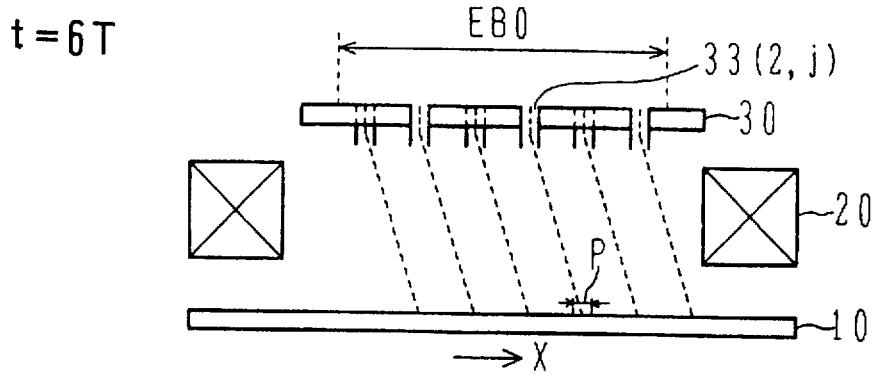

A blanking aperture array plate 30 is provided over the aperture plate 18. As shown in FIG. 2, in the blanking aperture array plate 30, a lattice of apertures 33 is formed inside an area 32 of a thin plate 31. For each aperture 33, a pair of electrodes, one a common electrode 34 and the other a blanking electrode 35, are formed on the plate 31 with the common electrode 34 connected to the ground line. FIG. 2 shows the lower surface of the blanking aperture array plate 30. As shown in FIG. 6, the common electrodes 34 and the blanking electrodes 35, project out downward from the edges of the apertures 33.

In FIG. 2, an electron beam EB0 is projected to the area 32 on the plate 31. An electron beam EB2 that has passed through an aperture 33 then passes through the aperture in the aperture plate 18, as shown in FIG. 1, so long as the potential of the blanking electrode 35 is set to 0V. However, if a non-zero potential Vs is applied to the blanking electrode 35, the electron beam is deflected and is blocked at the aperture plate 18. Consequently, by providing a 0/Vs potential to the blanking electrodes 35 in correspondence to the various bits 1/0 of the bit map data, a desired fine pattern can be exposed on the semiconductor wafer 10. For instance, each aperture 33 is a square with its sides at 25 µm. The area exposed on the semiconductor wafer 10 by this aperture 33 being an approximately square shape with sides at 0.08 µm via an electromagnetic lens, not shown in FIG. 1. The direction Y is referred to as the lengthwise direction of the rows of the apertures 33 and two rows of the apertures 33 are considered as one row. For the sake of simplification, FIG. 2 shows the apertures 33 in three rows over twenty columns, but in reality, the apertures 33 may be formed, for instance, in eight rows over 128 columns. When there are m rows over n columns of apertures 33, the aperture 33 and the blanking electrode 35 in the ith row at the jth column are indicated as the aperture 33(i,j) and the blanking electrode 35(i,j) respectively. The pitch p of the apertures 33 in the direction X must be, for instance, three times the length a of on side of the aperture 33, in order to secure enough area for the electrodes and wiring.

A multibeam control circuit 40 is provided with a buffer memory 41 in which bit map data of patterns provided form the main control circuit 24 shown in FIG. 1, are written. The buffer memory 41 is divided into, for instance, two areas so that while bit map data are written in one area through a direct memory access method, bit map data are read out from the other area and each time the read and write for one frame is completed, the read area and the write area are switched. The buffer memory 41 outputs the n-bit parallel data that corresponds to the 1st to nth column of the blanking electrodes 35, in synchronization with a clock provided from an AND gate 42.

Figure 4:
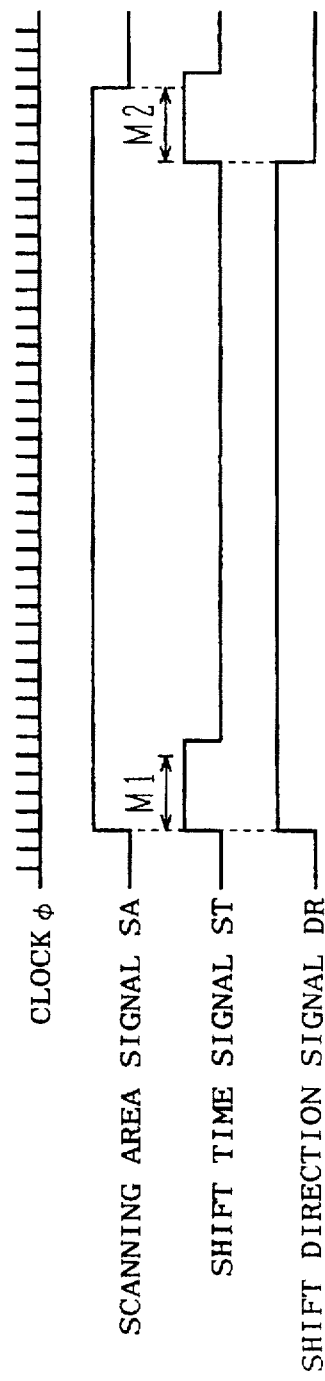
FIG. 4 is a waveform diagram of signals provided to the blanking aperture array control circuit shown in FIG. 2.

A clock $\phi$ and a scanning area signal SA, as shown in FIG. 4, are provided to the AND gate 42. The scanning area signal SA is set to '1' while the band 102 in FIG. 5 is being canned and it is set to '0' otherwise.

The n-bit outputs of the buffer memory 41 are each provided to one of the inputs of the AND gates 431 to 43n. The outputs from the AND gates 431 to 43n are provided to the data inputs of the least significant bits of the shift registers 441 to 44n respectively. The shift registers 441 to 44n are shifted by one bit toward the higher digit at each pulse of the clock $\phi$.

When j is an odd number, the shift register 44j has (2(p/a)(n−1)+1) bits, m bits of which is provided to the driver 45, to determine the potential at the blanking electrode 35(i, j), i=1 to m. To explain this in more detail, when the output of the (2(p/a)(i−1)+1)th bit of the shift register 44j is at '1,' the potential of the blanking electrode 35(i, j) is at 0V, and the electron beam which has passed through the aperture 33(i, j) is radiated on the semiconductor wafer 10, whereas when the output is at '0,' the potential is at Vs and the electron beam that has passed through the aperture 33(i, j) is blocked by the aperture plate 18 and is not, therefore, radiated on the semiconductor wafer 10. The least significant bit of the shift register 44j is assumed to be the first bit.

When j is an even number, the shift register 44j has (p/a)(2n−1)+1) bits, the m bits of which is provided to the driver 45, to determine the potential at the blanking electrode 35(i, j), i=1 to m. To explain this in more detail, when the output of the (p/a)(2i−1)+1)th bit of the shift register 44j is at '1,' the potential of the blanking electrode 35(i, j) is at 0V and the electron beam which has passed through the aperture 33(i, j) is radiated on the semiconductor wafer 10, whereas when the output is at '0,' the potential is at Vs and the electron beam that has passed through the aperture 33(i, j) is blocked by the aperture plate 18 and is not, therefore, radiated on the semiconductor wafer 10.

Figure 3:
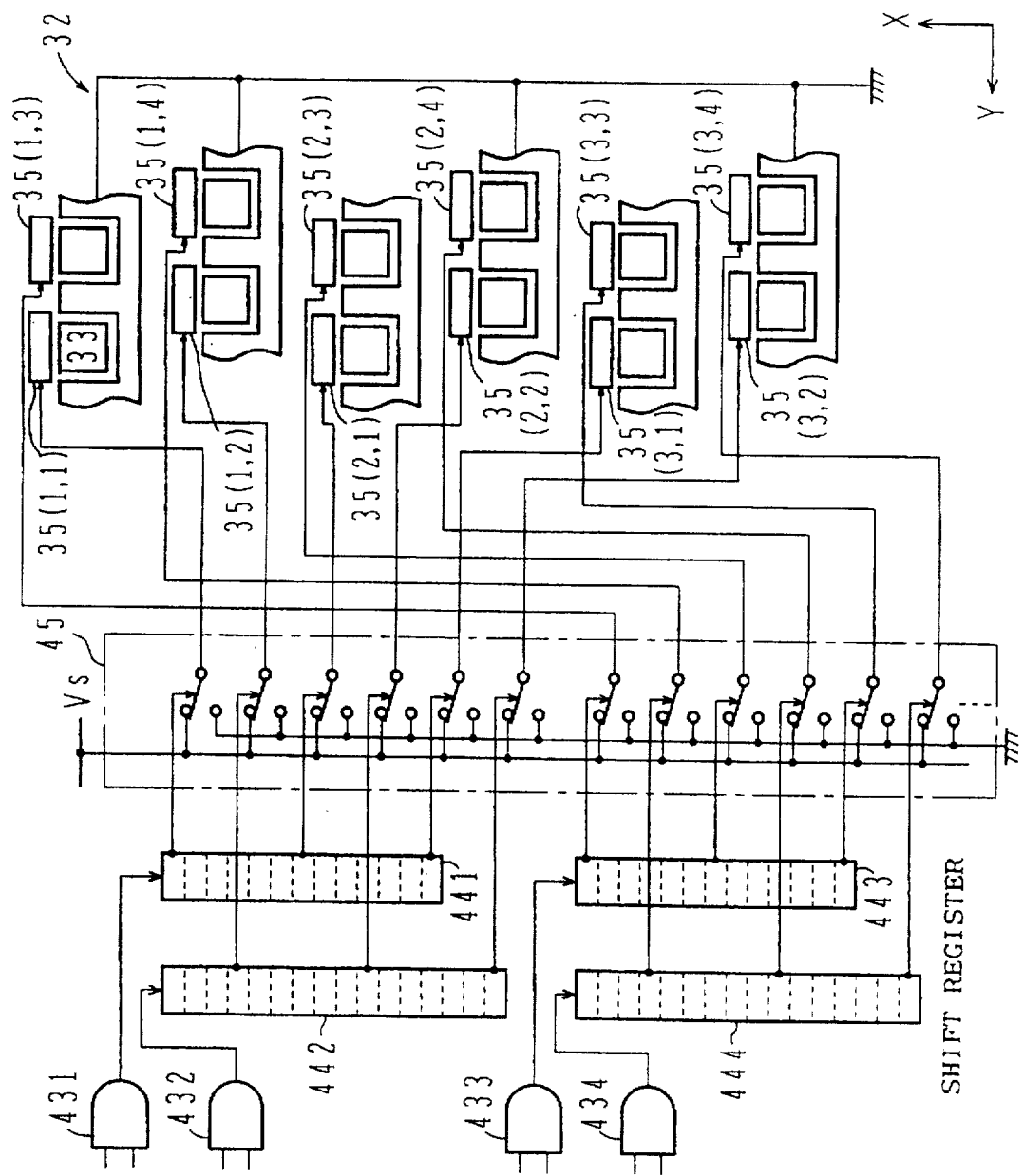
FIG. 3 shows details of part of the blanking aperture array control circuit shown in FIG. 2.

FIG. 3 shows part of the relationship described above when p/a=3 and n=3. The switch in the driver 45 is a static switch that is controlled by the output from the shift register.

FIG. 6 is a schematic illustration of the scanning of the electron beam in direction X. Although what is actually performed is demagnefication projection exposure, in order to simplify the explanation, in FIG. 6, the demagnefication projection ratio is at 1.

The scanning speed of the electron beam is adjusted at a constant level so that, when the cycle of the clock $\phi$ is T, supposing that the electron beam passes the aperture 33(1, j) at a time point t=0 irradiates a point P on the semiconductor wafer 10, the electron beams that pass through the aperture 33(2, j), the aperture 33(3, j), the aperture 33(m, j) at time points t=2(p/a)T, t=4(p/a)T, . . . . T=2(m−1) (p/a)T respectively, irradiate the same point P on the semiconductor wafer 10.

Thus, on the semiconductor wafer 10, the same spot is expose m times with the same data. In addition, the spaces between dots that are exposed at the time point t after the beam passes through the aperture 33(i, j), j=1, 3, 5, . . . . . n−1 are exposed at time point t+(p/a)T after the beam passes through the apertures 33(i, j), j=2, 4, 6, . . . . , n.

In FIG. 2, the other input in each of the AND gates 431 to 43n is provided with the bit output at one end of each of circulating shift registers 461 to 46n respectively, of circulating shift register group 46. The number of bits in each of the circulating shift registers 461 to 46n is equal to (the number of dots exposed in direction X in modulated area 105)+1. The circulating shift registers 461 to 46n are shifted by the clock from AND gate 47 and the direction of the shift is determined by a shift direction signal DR, shown in FIG. 4. The clock $\phi$ and a shift time signal ST, shown in FIG. 4, are provided to the AND gate 47. The shift time signal ST is at '1' from the start of scanning of the modulated area 105 or 106 shown in FIG. 5 until one cycle T of the clock $\phi$ has elapsed after the end of scanning of that. It is set at '0' otherwise. The shift direct on signal DR is obtained by providing the shift time signal ST to ½ frequency divider.

Figure 7A:
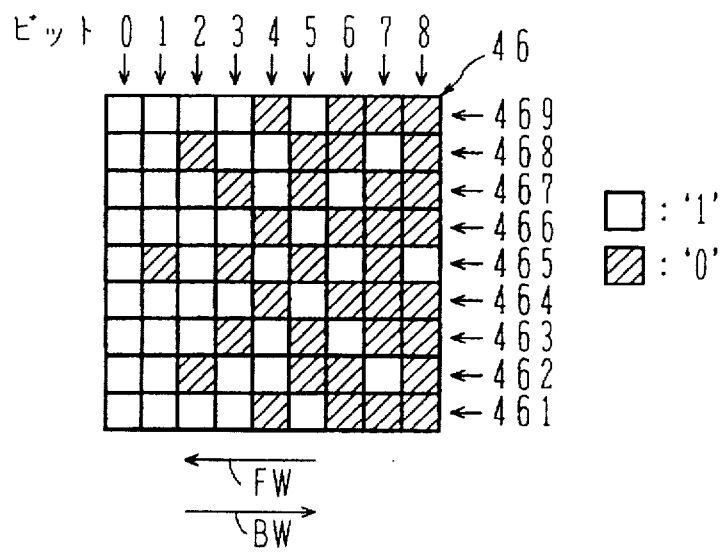
FIG. 7(A) shows an initial setting at shift register for modulation and FIG. 7(B) shows modulated data in a band.

FIG. 7(A) shows an example of modulated data that are initially set in the circulating shift registers 461 to 469, when there are 9 bits in each of the circulating shift registers 461 to 469 with n=9. A white square indicates a bit set at '1' and a shaded square indicates a bit set at '0'. In a state of initial setting:

(a) in regard to each of i=0 to 8, there are i numbers set at '1' for the ith bits of the circulating shift registers 461 to 469;

(b) in regard to each of i=1 to 4, the values of the ith bit and the (9-i)th bit are complementary.

Since the shift time signal ST is at '0' in the unmodulated area 104 in FIG. 5, the AND gate 47 is closed and, consequently, the circulating shift register group 46 is not shifted. Thus, all its outputs are at '1'. With this, the AND gates 431 to 43n are all opened and the output from the buffer memory 41 is not modulated.

The shift time signal ST is set to '1' and the shift direction signal DR is set to '0' at the left end of the modulated area 106 in FIG. 5, to open the AND gate 47 and shift the circulating shift register group 46 in the direction direction FW in synchronization with the clock o. This results in the output from the buffer memory 41 being modulated by the outputs from the circulating shift registers 461 to 46n. After the scanning area signal SA is set to '0' at the right end (the end of M2 in FIG. 4) of the modulated area 106 in FIG. 5, the circulating shift register group 46 is shifted one more time to set all the outputs from the circulating shift registers 461 to 46n to '1.' Only then is the shift time signal ST set to '0' and the shifting of the circulating shift register group 46 is stopped.

Reversing direction, the scanning area signal SA, the shift time signal ST and the shift direction signal DR are set at '1' at the scanning start point (beginning of M1 in FIG. 4) for the next band 102, to open the AND gate 47, and the circulating shift register group 46 is shifted in the direction FB, which is the reverse of the previous shift direction, in synchronization with the clock o, and with the output from the circulating shift registers 461 to 46n, the output from the buffer memory 41 is modulated. After the circulating shift register group 46 is shifted one more time by the clock, which immediately follows the left end of the modulated area 106, to set all the outputs from the circulating shift registers 461 to 46n to '1,' the shift time signal ST is set to '0,' the shifting of the circulating shift register group 46 is stopped and the unmodulated area 104 is scanned.

The scanning of the modulated area 105 is performed in the same manner as that for the modulated area 106.

Figure 7B:
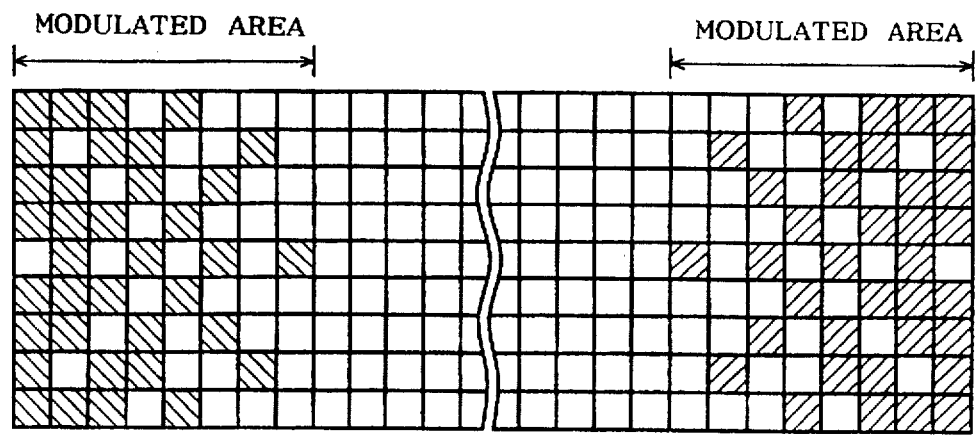

Thus, the modulated data that corresponds to one band and are output from the circulating shift register group 46, are as shown in FIG. 7(B).

Figure 8A:
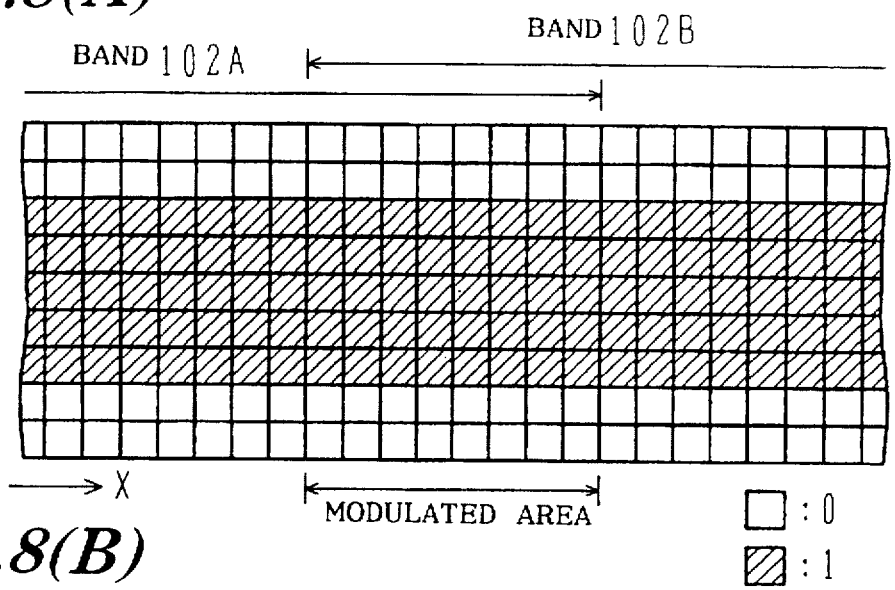
FIGS. 8(A) to 8(C) illustrate bit map data modulation of patterns.
Figure 8B:
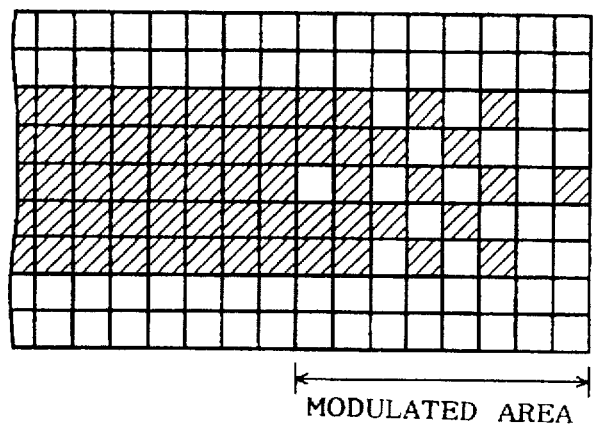
Figure 8C:
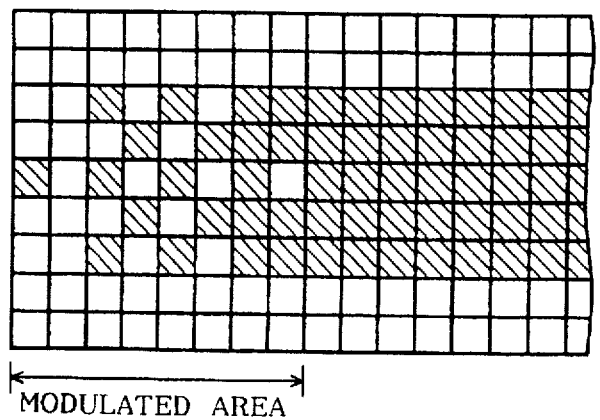

FIG. 8(A) shows the bit map data when the wiring pattern indicated with diagonal lines extends over the band 102A and into the band 102B which is adjacent to the band 102A in the lengthwise direction. A white square indicates a bit set at '0' and a shaded square indicates a bit set at '1.' Modulated data at the right end of the band 102A and at the left end of the band 102B in this case, are as shown in FIGS. 8(B) and 8(C) respectively.

In an ideal situation, in which there is no misalignment in the connecting area between the band 102A and the band 102B, the modulated area on the right hand side of the band 102A and the modulated area on the left hand side of the band 102B overlap each other perfectly. Thus, the logic OR of the various corresponding bits in these areas matches the bit map data shown in FIG. 8(A).

Figure 9A:
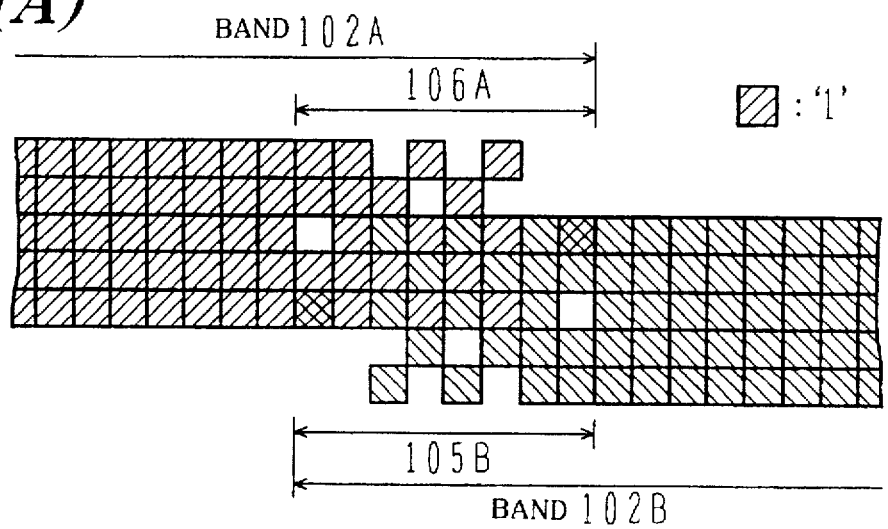
FIGS. 9(A) to 9(C) show wiring pattern data in connecting areas between frames.
Figure 9B:
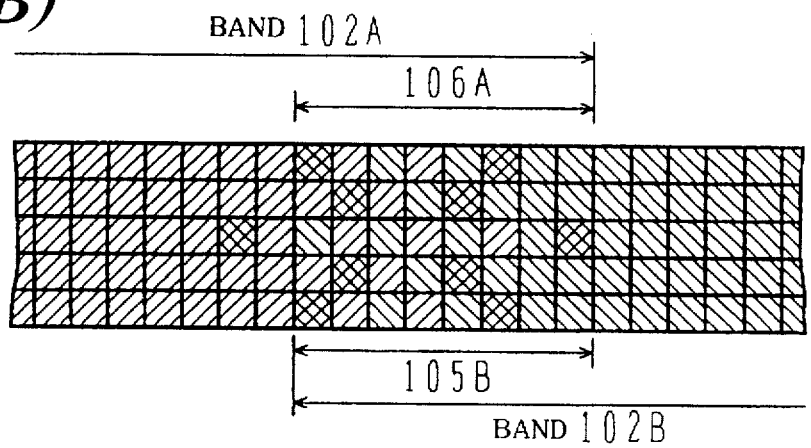
Figure 9C:
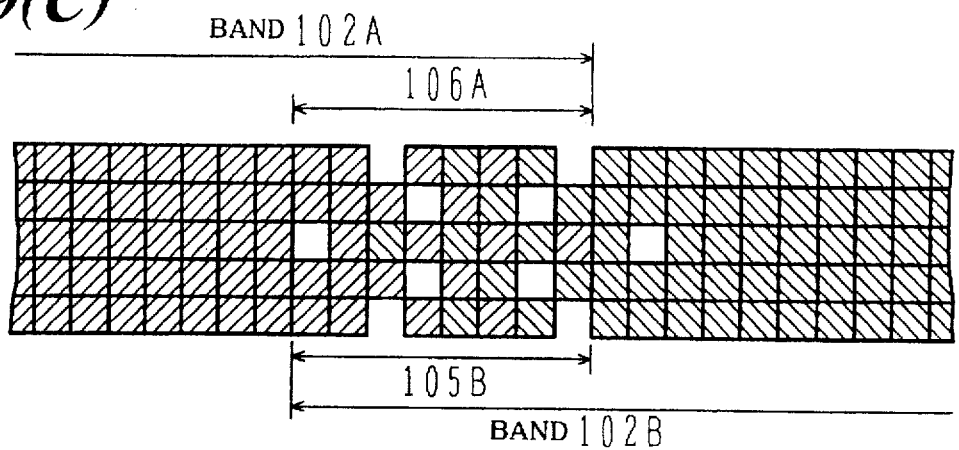

However, in reality, misalignment is bound to occur in the connecting area between the bands 102A and 102B because of errors in stage movement and deflection, thermal drift in the analog circuit and drift in the electron beam. FIGS. 9(A) to 9(C) respectively show the wiring pattern data when a connection misalignment is present in the direction that is at a right angle to the lengthwise direction of the bands, when the connection misalignment is in the lengthwise direction of the bands in which the bands approach each other and when the connection misalignment is in the lengthwise direction of the bands in which the bands move away from each other. The resist patterns in these cases, after taking into consideration the proximity effect, will be identical to those shown in FIGS. 43(A3), 43(B3) and 43(C3) and shorting and disconnection are prevented.

In addition, the sum of the lengths of the modulated areas 105 and 106 relative to the length of the band 102, i.e., 2 mm, may be, for instance, 1.6 μm. Moreover, since the scanning speed in the unmodulated area and the modulated areas 105 and 106 is consistent, reduction in throughput in the exposure system is prevented.

Moreover, since data can be simply modulated using the circulating shift register group 46 in the modulated areas 105 and 106, the connecting area can be processed easily.

2. Second Embodiment

Figure 10:
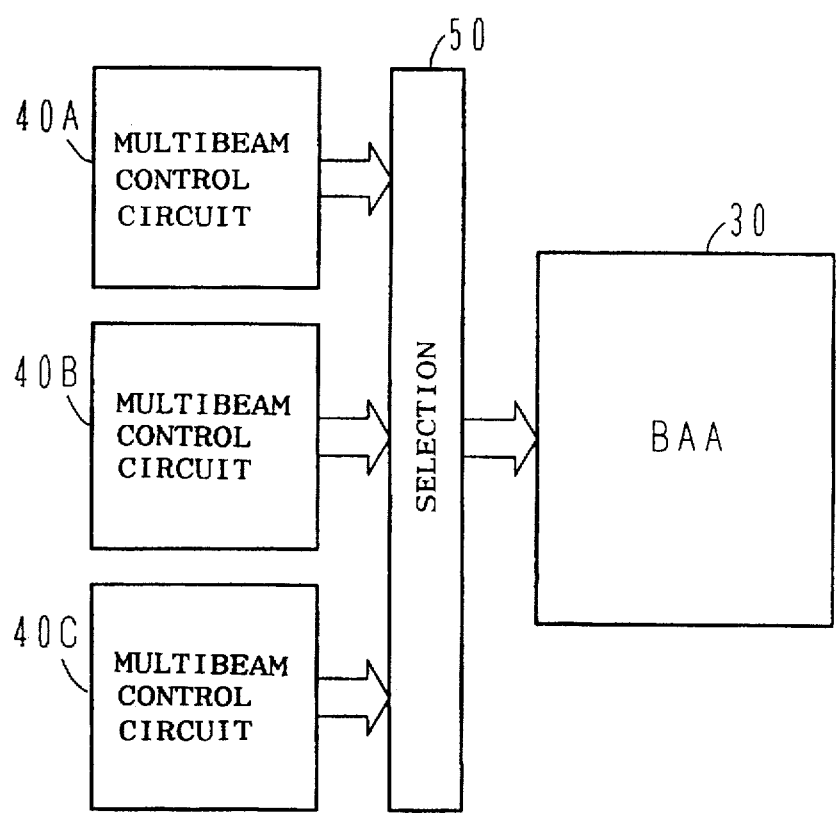
FIG. 10 is a block diagram showing structure that corresponds to that shown in FIG. 2, in the second embodiment according to the present invention.

FIG. 10 shows the structure of the second embodiment in a manner corresponding to that shown in FIG. 2.

In the first embodiment, a case in which the electron beam is radiated at one point on the semiconductor wafer 10 repeatedly m times, or is not radiated at all, with the same data is explained, and by making the number of repeated irradiations variable, it become possible to adjust the dimensions of the edges of a given pattern and to perform correction for the proximity effect with great precision regardless of the connecting area.

Figure 11A:
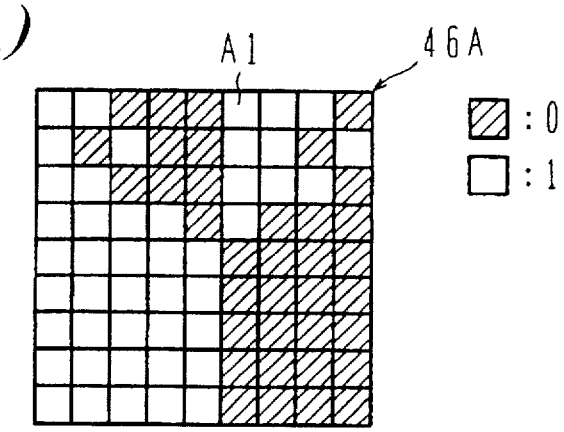
FIGS. 11(A) to 11(C) shows initial setting of shift registers for modulation employed in the blanking aperture array control circuits shown in FIG. 10.
Figure 11B:
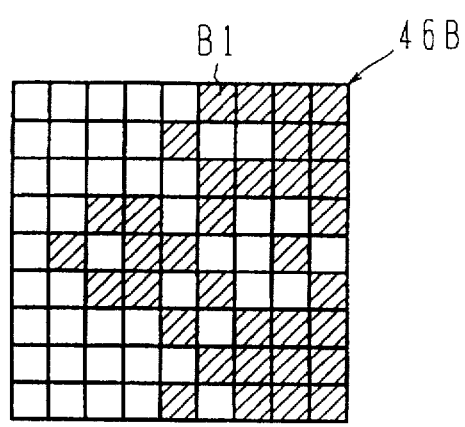
Figure 11C:
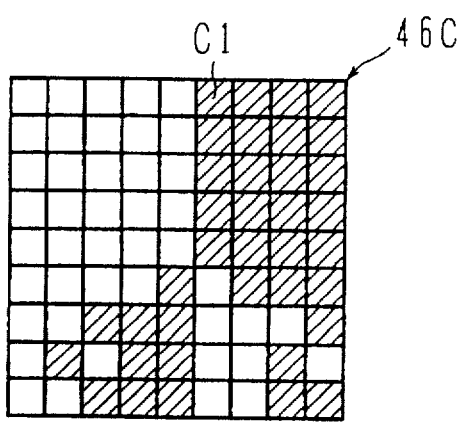

Accordingly, in the second embodiment, multibeam control circuits 40A, 40B and 40C which are structured identically to the multibeam control circuit 40 shown in FIG. 2, are used and their outputs are provided to the blanking aperture array plate 30 via a selector 50. In circulating shift register groups 46A, 46B and 46C (not shown in FIG. 10) in the multibeam control circuits 40A, 40B and 40C, the data set as initial setting are, for instance, as shown in FIGS. 11(A), 11(B) and 11(C) respectively, in correspondence to FIG. 7(A). These three sets of initially set data all satisfy the requirements (a) and (b) described earlier.

For instance, at the time point t=0, the bit data that have been modulated with the bit A1 of the circulating shift register group 46A, are selected by the selector 50, and the potential of the blanking electrode 35(1, 1) shown in FIG. 2 is determined. Then, at the time point t=2(p/a)T, the bit data that have been modulated with the bit B1 of the circulating shift register group 46B, which corresponds to the bit A1, are selected by the selector 50, and the potential of the blanking electrode 35(2, 1) is determined. At the time point t=4(p/a)T, the bit data that has been modulated with the bit C1 of the circulating shift register group 46C, which corresponds to the bit A1, are selected by the selector 50, and the potential of the blanking electrode 35(3, 1) is determined. This sets the number of times electron beam is radiated on one spot P on the semiconductor wafer 10 at 0 to 3. The same is done for other modulated data.

This is desirable because the distribution of the exposure quantity in the modulated areas is made gentler compared to the first embodiment and the pattern in the connecting area changes more gently than in the first embodiment. In addition, for the same reason as that given in reference to the first embodiment, reduction of throughput of the exposure system is prevented.

3. Third Embodiment

Figure 12:
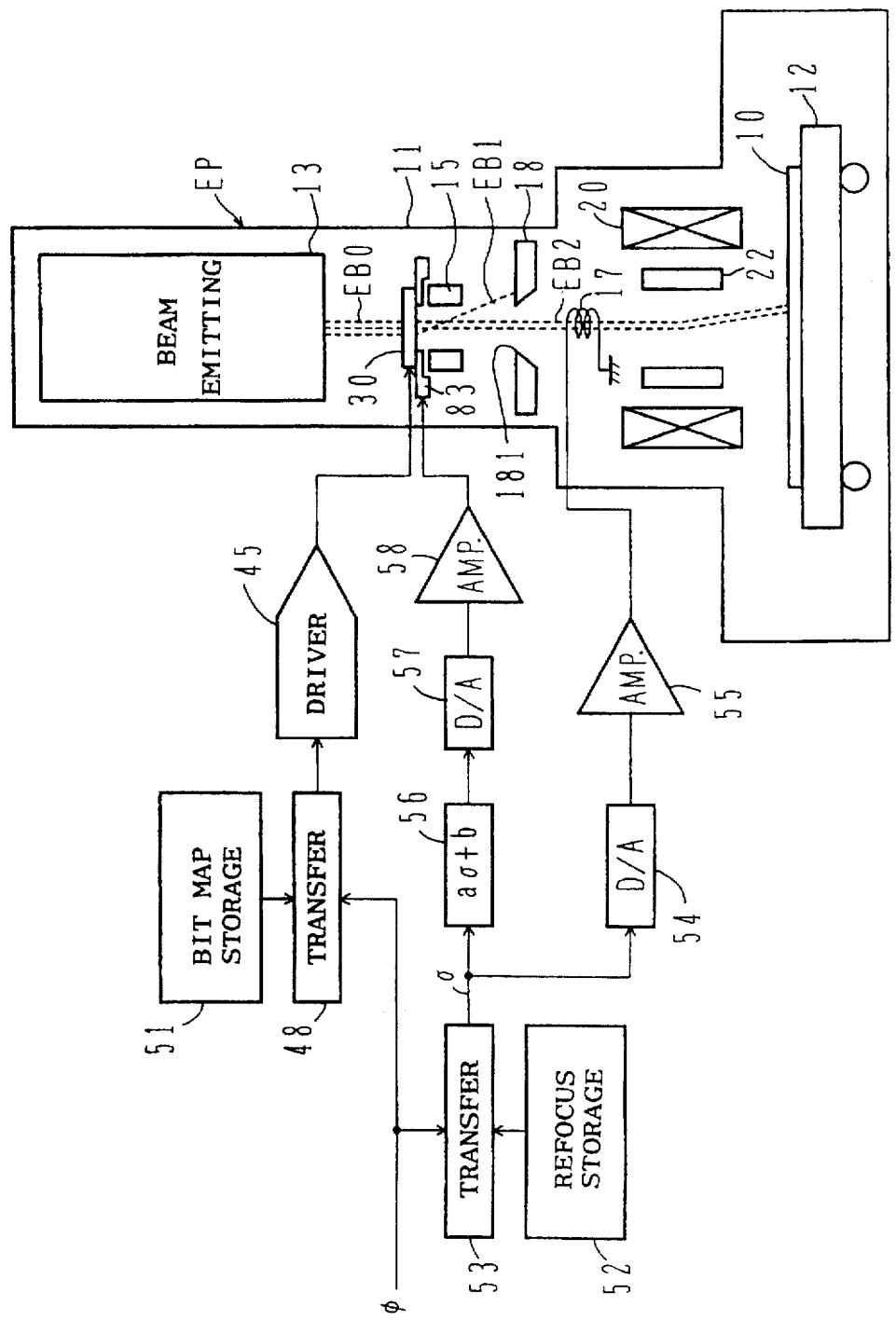
FIG. 12 is a schematic block diagram of the charged particle beam exposure system in the third embodiment according to the present invention.

FIGS. 12 to 17(B) show the third embodiment according to the resent invention. The one-point chain lines in FIGS. 13, 14(B), 14(C) and 15 indicate planes of symmetry that pass through these one-point chain lines, running perpendicular to the paper surface. For the purpose of simplification, the same reference numbers are assigned to a plurality of elements that are structured identically in FIG. 15. FIG. 12 shows a schematic structure of the charged particle beam exposure system.

This system comprises an exposure unit EP and a control unit. In the exposure unit EP, a charged particle beam EB0 is projected on to a BAA chip 30 from a charged particle beam radiating apparatus 13 inside a lens barrel 11 to form a multibeam.

In FIG. 12, the multibeam formed at the BAA chip 30, which is then separated into charged particle beams that are deflected EB1 (off beams), and charged particle beams that are not deflected EB2 (on beams), by the pairs of the blanking electrodes in the BAA chip 30. The off beams EBB1 are blocked by an aperture plate 18 while the on beams EB2 pass through an opening 181 in the aperture plate 18 to be projected on to a semiconductor wafer 10 mounted on a mobile stage 12. A pattern that corresponds to the voltage pattern applied to the pairs of blanking electrodes in the BAA chip 30 is exposed on a resist film on the semiconductor wafer 10. The dot pattern of the on beams EB2 is scanned on the semiconductor wafer 10 by the mobile stage 12, the main deflector 20 and the sub deflector 22.

Although it is omitted in FIG. 12, the charged particle beam EB0 is made parallel at the position of the BAA chip 30 by a plurality of electromagnetic lenses positioned along the optical axis and the on beams EB2 are converged at the opening 181 and at a position on the semiconductor wafer 10.

The charged particle beam EB0 is radiated continuously and before the start of scanning, or during the standby period between the end point and the start point of repeated scans, the entire multibeam is deflected by a blanking deflector 15 positioned between the BAA chip 30 and the aperture 18, to be blocked by the aperture 18.

A multibeam control device in the control unit is provided with a bit map data storage device 51, a data transfer device and drivers 45. In the bit map data storage device 51, which may be, for instance, a magnetic disk device, data obtained by expanding design pattern data into bit map data are stored in advance. The data transfer device 48 is provided with a plurality of sets of buffer storage and as it writes data that have been read out from the bit map data storage device 51 in one set of buffer storage, data from another set of buffer storage are transferred at high speed to the drivers 45 in the order of scanning and in synchronization with clock o. The drivers 45 are provided with a power MOS transistor switch circuit, for instance, a power CMOS circuit for each pair of blanking electrodes in the BAA chip 30, amplifies the drive capacity and supplies it to the blanking electrodes.

Since the on beams EB2 conflict with each other due to Coulomb forces acting between the beams, the focal point is offset downward relative to the surface of the semiconductor wafer 10, resulting in a blurred image. In order to prevent such blurring, a refocus coil 17 is provided under the aperture plate 18, coaxially with the optical axis and an electrical current proportionate to the number of on beams EB2 is supplied to the refocus coil 17 so that the on beams EB2 approach each other due to the magnetic field of the refocus coil 17. The number of on beams EB2 is generated as refocus data based upon the bit map data when the bit map data are being created, and is stored in a refocus data storage device 52.

A refocus coil control device in the control unit comprises the refocus data storage device 52, a data transfer device 53, a D/A converter 54 and a current amplifier 55. Refocus data are stored in advance in the refocus data storage device 52, which may be, for instance, a magnetic disk device. The data transfer device 53 reads out data from the refocus data storage device 52 and supplies them to the D/A converter 54 in synchronization with the clock o, in the same manner as the data transfer device 48. The electric current that has been converted to analog in the D/A converter 54 is amplified at the current amplifier 55 before it is supplied to the refocus coil 17.

Figure 13:
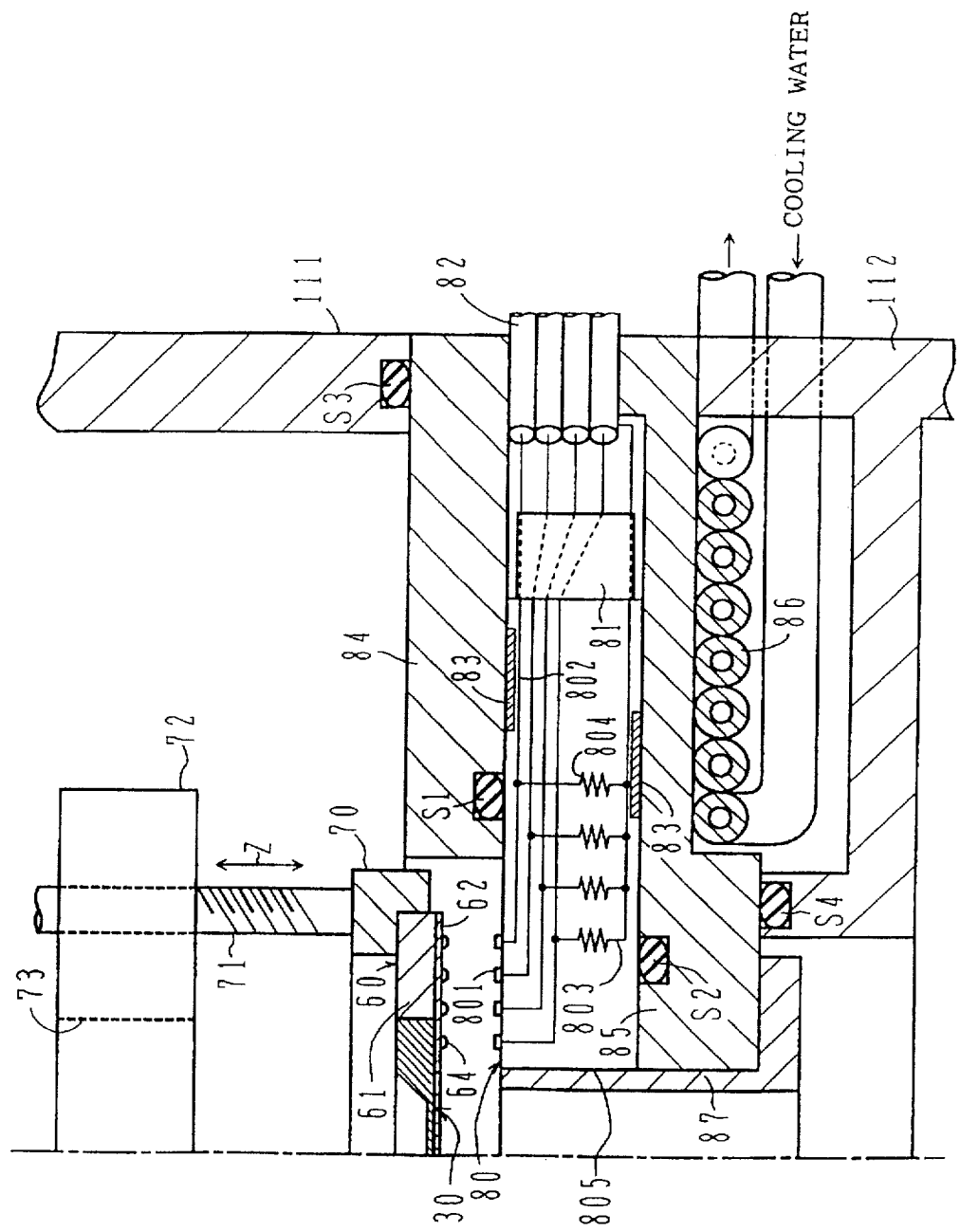
FIG. 13 is a schematic cross section of part of the system shown in FIG. 12.

The outputs of the drivers 45 and the blanking electrodes in the BAA chip 30 are connected with each other via a holder 60, a multilayer wiring board 80, connectors 81 and coaxial cables 82, shown in FIG. 13.

Figure 14A:
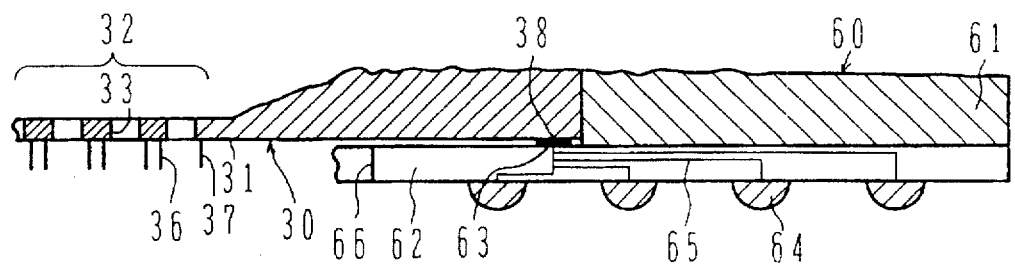
FIGS. 14(A) to 14(C) show details of parts shown in FIG. 13.
Figure 14B:
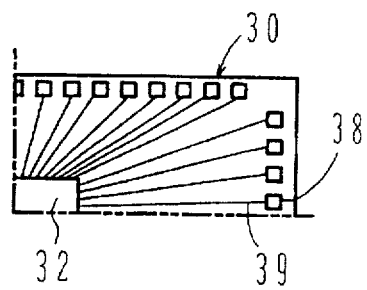
Figure 14C:
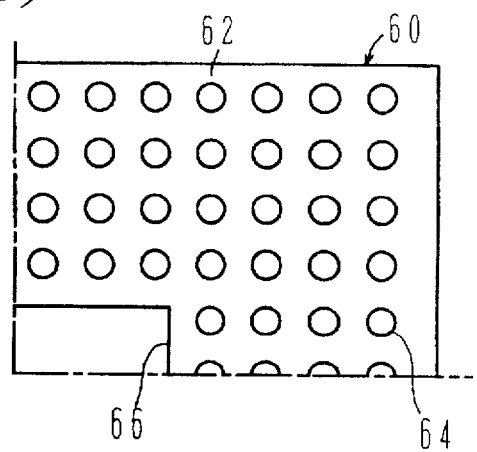

The external surface of the peripheral portion of the surface where the blanking electrodes are formed in the BAA chip 30 are held by the holder 60. The multilayer wiring board 62 is bonded to a frame 61 of the holder 60. Since the BAA chip 30 is heated when the charged particle beam is projected at the aperture array area 32, it is desirable to constitute the holder 60 with a material that has good heat resisting and radiating properties, such as alumina ceramic or alumina ceramic nitride. On one surface of the multilayer wiring board 62, an array of pads 63, which correspond to the array of the pads 38 in the BAA chip 30 is formed, and on the surface that is opposite this surface, a grid array constituted of 4 columns of hemispheres 64 is formed, as shown in FIG. 14(C).

The pads 38 and the hemispheres 64 are connected through a wiring pattern 65 formed within the multilayer wiring board 62. At the center of the multilayer wiring board 62, an opening 66 is formed in correspondence to aperture array area 32.

As shown in FIG. 13, the holder 60 is held at a Z-stage 70. The Z-stage 70 is driven in the direction Z indicated with the arrows in the figure, which runs parallel to the optical axis, via a delivery screw 71, relative to an X-Y stage 72. An opening 73 is provided [in the X-Y stage 72,]* through which the charged particle beam ED0 can pass. In FIG. 13, the drive units of the Z-stage 70 and the X-Y stage 72 as well as the mounting structure of the X-Y stage 72 are omitted.

Figure 15:
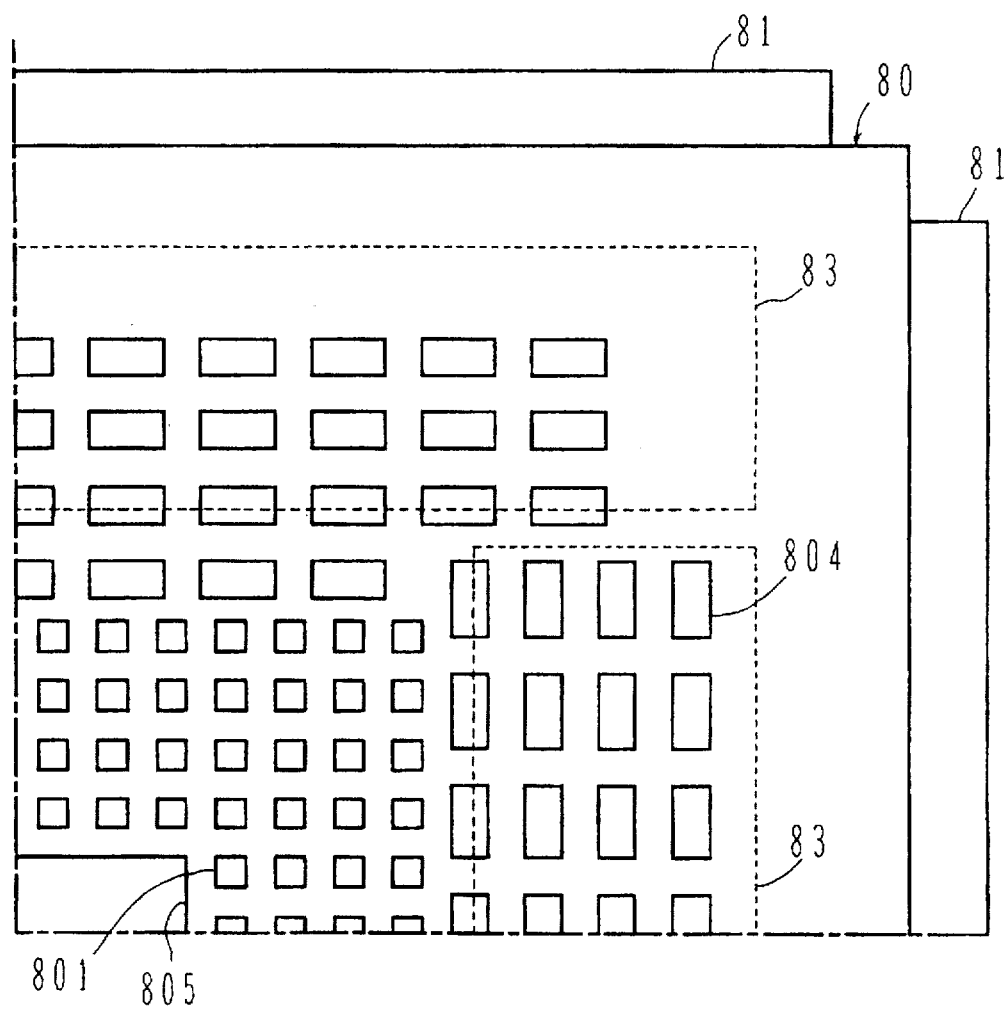
FIG. 15 shows details of part shown in FIG. 13.

On the surface of the inner end portion of the multilayer wiring board 80, which faces opposite the multilayer wiring board 62, a grid array of pads 801 is formed, corresponding to the grid array of the hemispheres 64. As shown in FIG. 15, connectors 81 are fixed at the outer end portion of the multilayer wiring board 80. The number of connectors 81 may be, for instance, 64 pins X 16. The pins of the connectors 81 and the pads 801 are connected with each other via a wiring pattern 802 inside the multilayer wiring board 80. At least one of the pads 801 is for ground potential, and this pad 801 and the corresponding pin of the connector 81 are connected via a ground wiring pattern 803 inside the multilayer wiring board 80. Inside the multilayer wiring board 80, terminating resistors 804 corresponding to individual wiring patterns 802 are provided, connected between the wiring patterns 802 and the ground wiring pattern 803. The terminating resistors 804 may be any one of the following types: a pattern resistor, a sheet resistor, a chip component or an individual resistor. If a type of resistor other than a pattern resistor is employed, an indented portion may be formed in the multilayer wiring board 80, to accommodate the bodies of the resistors. Internal conductors at one end of the coaxial cables 82, which are arranged over four levels in the direction of the optical axis, and a commonly connected external conductor, are connected to the pins of the connectors 81. The external conductor is connected to the ground wiring pattern 803 via the pins of the connectors 81. The other ends of the coaxial cables 82 are connected to the drivers 45 shown in FIG. 2.

By lowering the Z-stage 70 to press the hemispheres 64 into contact with the pads 801, a voltage from the drivers 45 is applied to the blanking electrodes in the BAA chip 30.

This type of pressing contact structure is sturdy and can withstand long periods of use. Also, since the BAA chip 30 is connected by merely fitting it into the holder 60 and the holder 60 has only to be mounted on the Z-stage 70, replacement of the BAA chip 30, which is a consumable, is facilitated.

Since the terminating resistors 804 are provided inside the multilayer wiring board 80 and the wiring patterns 802 inside the multilayer wiring board 80 are connected to the coaxial cables 82 via the connectors 81, the drivers 45, shown in FIG. 12, can be positioned at a location remote from the BAA chip 30, facilitating maintenance on the drivers 45.

The blanking voltage Vb applied to the blanking electrodes in the BAA chip 30 may be, for instance, 10V, and since it is applied to 50Ω terminating resistors 804, the power consumed at each terminating resistor 804 is 2W. Since there are approximately 1000 terminating resistors 804 inside the multilayer wiring board 80, the maximum value of the entire power consumption at the terminating resistors 804 when the entire multibeam is deflected, amounts to approximately 2 kW. For this reason, it is desirable to constitute the multilayer wiring board 80 with a material that has good heat resisting and radiating properties, such as alumina ceramic or alumina ceramic nitride, as mentioned earlier. Layers in the multilayer wiring board 80 are bonded through adhering layers with good sealing characteristics, for instance, with fused glass layers.

The total terminating resistor power W changes as shown in FIG. 16 (A) in correspondence to the bit map data. When the temperature of the multilayer wiring board 80 fluctuates in response to these changes, the beam radiation point on the semiconductor wafer 10 fluctuates due to fluctuations of thermal expansion in the members, and this needs to be stabilized. Thus, heaters 83, sheet resistors, for instance, are fitted in the indented portion formed in the mutilayer wiring board 80 and power is supplied to the heaters 83 to ensure that the temperature of the multilayer wiring board 80 is kept constant. FIG. 15 shows the positions of the heaters 83, the terminating resistors 804 and the pads 801.

Figure 16A:
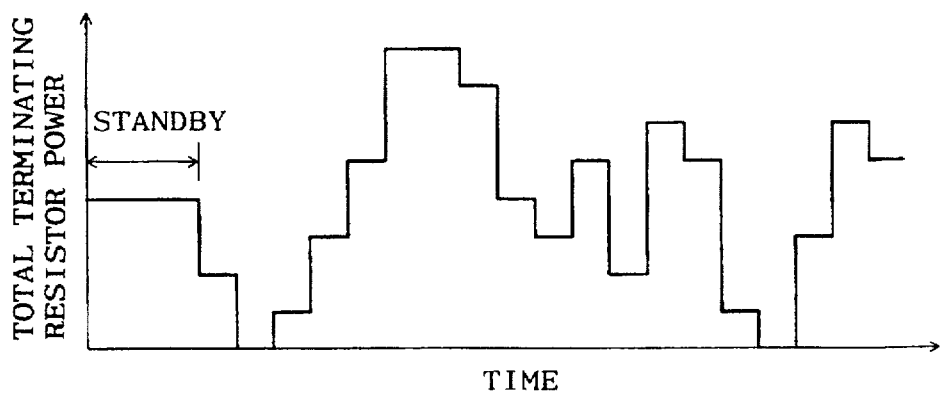
FIGS. 16(A) to 16(C) are diagrams showing the operation of the structure shown in FIG. 13.
Figure 16B:
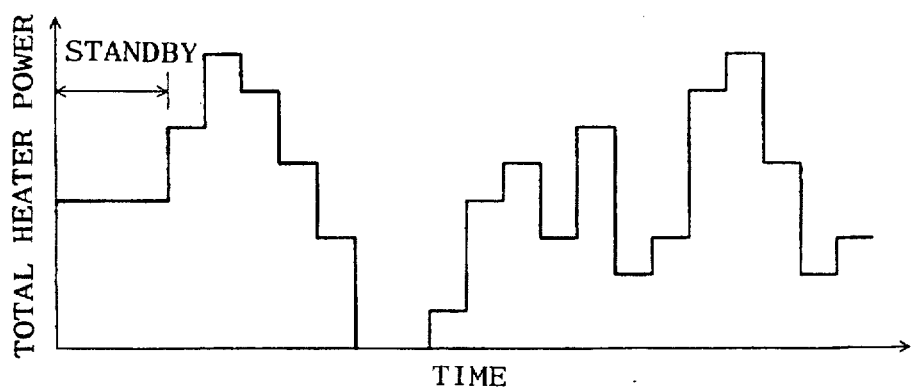
Figure 16C:
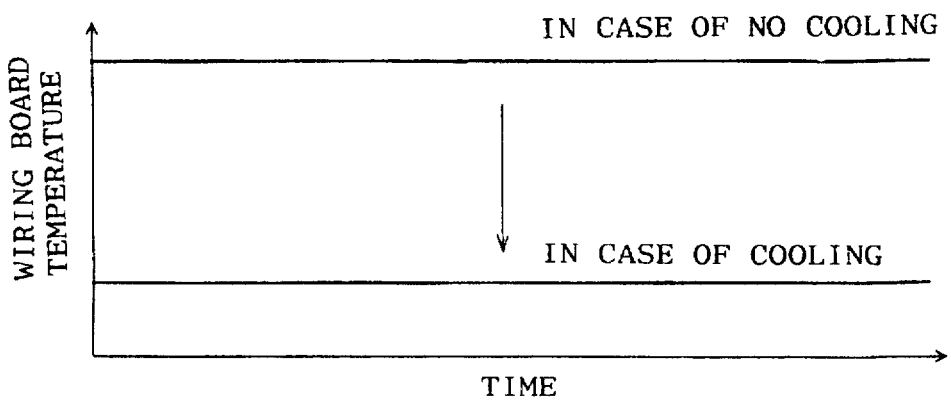

On the supposition that the thermal conductivity of the multilayer wiring board 80 and the surrounding elements is infinite, if power is supplied to the heaters 83 to ensure that the sum of the total terminating resistor power W and the total heater power is constant, then the temperature of the multilayer wiring board 80 will be maintained constant. FIG. 16(B) shows the changes in the total heater power *W.

As shown in FIG. 12, a heater control device in the control unit is provided with the refocus data storage device 52, the data transfer device 53, a calculation circuit 56, a D/A converter 57 and a power amplifier 58. Of these, since the refocus data storage device 52 and the data transfer device 53 are shared with the refocus coil control device, only the calculating circuit 56, the D/A converter 57 and the power amplifier 58 must be added. Since the thermal conductivity mentioned earlier is not, in fact, infinite, the temperature of the multilayer wiring board 80 fluctuates even when W+*W is constant. The calculating circuit 56 is used to correct this fluctuation. Refocus data from the data transfer device 53 are also supplied to the calculating circuit 56 where a primary conversion or the data, i.e., a+b is calculated, to be supplied to the D/A converter 57. The power amplifier 58 supplies power to the heaters 83 in proportion to the output current from the D/A converter 57.

In the calculating circuit 56, a and b are constants whose settings can be varied and they are determined to ensure that, when the number of the on beams EB2 is changed before exposure, fluctuation of the beam radiation point on the semiconductor wafer 10 due to fluctuation of the temperature of the multilayer wiring board 80 is minimized.

In FIG. 13, the multilayer wiring board 80 is clamped by a member 84 and a member 85. The members 84 and 85 are constituted of a material with good thermal conductivity, such as copper. In order to maintain a vacuum inside the lens barrel, the area between the multilayer wiring board 80 and the member 84 and also the area between the multilayer wiring board 80 and the member 85 are sealed with sealing rings S1 and S2 respectively toward the optical axis. The lens barrel 11 shown in FIG. 12 is provided with lens barrels 111 and 112 which are separate from each other as shown in FIG. 13. The lens barrel 111 lies continuous to the member 84 via the sealing ring S3, which provides an airtight seal, and the lens barrel 112 lies continuous to the member 85 via the sealing ring S4, to provide an airtight seal. This structure allows part of the multilayer wiring board 80, the connectors 81 and the coaxial cables 82 to be positioned on the atmosphere side, facilitating the connection and maintenance of the connectors 81 and the coaxial cables 82 and also making it possible to reduce the length of the wiring between the pads 801 and the connectors 81.

A cooling pipe 86 is wound around in contact with the member 85 concentric with the optical axis. The sealing ring S4 is positioned closer to the optical axis than the pipe 86 to allow the pipe 86 to be positioned on the atmosphere reside, facilitating mounting and maintenance of the pipe 86. By passing cooling water through the pipe 86, to cool the multilayer wiring board 80 via the member 85, the temperature of the multilayer wiring board 80 is reduced, as shows in FIG. 16(C).

Figure 17A:
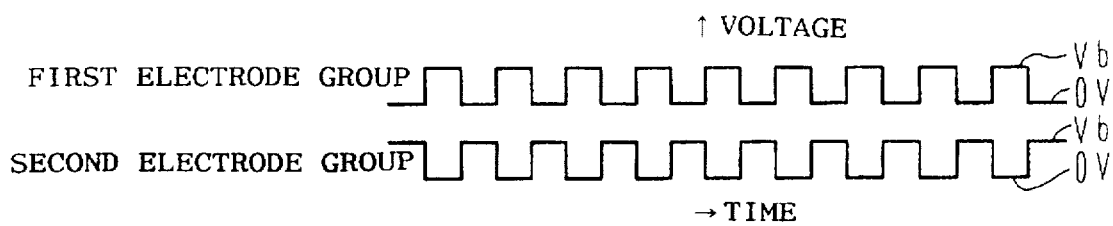
FIGS. 17(A) and 17(B) illustrate the operation of a multibeam in the standby state.
Figure 17B:
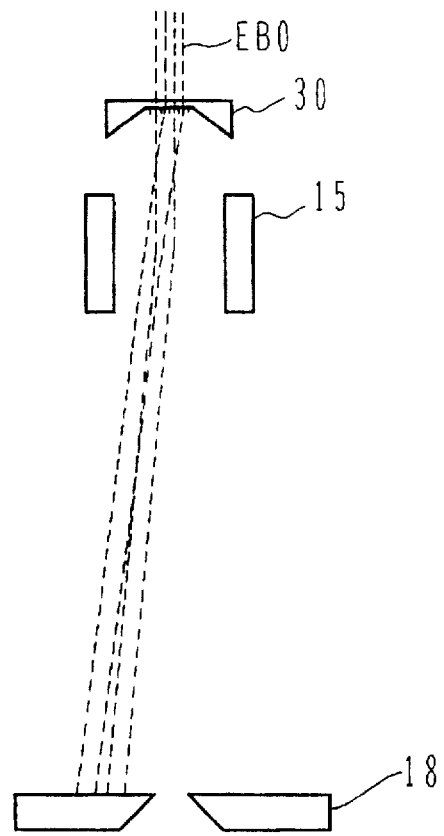

In order to minimize fluctuation of the beam radiation spot caused by temperature fluctuations, it is necessary to reduce the fluctuations of temperature in the multilayer wiring board 80 and to make the temperature distribution in the multilayer wiring board 80 consistent. The total terminating resistor power W itself cannot be changed. Therefore, by ensuring that the total terminating resistor power W during standby, as mentioned earlier, is half the maximum value, as shown in FIG. 16(A), the maximum fluctuation range of the total terminating resistor power W is halved compared to a case in which the total terminating resist power W is 0 during standby. FIG. 17(B) shows a schematic of the locus of the multibeam in such a state of standby. Furthermore, the pairs of blanking electrodes in the BAA chip 30 are divided into a first electrode group constituted with half the electrodes and a second electrode group constituted with the remaining half and, as shown in FIG. 17 (A), by applying the blanking voltage Vb to the first electrode group and the second electrode group alternately, the temperature distribution in the multilayer wiring board 80 is made consistent. In order to make this distribution even more consistent, the first electrode group and the second electrode group are selected individually, so that the distribution density of the corresponding terminating resistors 804 is nearly consistent in FIG. 15.

A metal cylinder 87 in FIG. 13 is constituted with copper, for instance, and prevents formation of an electric field at the time of charge up.

4. Fourth Embodiment

Figure 18:
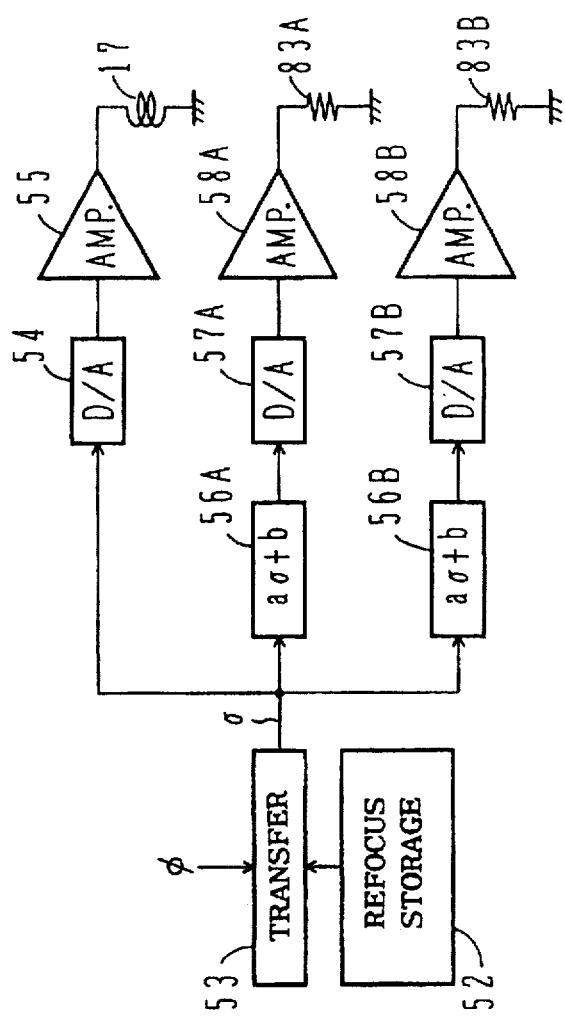
FIG. 18 is a block diagram of a refocus data utilizing part in the fourth embodiment according to the present invention.

FIG. 18 shows the refocus data utilizing unit in the fourth embodiment according to the present invention.

In this mode, the heater 83 is divided into two systems, a heater 83A* and a heater 83B* with the heater control device being provided with a calculating circuit 56A, a D/A converter 57A and a power amplifier 58A for the heater 53A and a calculating circuit 56B, a D/A converter 57B and a power amplifier 58B for the heater 53B. The constants a and b in the calculating circuits 56A and 56B can be set freely independent of each other.

Since, in the fourth embodiment, there are two sets of parameters a and b, for stabilizing the temperature of the multilayer wiring board 80, temperature fluctuations in the multilayer wiring board 80 can be further reduced compared to the third embodiment.

5. Fifth Embodiment

Figure 19:
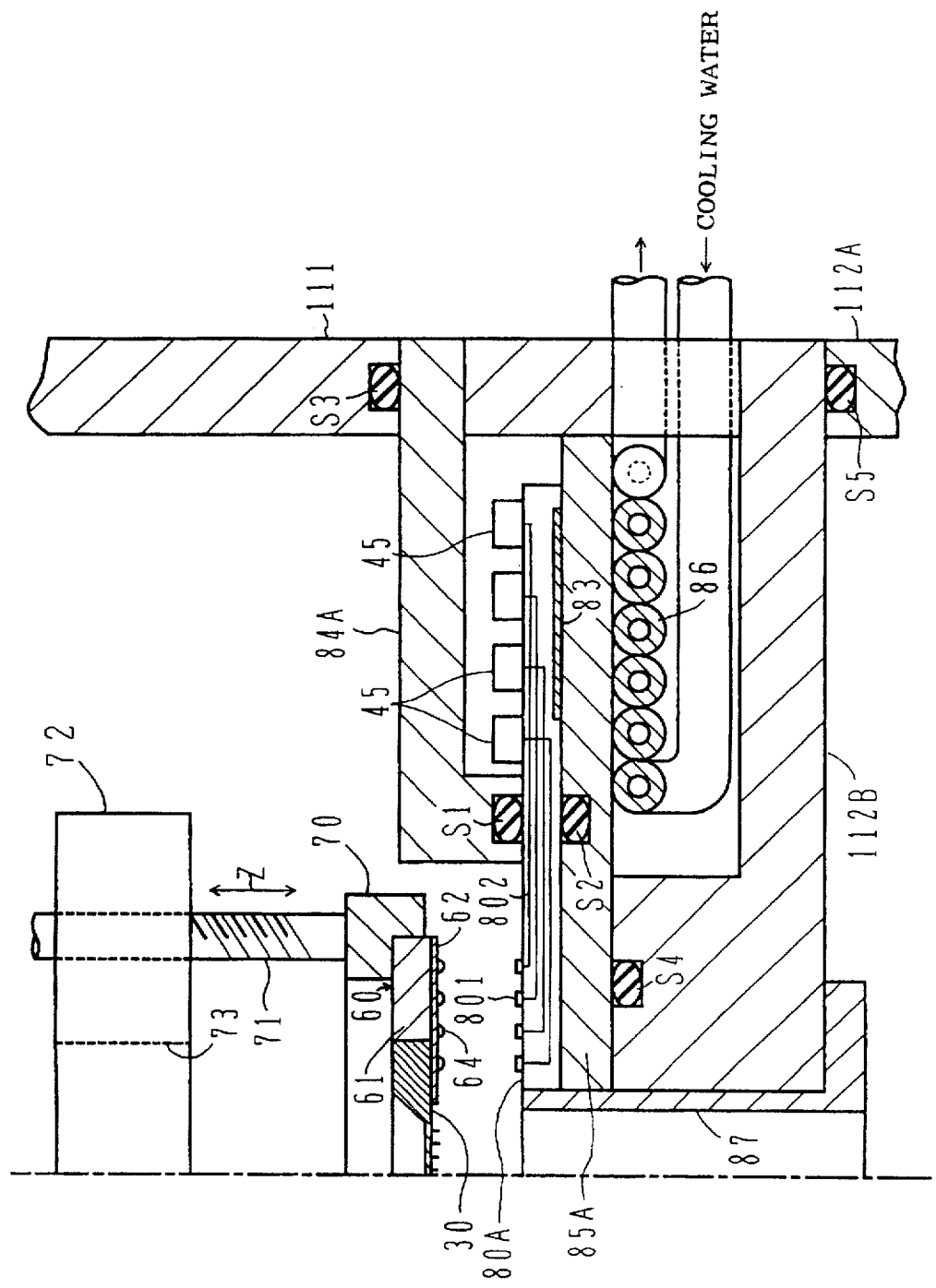
FIG. 19 is a schematic cross section corresponding to that shown in FIG. 13, in the fifth embodiment according to the present invention.

FIG. 19 is a schematic cross section corresponding to that of FIG. 13, of the fifth embodiment according to the present invention.

Since, in the third embodiment, the terminating resistor 804 are provided inside the multilayer wiring board 80, the quantity of heat generated is great, at a maximum of approximately 2 kw. Also, in the structure as shown in FIG. 13, the length of the wiring in the multilayer wiring board 80 can be made smaller than the radius of the lens barrel, and a portion of the multilayer wiring board 80 can be taken out on the atmosphere side.

Reflecting the above, in the fifth* embodiment, the terminating resistors 804 are not provided inside a multilayer wiring board 80A and the drivers 45 are positioned on a portion of the multilayer wiring board 80A that is on the atmosphere side. A member 84A is shaped so as to ensure that a space is formed at the multilayer wiring board 80A in which the drivers 45 are accommodated. The drivers 45 employ 128 monosylic hybrid ICs, each of which may be constituted of, for instance, 8 power CMOS inverters. The total power consumption at the drivers 45 is a maximum of approximately 100W, which is approximately ½₀ of the total terminating resistor power W in the third embodiment.

In this case, too, since the power consumption of the drivers 45 fluctuates in correspondence to the bit map data, the heaters 83 are fitted in an indented portion formed in the multilayer wiring board 80A. In addition, a pipe 86 is wound in contact with a member 85A which is in contact with the lower surface of the multilayer wiring board 80A, to cool the multilayer wiring board 80A via the member 85A.

A sealing ring S5 keeps the area between a lens barrel 112A and a member 112B air tight. The other features are identical to those in the third embodiment.

Since, in the fifth embodiment, the quantity of heat generated is reduced compared to the third embodiment, temperature fluctuations in the multilayer wiring board 80A are further reduced, which In turn results in a further reduction of fluctuations of the beam radiation point.

6. Sixth Embodiment

Figure 21A:
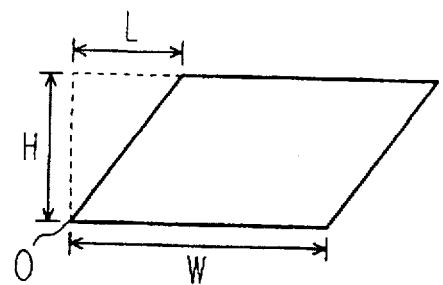
FIGS. 21(A) to 21(C) illustrate the expression format for basic figures.
Figure 21B:
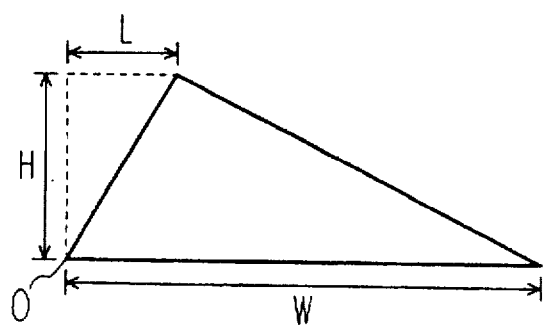

The bent portions of a wiring pattern 120 shown in FIG. 27(A), for instance, can be divided into basic FIGS. 121 to 125 and, as shown in FIGS. 21(A) and (B), each of them can be expressed in the following record.

IDC, XS, YS, W, H, L (i)

with IDC: The code with which the type of a basic figure, such as a parallelogram, triangle or the like is identified.

(XS, YS): The coordinates of the origin point O of a basic figure in a canvas memory 99.

W: The width of the basic figure in the X direction.

H: The width of the basic figure in the Y direction.

L: The shear in the X direction.

Figure 21C:
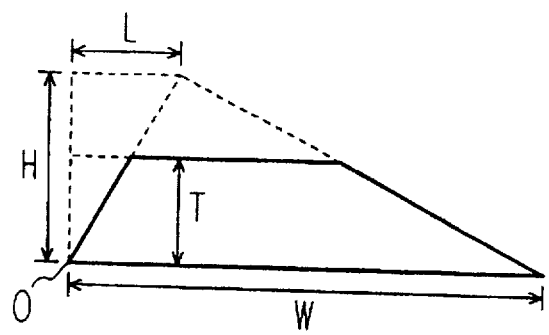

H and L are positive values, 0 or negative values. For i stance, in the triangle 124 in FIG. 27(A), H<0 and in the right triangle 125, L=0, while the rectangle is a parallelogram with L=0. The triangle 121 and the triangle 122 together may be regarded as one trapezoid. A trapezoid can expressed by adding a new parameter T (height) to the parameters of a triangle as shown in FIG. 21(C).

Figure 20:
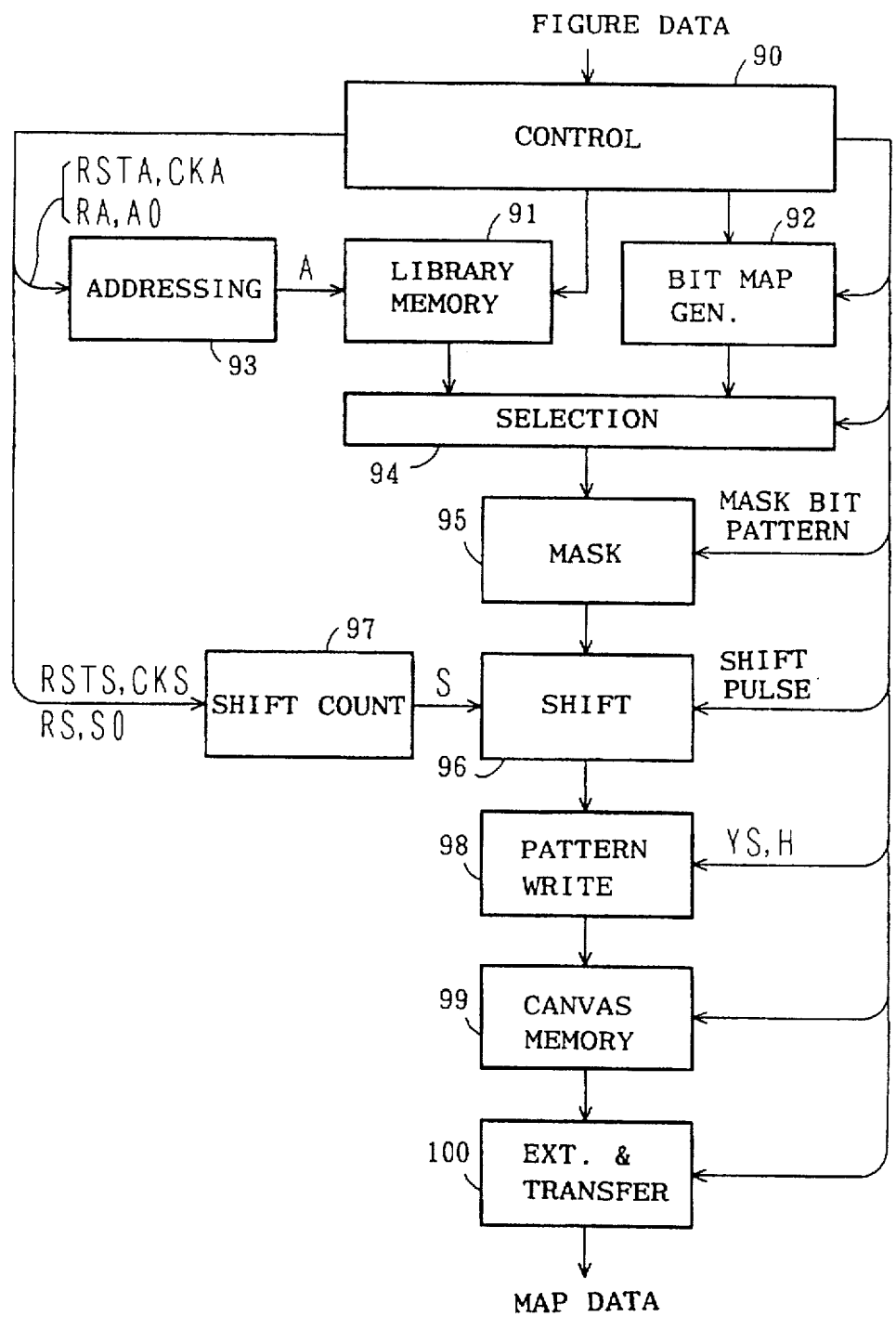
FIG. 20 is a block diagram of a pattern expanding apparatus in the sixth embodiment according to the present invention.

FIG. 20 shows the pattern expanding (converting) apparatus for expanding a figure data corresponding to an exposure pattern into a bit map data.

Data for basic figures formatted as described above are supplied to

A control part 90 controls parts 91 to 100 as described below in response to a provided figure data. The IDC have bit B. If B='1', the control part 90 makes a library memory 91 read out a bit map data via a addressing part 93, and if B='0', the control part 90 makes a bit map data generator 92 expand the basic figure into a bit map data without using the addressing part 93 and a mask part 95 (through state).

Figure 24:
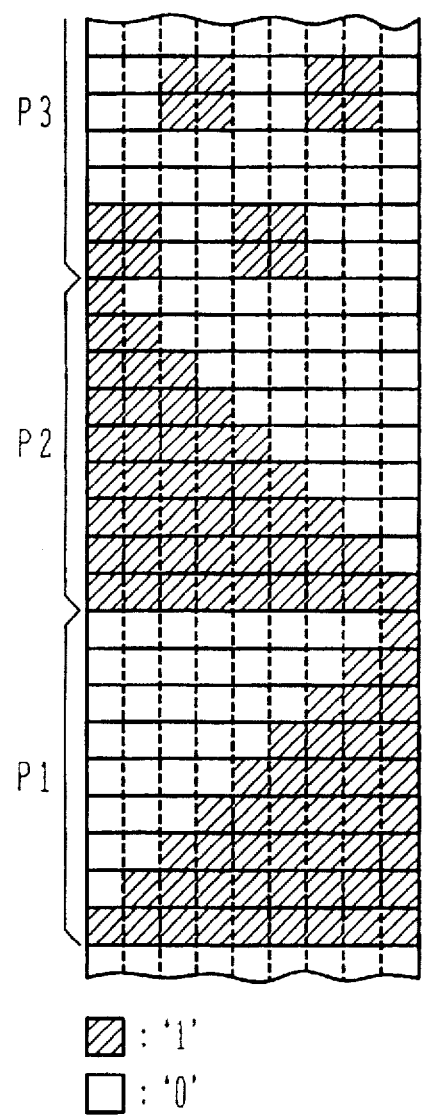
FIG. 24 illustrates the bit map data stored in the library storage shown in FIG. 20.

In the library memory 91, bit map data P1 to P3 of basic figures or standard figures that are the basis of the basic figures, are stored, for instance as shown in FIG. 24. In FIG. 24, a hatched square indicates bit '1' and an unhatched square indicates bit '0' (the same applies in FIGS. 25(A) to 25(D) and FIGS. 26(A) to 26(D). These data are specified in units of rows by an address A from the addressing part 93 and are read out. A start address is determined with the IDC.

When B='0', as shown in FIG. 44(B), the bit map data generator 92 resolves the basic figure into band rectangles (rows) with the width of each equivalent to one bit and extends each of the band rectangles into a bit map data in unit of a band rectangle. The bit lengths n of the parallel outputs from the library memory 91 and the bit map data generator 92 are equal to each other.

The output data from either the library memory 91 or the bit map data generator 92 are selected at a selecting part 94 based upon a control signal from the control part 90 and are then supplied to a mask part 95. The mask part 95 is provided with a register with n bits, where the mask bit pattern from the control part 90 are set. The mask part 95 calculates the AND of these data and the data from the selecting part 94 and outputs it. This output is shifted by S bits at a shift part 96 with a shift pulse from the control part 90. The number of shift bits S is supplied from the control part 90 via a shift bit number specifying part 97. The data thus shifted are then written in a canvas memory 99 by a pattern write part 98. The canvas memory 99 is accessed in units of rows and the number of bits in one row is equal to the number of bits in the shift register in the shift part 96. This number of bits is equal to, for instance, n mentioned above. The canvas memory 99 contains a sufficient data area for depicting, for instance, a rectangular range of 10 μm×100 μm at an electron beam radiation point of a rectangle of 0.08 μm×0.08 μm.

By using, for instance, a blanking aperture array in which lattice-like rectangular openings of 25 μm×25 μm are formed in a board and a pair of electrodes are formed at the edge of each opening, and by either applying or not applying a voltage between the pair of electrodes in each opening based upon the corresponding data bit within the canvas memory 99, control is performed as to whether or not the electron beam passing through the opening is radiated on the object of exposure, to depict a pattern.

When the pattern has been written into the canvas memory 99, in order to form the outline of the resist pattern with a higher degree of precision, the data in the canvas memory 99 are extracted at the ratio of, for instance, one bit out of every 4 bits in conformance to a specific rule, by an extraction & transfer part 100 (since this point is not relevant to the present invention its explanation Is omitted) and then they are transferred to the bit map data storage device 51 shown in FIG. 12.

Figure 22A:
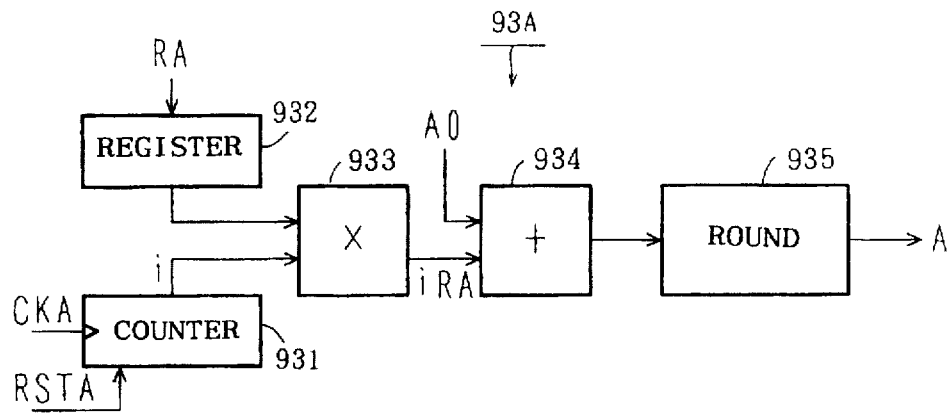
FIGS. 22(A) to 22(C) are block diagrams showing structural examples of the addressing part in FIG. 20.
Figure 22B:
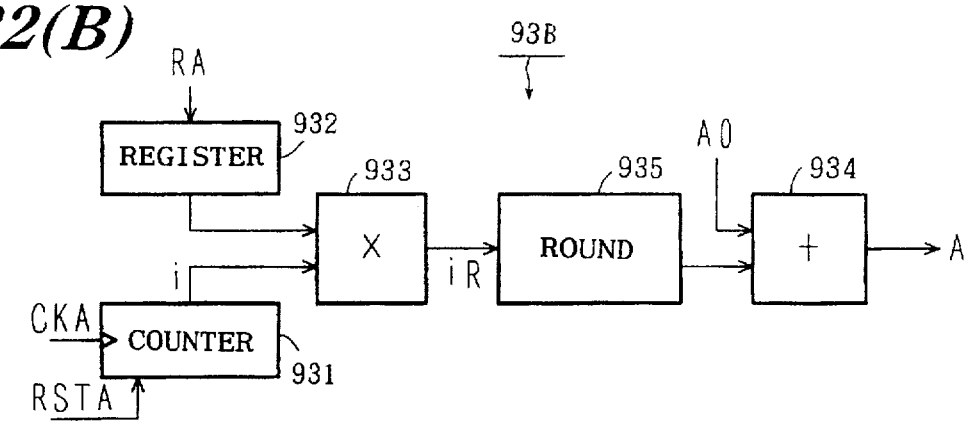
Figure 22C:
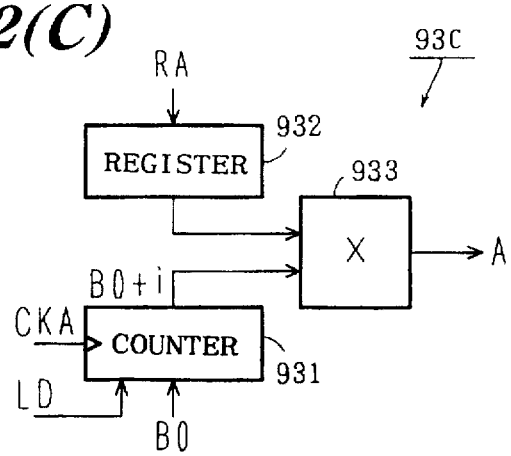

Next the structural examples of the address specifying part 93, i.e., 93A to 93C are explained in reference to FIGS. 22(A) to (C).

Figure 23:
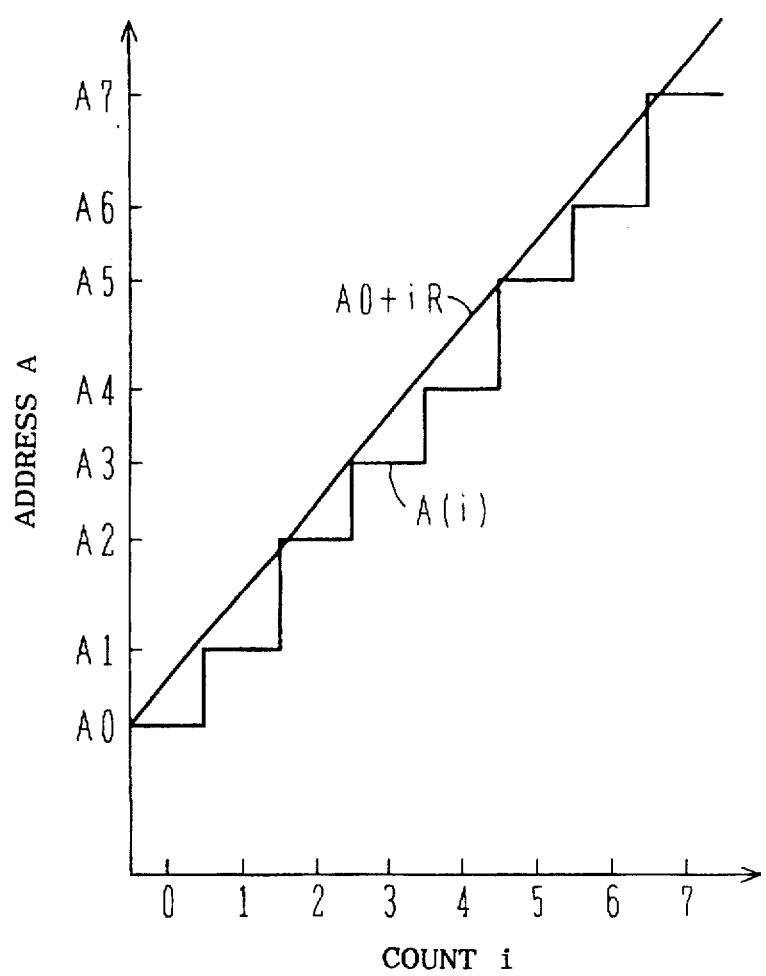
FIG. 23 is a diagram showing the operation of the addressing part shown in FIG. 22.

The address specifying part 93A is provided with a counter 931, a register 932, a multiplying circuit 933, an adding circuit 934 and an rounding circuit 935. The counter 931 is cleared to 0 by a reset signal RSTA and counts a clock CKA. The multiplying circuit 933 calculates the product i·RA by multiplying the Y direction enlargement ratio RA set in the register 932 and the count i in the counter 931. The adding circuit 934 calculates the sum of i·RA and the leading address AO. The rounding circuit 935 rounds the output from the adding circuit 934 to an integer and outputs it as address A. This rounding is performed through half adjustment, rounding-off or rounding-up. The reset signal RSTA, the clock CKA, the Y direction expansion ratio RA and the leading address AO are all supplied from the control part 90. FIG. 23 shows the relationship between the count i and the address A.

When the output value from the adding circuit 934 is a fixed-point number, the structure may omit the rounding circuit 935 by using only the integer portion of the output from the adding circuit 934. An address specifying part 93B is identical to the address specifying part 93A except that the adding circuit 934 and the rounding circuit 935 are switched, with its output address A equal to that from the address specifying part 93A. When the output value from the multiplying circuit 933 is a fixed-point number, the structure may omit the rounding circuit 935 by using only the integer portion of the output from the multiplying circuit 933.

In an address specifying part 93C, the adding circuit 934 and the rounding circuit 935 in the address specifying part 93A are omitted and a counter 931 is employed. In the counter 931, an initial value B0=[A0/RA] is set with the timing of LD. The [ ] indicates the operator for rounding the value within to an integer. The output value from the multiplying circuit 933 is a fixed-point number and the integer portion alone is extracted as the address A.

The structure of the shift bit number specifying part 97 is FIG. 20 is identical to that of the address specifying part 3. The reset signal RSTS, the clock CKS, an X direction misalignment/deformation ratio RS and the initial shift bit number S0, which correspond to the reset signal RSTA, the clock CKA, the Y direction expansion ratio RA and the leading address A0 respectively, are supplied to the shift bit number specifying part 97 from the control part 90.

Hereafter, it is assumed that the address specifying part 93 is the address specifying part 93A shown in FIG. 22 (A) and that the shift bit number specifying part 97 is structured identically to the address specifying part 93A.

Next, the operation of the pattern expanding apparatus structured as described above, for various types of basic figures by using the library memory 91 is explained. It is assumed that one bit in the canvas memory 99 is equivalent to the length 1. The various types of basic figures are expressed with (i), as explained earlier.

(1) Isosceles right triangle (L=0)

Figure 25A:
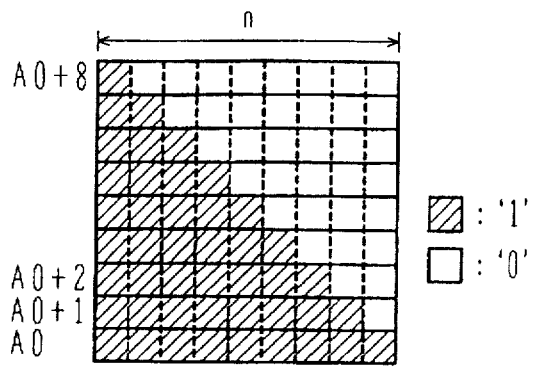
FIGS. 25(A) to 25(D) illustrate a write operation of the bit map data of a right triangle into a canvas memory.
Figure 25B:
Figure 25C:
Figure 25D:
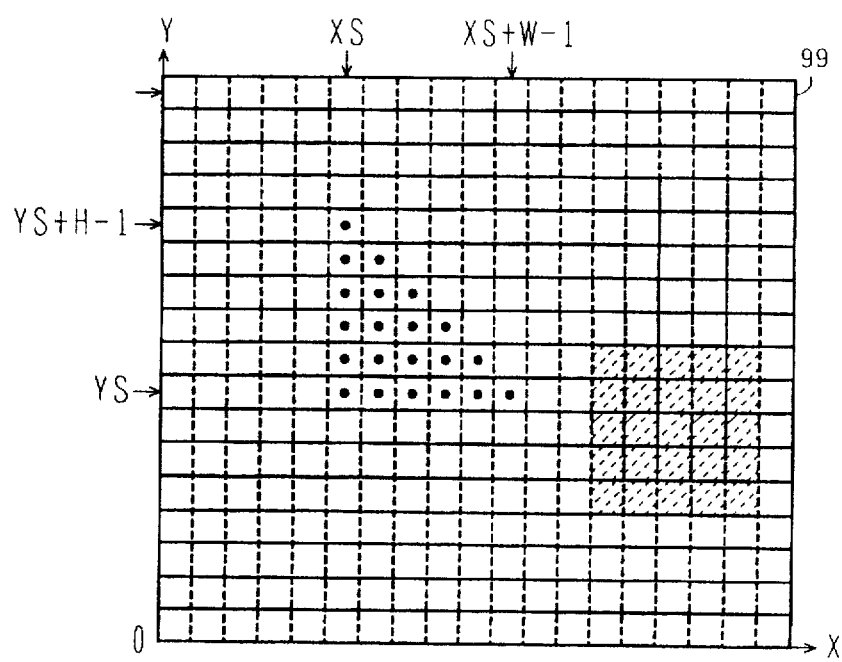

The write to add the isosceles right triangle pattern, which is indicated with dots, into the canvas memory 99 when the rectangle pattern indicated with diagonal lines is already written In the canvas memory 99, as shown in FIG. 25(D), is explained. It is assumed that the pattern shown in FIG. 25(A), which is analogous to this triangle pattern, is stored in the library memory 91.

In FIG. 22(A), RA=1 in the address specifying part 93 and, consequently, A=A0+i. Since RS=L/H=0 is set in the register of the shift bit number specifying part 97, which corresponds to the register 932 in FIG. 22(A), S=S0 without depending upon the clock CKA.

. One row of data read out from the address A in the library memory 91 are supplied to the mask part 95 via the selecting part 94. Mask data, in which W bits toward the right end are at '1' and the remaining n–W bits are at '0', as shown in FIG. 25(B), are set in the register 251 of the mask part 95. The AND operation between the mask bit pattern and the data from the selecting part 94 is performed in the mask part 95. The results of this operation are then shifted by S=XS–(n–W) bits in the shift part 96. The patter n write part 98 reads out data corresponding to one row at address Y=YS+i from the canvas memory 99, calculates the OR of these data and the output data from the shift register 261 of the shift part 96 and writes the results at address Y of the canvas memory 99.

The processing described above is performed for i=0 to H–1 sequentially.

In this example, since the pattern expanding apparatus is provided with the mask part 95, by registering one right triangle pattern in the library memory 91, the pattern of an analogous right triangle can be written in the canvas memory 99.

(2) Rectangle (L=0)

In FIG. 22(A), in the address specifying part 93, RA=0 and A= constant (which is A0 in FIG. 22(A) but is different from A0 in FIG. 25(A)). Since RS=L/H=0 is set in the register of the shift bit number specifying part 97, which corresponds to the register 932 in FIG. 22(A), S=S0 without depending upon the clock CKA.

Data that correspond to one row that is equal to the width W of the rectangle in the X direction are read out from the right triangle pattern shown in FIG. 25(A), in which address A=n–W.

Figure 26A:
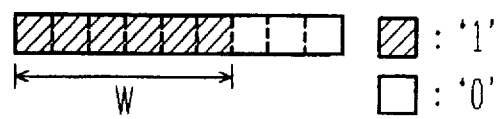
FIGS. 26(A) to 26(D) illustrate a write operation of the bit map data of a rectangle and a parallelogram into the canvas memory.
Figure 26B:
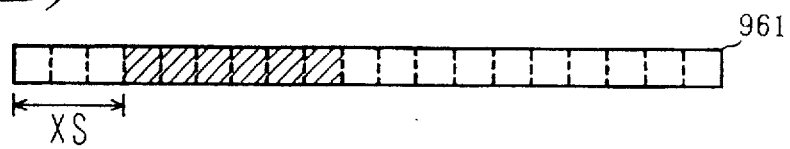
Figure 26C:
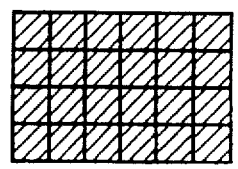

FIG. 26(A) shows the data thus read out. These data are shifted by S=XS bits in the shift part 96 and become as shown in FIG. 26(B).

The pattern write part 98 calculates the OR of these shifted data and the data at address Y=YS+i in the canvas memory 99 and writes the results at address Y=YS+i in the canvas memory 99. This processing is performed for i+0 to H–1 sequentially and the rectangle pattern shown in FIG. 26(C), for instance, is written in the canvas memory 99.

In this example, any given rectangle pattern can be formed by using the isosceles right triangle pattern registered in the library memory 91.

(3) Parallelogram

Figure 26D:
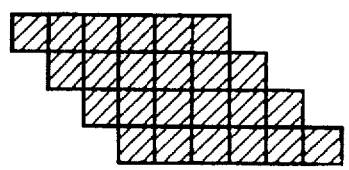

Since RS=L/H which is not 0, is set in the register of the shift bit number specifying part 97, which corresponds to the register 932 in FIG. 22(A), the shift bit number S changes as follows; S=S0 to S0+[(H–1)·L/H]. The processing is otherwise identical to that performed for a rectangle described above. With this, a parallelogram pattern, as shown in FIG. 26(D), for instance, is written in the canvas memory 99.

In this example, any given parallelogram pattern can be formed by using the isosceles right triangle pattern registered in the library memory 91.

(4) Regular triangle

Figure 27A:
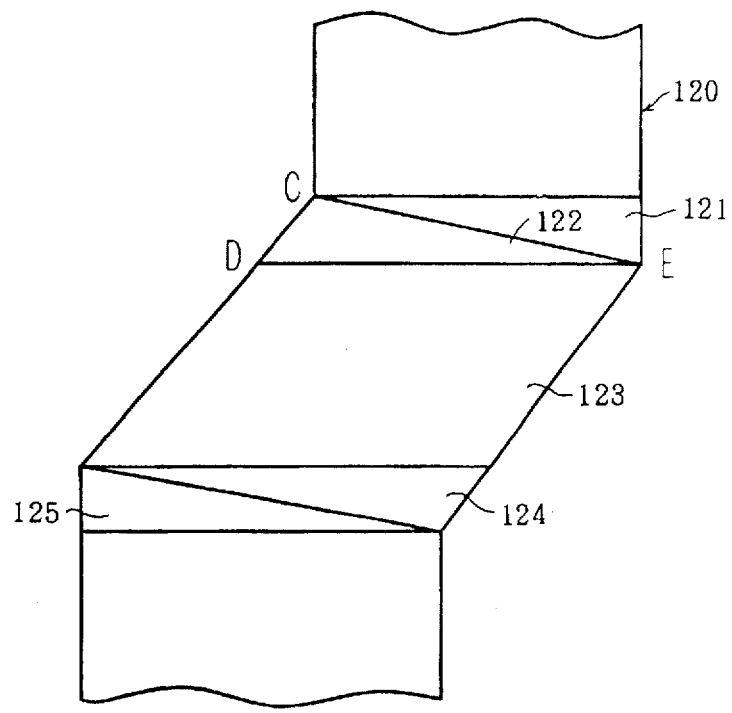
FIG. 27(A) illustrates resolution of the bent portions of the wiring pattern into basic figures and FIG. 27(B) illustrates formation of the triangle 122 in FIG. 27(A) with a basic figure.
Figure 27B:
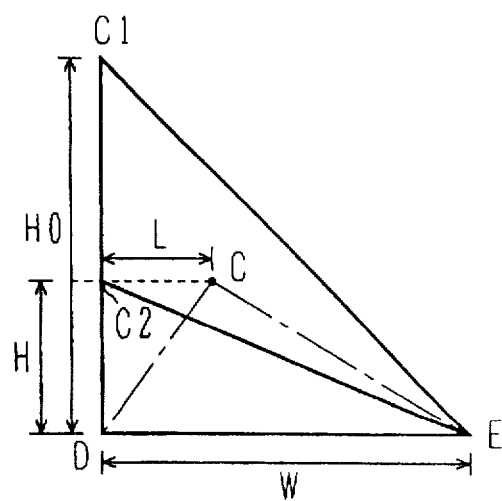

The case in which the triangle 122 shown in FIG. 27(A) is expanded into a bit pattern is considered. In FIG. 27(B), it is assumed that the isosceles right triangle C1DE corresponds to the right triangle written in the canvas memory 99 in (1) above.

In (1), if RA=H0/H is set in the address specifying part 93, the triangle C2DE shown in FIG. 27(B) is written in the canvas memory 99. Furthermore, if RS=L/H is set in the shift bit number specifying part 97, the triangle CDE shown in FIG. 27(B) is written in the canvas memory 99.

In this example, any given triangle pattern can be formed by using the right triangle pattern registered in the library memory 91.

(5) Regular trapezoid

As mentioned earlier, a trapezoid can be expressed by adding the parameter T shown in FIG. 21(C) to (i). A triangle represents a special case in which T=H. As is obvious, by ending the repetitious processing after the Tth time in (4) above, a trapezoid, as shown in FIG. 21(C), is written in the canvas memory 99.

In the sixth embodiment according to the present invention, by registering the bit map data of one standard isosceles right triangle in the library memory 91 in advance, any given rectangle, parallelogram, triangle or trapezoid can be expanded into a bit map data efficiently and quickly.

7. Seventh Embodiment

In order to facilitate data processing, it is desirable to unify the expression of basic figures for triangles, parallelograms and the like. For this purpose, basic figures are classified into the following three types:

Type 1 figures; rectangles, isosceles right triangles, parallelograms with the internal angles at 45° and 135°, trapezoids with the internal angles at 45° and 135°, arbitrary registered figures.

Type 2 figures: figures obtained by transforming type 1 figures other than rectangles through scaling in the Y direction.

Type 3 figure: figures obtained by transforming type 1 figures other than rectangles and parallelograms through scaling in the Y direction and through shifting in the x direction.

Arbitrary registered figures are used when higher speed processing can be achieved by expressing a plurality of patterns that are used repeatedly as one incorporated pattern, as in the case of the pattern P3 shown in FIG. 24, for instance.

Figure 28A:
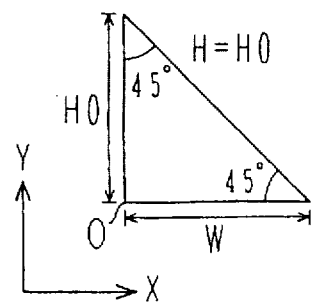
FIG. 28(A) to 28(H) illustrate a classifications of basic figures in the seventh embodiment, with FIGS. 28(A) to 28(C) showing type 1 figures, FIGS. 28(D) to 28(F) showing type 2 figures and FIGS. 28(G) and 28(H) showing type 3 figures.
Figure 28B:
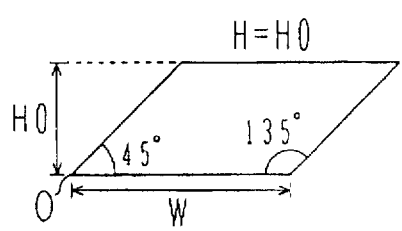
Figure 28C:
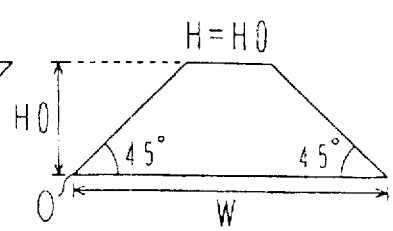
Figure 28D:
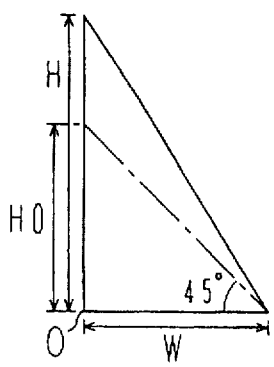
Figure 28E:
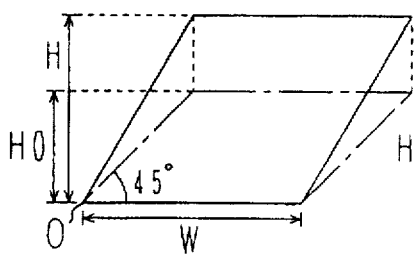
Figure 28F:
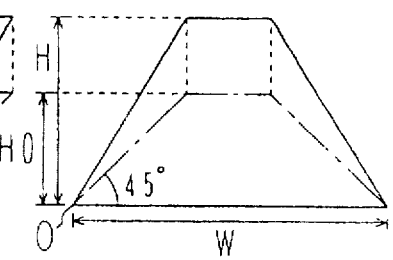
Figure 28G:
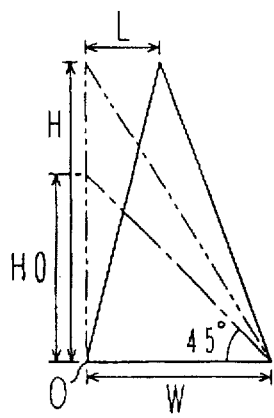
Figure 28H:
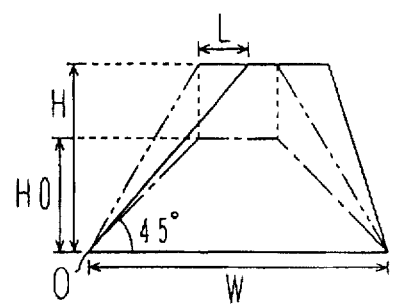

FIG. 28(A) to (C) show type 1 figures, the solid lines in FIGS. 28(D) to (F) show type 2 figures and the solid line in FIGS. 28G and H show type 3 figures. The one-dot chain lines n FIGS. 28(D) to (F) show type 1 figures that are obtained by transforming type 2 figures without changing W. In FIGS. 28(G) and (H), the two-dot chain lines show type 2 figures that are obtained by transforming type 3 figures without changing W and the one-dot chain lines show type 1 figures that are obtained by transforming these type 2 figures without changing W. The parameters W, H0 and L of the triangle shown in FIGS. 28(A), (D) and (G) are the same as those in the sixth embodiment. These parameters W, H0 and L are used in the same manner for other figures to achieve a unified expression as in the case of triangles.

Types 1 to 3 figures are respectively expressed as follows:
IDC, XS, YS, W, H
IDC, XS, YS, W, H, R$\alpha$
IDC, XS, YS, W, H, R$\alpha$, R$\beta$ Where IDC have the code with which figures such as a parallelograms, triangles, trapezoids and arbitrary registered figures and their types 1 to 3 are identified (with this code, the number of words for expressing basic figures is determined);

(XS, YS) is the coordinates of the origin point O of a basic figure in the canvas memory 99.

W: The width of the basic figure in the X direction.

H: The width of the basic figure in the Y direction.

R$\alpha$: H0/H with H0 being the width in Y direction when the basic figure is transformed to become a type 1 figure without changing W.

R: L/H with L being the shift in the X direction when the basic figure is transformed to become a type 1 figure without changing W.

The method of expanding a basic figure into a bit pattern is the same as that employed in the sixth embodiment, and and RS that are respectively set in the registers of the address specifying part 93 and the shift bit number specifying part 97 in FIG. 20 are as follows:

Triangles or arbitrary registered figures: RA=R$\alpha$, RB=R$\beta$
Parallelograms; RB=(H0+L)/H=R$\alpha$+R$\beta$
Trapezoids: RA=R$\alpha$, RB=(H0+L)/H=R$\alpha$+R$\beta$ Generally speaking, the number of times type 1 figures are used is sufficiently larger than the number of times type 2 figures are used and also the number of times type 2 figures are used is sufficiently larger than the number of time type 3 figures are used. Therefore, by expressing basic figures by classifying them into three types as in the seventh embodiment, the entire number of words required can be reduced compared to a method in which common expressions are made for types 1 to 3 figures.

8. Eighth Embodiment

Usually, the number of times R$\alpha$ and R$\beta$ are used is small and also the same value is used continuously. Thus, in order to further reduce the entire number of words described above, types 1 to 3 figures are expressed with only the following two types of expressions;
IDC, XS, YS, W, H
IDC, R$\alpha$, R$\beta$ The code IDC in record IDC, R$\alpha$, R$\beta$ indicates settings of R$\alpha$ and R$\beta$ in the register. The code IDC in record IDC, XS, YS, W, H is identical to that for types 1 to 3 figures in the seventh embodiment described earlier, and when this code IDC indicates a type 2 figure, R$\alpha$ held in the register is used and when this code IDC indicates a type 3 figure, R$\alpha$ and R$\beta$ held in the register are used, to achieve the same result as in the case of the seventh embodiment.

For instance, let us consider a case in which the figure data are continuous, as shown below.

Step 1: IDC1, R$\alpha$1, R$\beta$1
Step 2: IDC2, XS1, YS1, W1, H1
Step 3: IDC2, XS2, YS2, W2, H2
Step 4: IDC3, XS3, YS3, W3, H3

Assuming that IDC2 and IDC3 respectively indicate a type 2 figure and a type 3 figure, R$\alpha$1 is used in steps 2 and 3 and R$\alpha$1 and R$\beta$1 are used in step 3. R$\alpha$1 and R$\beta$1 set in the register in step 1 are used for the values of R$\alpha$ and R$\beta$ until IDC, R$\alpha$, R$\beta$ is executed the next time.

In the eighth embodiment according to the present invention, since types 1 to 3 figures are expressed in a unified format, the data processing is further facilitated compared to the seventh embodiment.

9. Ninth Embodiment

Next, the method of proximity effect correction using the device shown in FIG. 20 is explained.

Figure 29A:
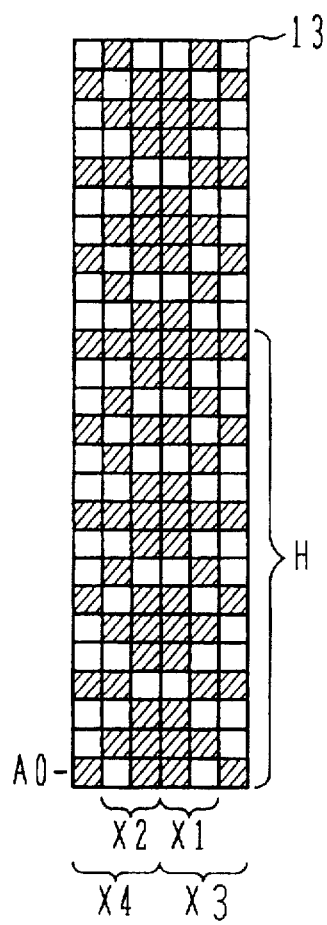
FIGS. 29(A) to 29(D) illustrate a method of proximity effect correction in the ninth embodiment according to the present invention, with FIG. 29(A) showing registered bit map data for proximity effect correction, FIG. 29(B) showing the bit map data to be corrected, FIG. 29(C) showing bit map data obtained by extracting a partial area of the bit map data in FIG. 29A and FIG. 29D showing bit map data for which proximity effect correction has been performed using the AND of the bit map data in FIGS. 29(B) and 29(C)

FIG. 29(A) shows bit map data for proximity effect correction registered in the library memory 91 (to be more precise, bit map data registered in an external storage and read out to the library memory 91). These data are used commonly for proximity effect correction of the bit map data of various patterns such as those shown in FIGS. 29(B), 30(A) and 31(A). The squares in the figure represent bits as in FIG. 24 and the presence/absence of hatching corresponds to '1'/'0'.

Figure 29B:
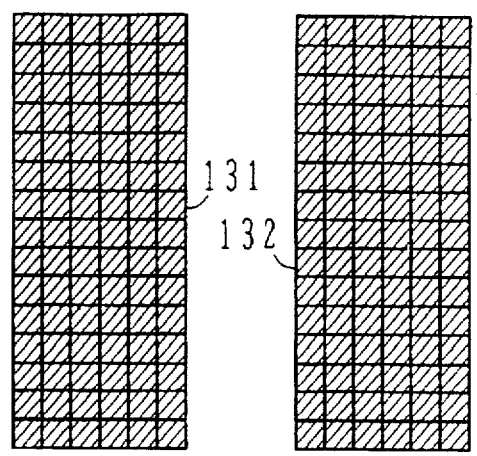

Lets us assume that two sets of pattern bit map data 131 and 132, which are in close proximity to each other, in FIG. 29(B), are written in the canvas memory 99 in FIG. 20 as described above. As explained below, the proximity effect correction for the pattern bit map data 131 is performed by employing a similar method to that used when the pattern bit map data 131 are written in the canvas memory 99.

The calculation for proximity effect correction of a pattern has been already performed employing a method in the prior art at a preceding stage in the control part 90 and the figure data in the following format are given to the control part 90 as the proximity effect correction data:

OPC, IDC, XS, YS, (cut out information)

In this format, the ID code IDC and the coordinates (XS, YS) of the origin point of the position within the canvas memory 99 mean the same as earlier, and IDC=(B, AS, RS), where AS is a start address of a basic figure register in the library memory 91

(cut out information): word number from the start address AS, H and bit pattern for mask OPC: logic operation code Bit B is always set at '1', so the library memory 91 is accessed and the output from the library memory 91 is selected by a selection part 94. One word is read out from address A0+i in the library memory 91. At the mask portion 95, a portion X1 of the bit map data 130 is extracted by a mask word in which the bits corresponding to the portion X1 are set at '1' and the bits corresponding to the other area are set at '0' and all other bits are set to '0'.

Since RS=0, offset distortion does not occur in a shift part 96. The data are then shifted by the shift part 96 by the number of bits S, which is determined by XS and the position of the first bit that is set at '1' on the high order side of the mask word. A pattern write part 98 performs operation of the AND specified by the code OPC of the data thus shifted and of the data at address Y=YS+i in the canvas memory 99, and then writes the results at address Y=YS+i in the canvas memory 99.

Figure 29C:
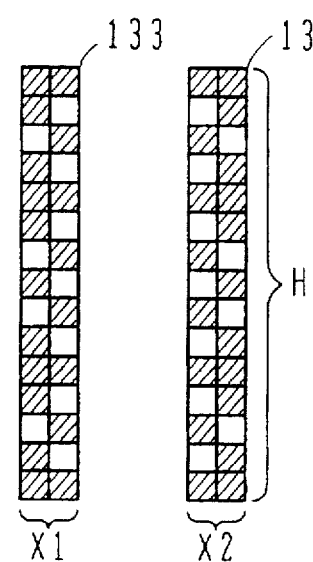
Figure 29D:
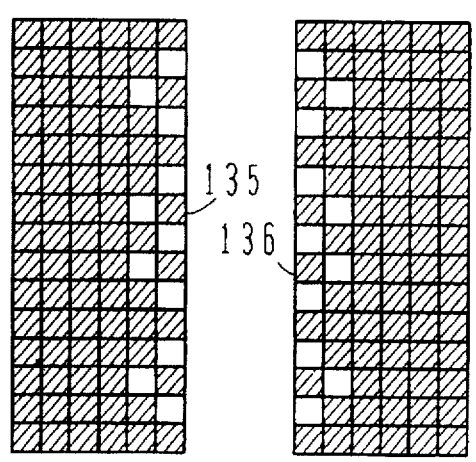

This processing is sequentially performed for each i that is i=O to H−1 so that proximity effect correction is performed to obtain the bit map data 135 in FIG. 29(D).

For the bit map data 132, too, proximity effect correction is performed in the same manner as that described above, so that the bit map looks like the bit map of data 136 in FIG. 29(D). In this case, a portion X2 of the bit map data 130 is extracted by the mask word.

Consequently, operation of the AND of the bit map data in FIG. 29(B) and the bit map data in FIG. 29(C) is performed to achieve the bit map data shown in FIG. 29(D).

FIG. 30(A) shows an object of correction in which sets of bit map data 131 and 132 are in closer proximity than those in FIG. 29(B). In this case, a portion X3 of the bit map data 130 is extracted by the mask word for the bit map data 131 and a portion X4 of the bit map data 130 is extracted by the mask word for the bit map data 132. In the same manner as described above, as a result, the operation of the AND of the bit map data in FIG. 30(A) and the bit map data in FIG. 30(B) is performed so that the bit map data shown in FIG. 30(C) are achieved.

Figure 31A:
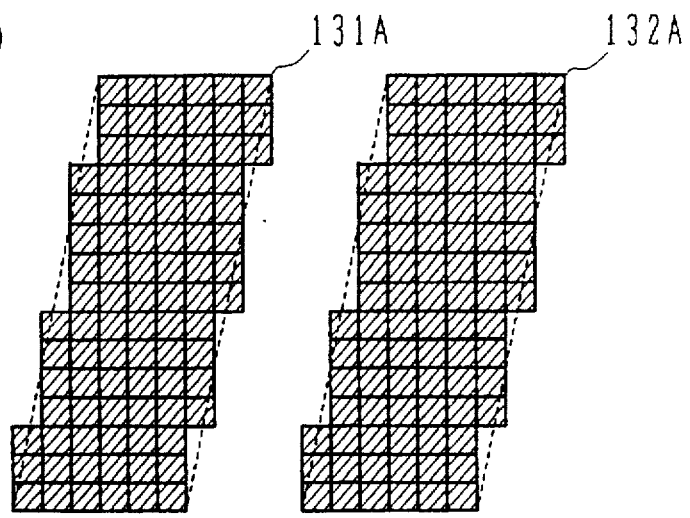
FIGS. 31(A) to 31(C) show bit map data obtained by offsetting the bit map data in FIGS. 29(B) to 29(D) respectively, with a shift register.
Figure 31B:
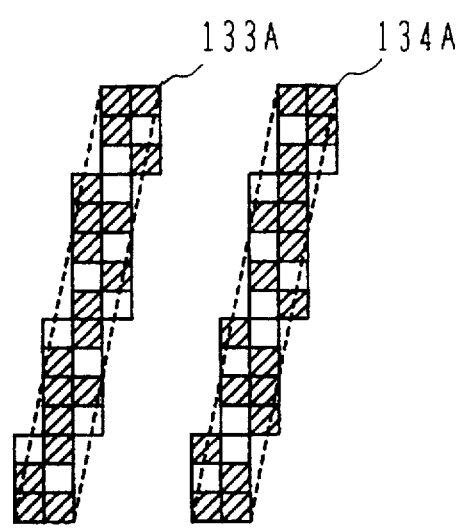
Figure 31C:
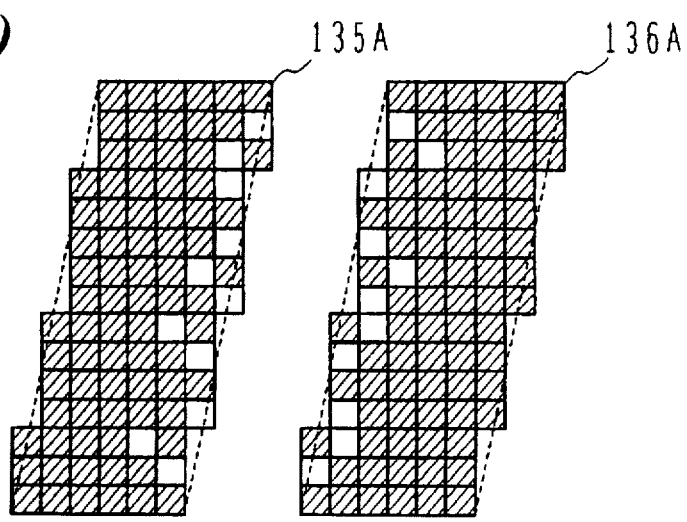

FIG. 31(A) shows an object of correction, i.e., sets of bit map data 131A and 132A, which are obtained by offsetting the bit map data 131 and 132 in FIG. 29(B). In this case, as in FIG. 26(D), RS>0 should be true. In the same manner as described above, therefore, the operation of the of the bit map data 131A and 132A in FIG. 31(A), and the bit map data 133A and 134A in FIG. 31(B) is performed so that the bit map data 135A and 136A shown in FIG. 31(C) are achieved.

Figure 45A:
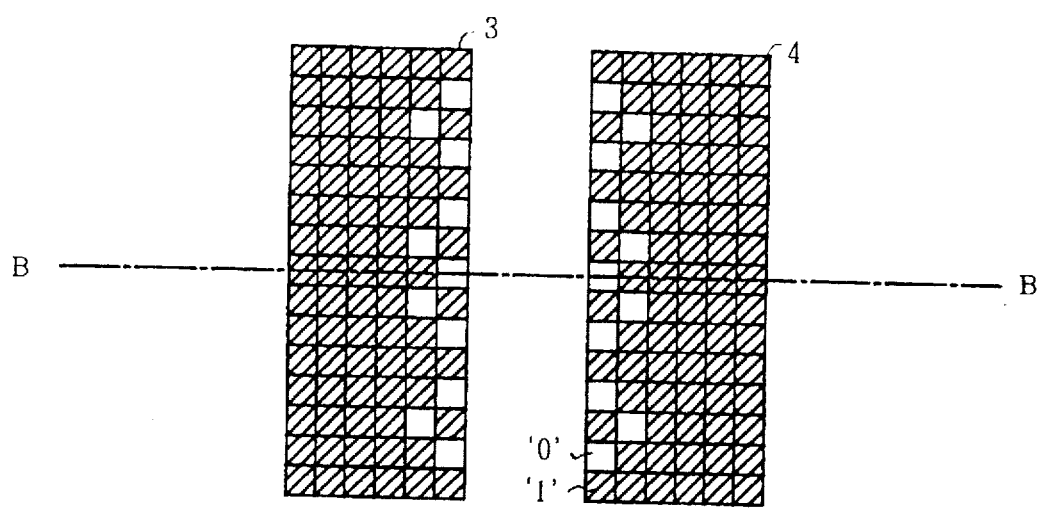
FIGS. 45(A) and 45(C) show prior art bit map data for which proximity effect correction has been performed and FIGS. 45(B) and 45(D) are diagrams showing dose distributions on the semiconductor wafer corresponding to line B—B in FIG. 45(A) and line D—D in FIG. 45(C) respectively.
Figure 45B:
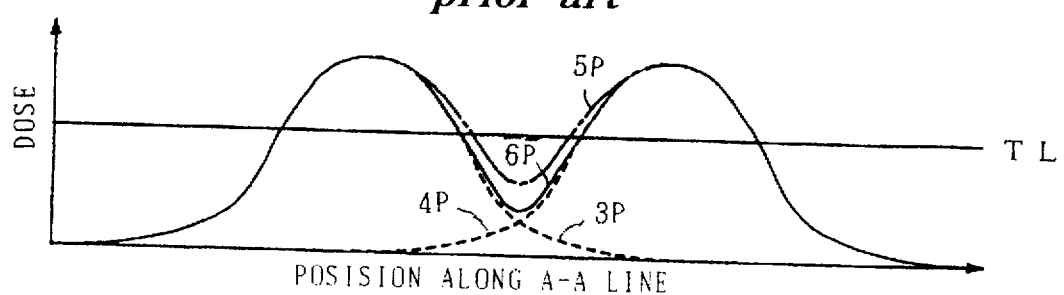
Figure 45C:
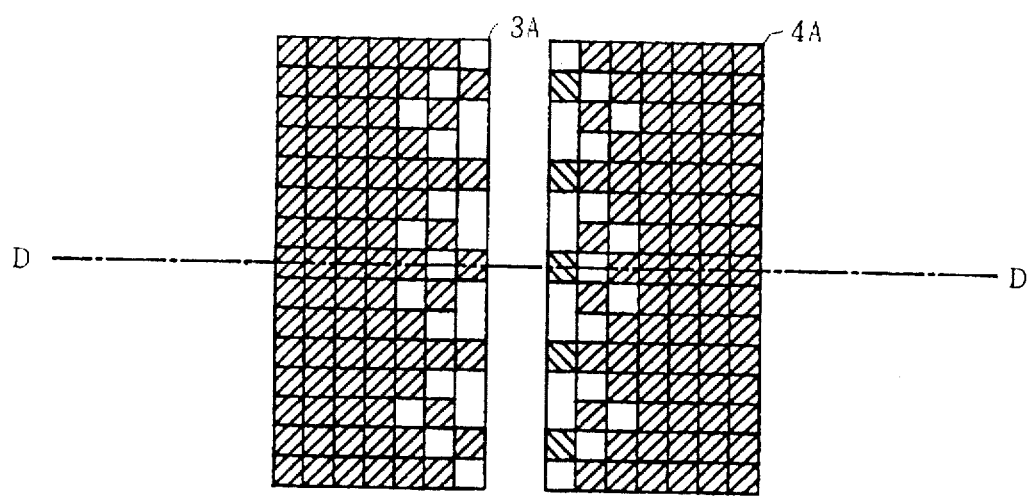
Figure 45D:
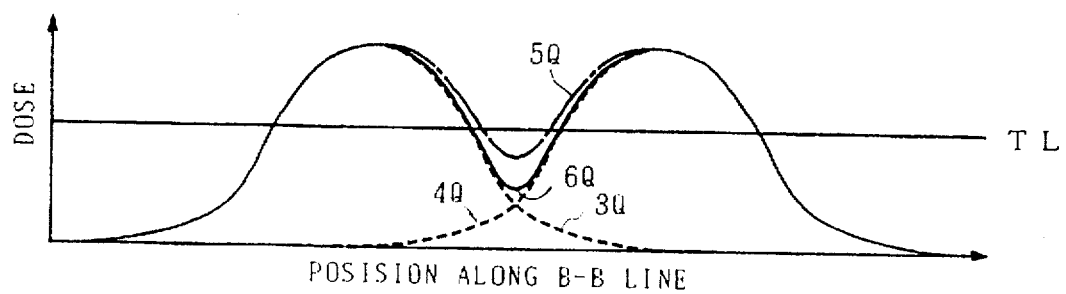

FIG. 29(D) and FIG. 30(C) are Identical to FIG. 45(A) and FIG. 45(C) respectively in the prior art. However, in the prior art, patterns for which proximity effect correction has been performed are directly registered in a storage and are selectively read out and, thus, it is necessary to register a great number of sets of bit map data. In contrast, according to the present invention, with one set of registered bit map data, i.e., the bit map data 130 in FIG. 29(A), proximity effect correction can be performed for various types of patterns and, thus, memory capacity can be reduced significantly. In addition, data registration and data management are facilitated. Furthermore, since the pre-correction processing for expanding patterns into bit map and processing for proximity effect correction can be performed in the same manner using the apparatus shown in FIG. 20, the processing is simplified.

10. Tenth Embodiment

Next, another method of proximity effect correction is explained.

Figure 32A:
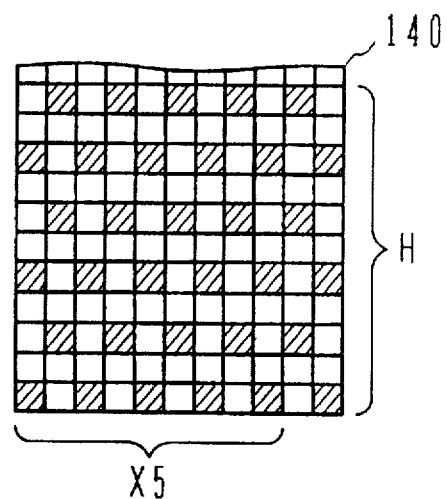
FIGS. 32(A) to 32(C) illustrate a method of proximity effect correction in the tenth embodiment according to the present invention, with FIG. 32(A) showing registered bit map data for proximity effect correction, FIG. 32(B) showing the bit map data to be corrected, FIG. 32(C) showing a partial area of the bit map data shown in FIG. 32(A) superimposed on the bit map data in FIG. 32(B)
Figure 32B:
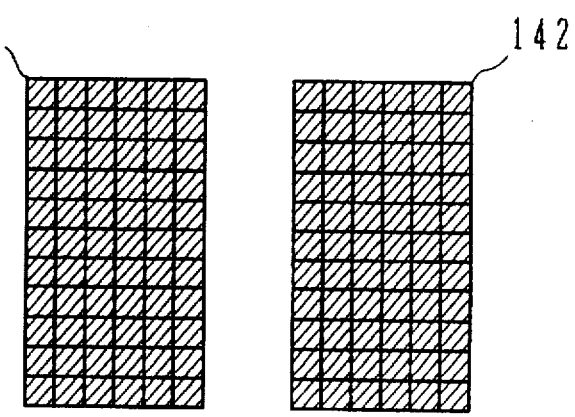
Figure 33A:
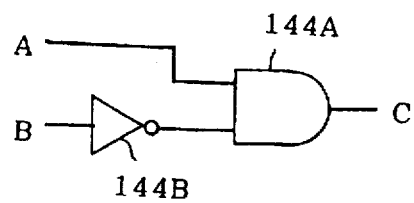
FIG. 33(A) is the circuit diagram.

Using registered bit map data 140 shown in FIG. 32(A), proximity effect correction is performed on bit map data 141 and 142 shown in FIG. 32(B), which are the object of correction, in the same manner as in the ninth embodiment explained earlier. However, in this embodiment, the logic operation for the bits In the pattern write part 98 in FIG. 20 is executed by using a logic circuit shown in FIG. 33(A). In other words, the AND of the bit A to be corrected and the result of inverting bit B for correction by an invertor 144B is executed at an AND gate 144A to obtain a corrected bit C.

This way, since A='0' is true for the bits between the bit map data 141 and the bit map data 142, C='0', thereby making it possible to correct the bit map data 141 and the bit map data 142 at the same time.

Figure 32C:
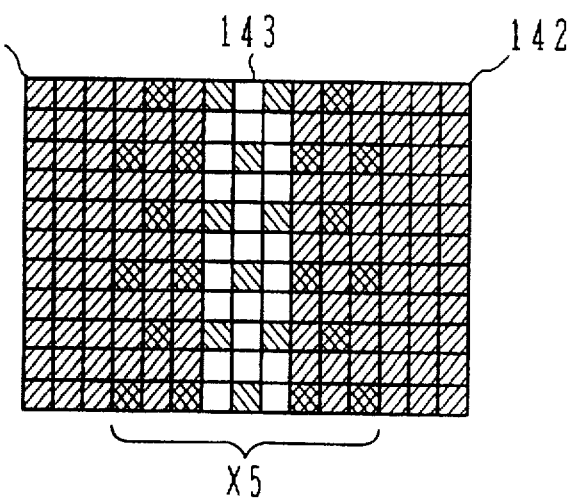

In that case, a portion X5 of the bit map data 140 is extracted by the mask word. FIG. 32(C) shows the bit map data 141 and 142 superimposed on bit map data 143, which is an extracted portion of the bit map data 140, and logic operation is performed for the superimposed bits. As a result, bit map data 145 and bit map data 146 shown in FIG. 33(B) are achieved.

Figure 33B:
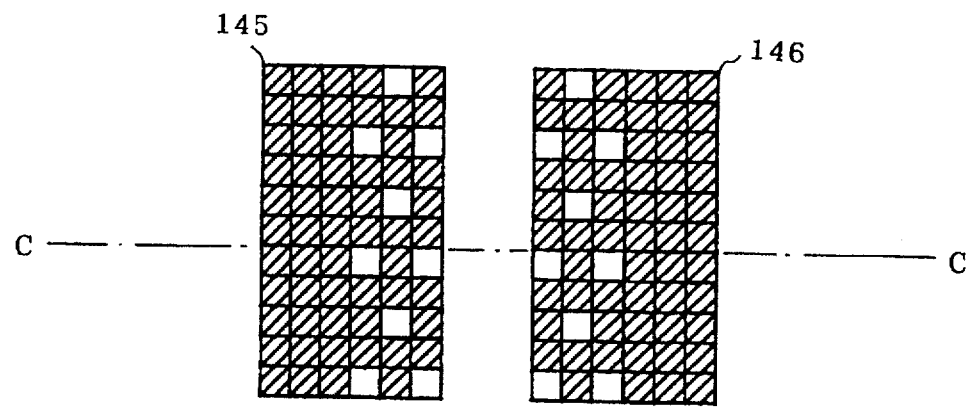
FIG. 33(B) shows bit map data for which proximity effect correction has been performed by performing logic operation in the circuit shown in FIG. 33(A) for the bits in the superimposed portion in FIG. 32(C)
Figure 33C:
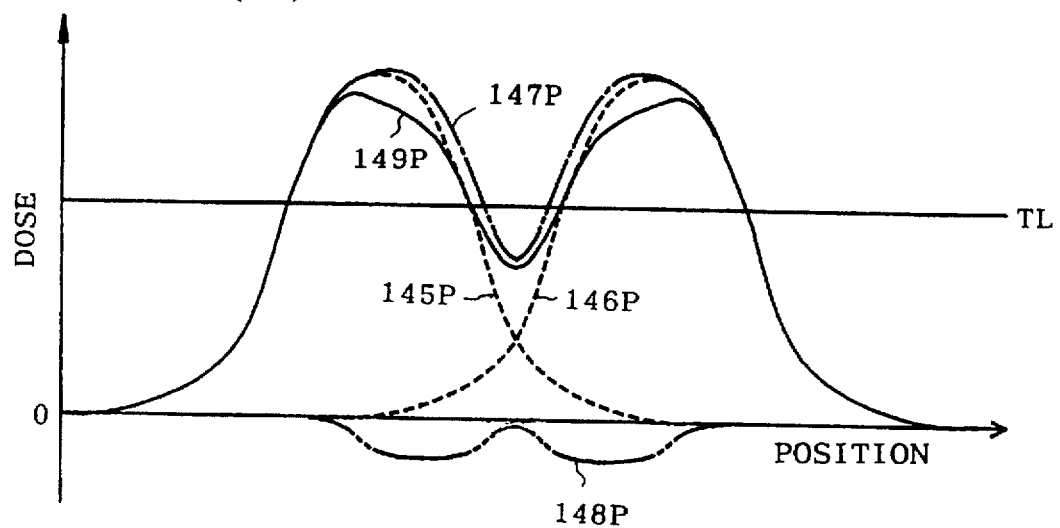
FIG. 33(C) is a diagram showing the dose distribution on the semiconductor wafer corresponding to line C—C in FIG. 33(B)

The dose distribution on the semiconductor wafer which corresponds to line C—C in FIG. 33(B) is as indicated with the curve 149P in FIG. 33(C). The curve 145P represents the dose distribution that corresponds to the bit map data 141 and the curve 146P represents the dose distribution that corresponds to the bit map data 142. The curve 147P represents the sum of the curve 145P and the curve 146P and represents the dose distribution that corresponds to the bit map data 141 and 142 that are in close proximity. The expanded resist pattern will be the pattern in the area where the dose quantity is at or above threshold value TL.

In the tenth embodiment according to the present invention, since proximity effect correction is performed for the bit map data 141 and the bit map data 142 at the same time by determining the portion X5 in correspondence to the distance between the bit map data 141 and the bit map data 142, the processing is simplified and speeded up.

11. Eleventh Embodiment

Figure 34:
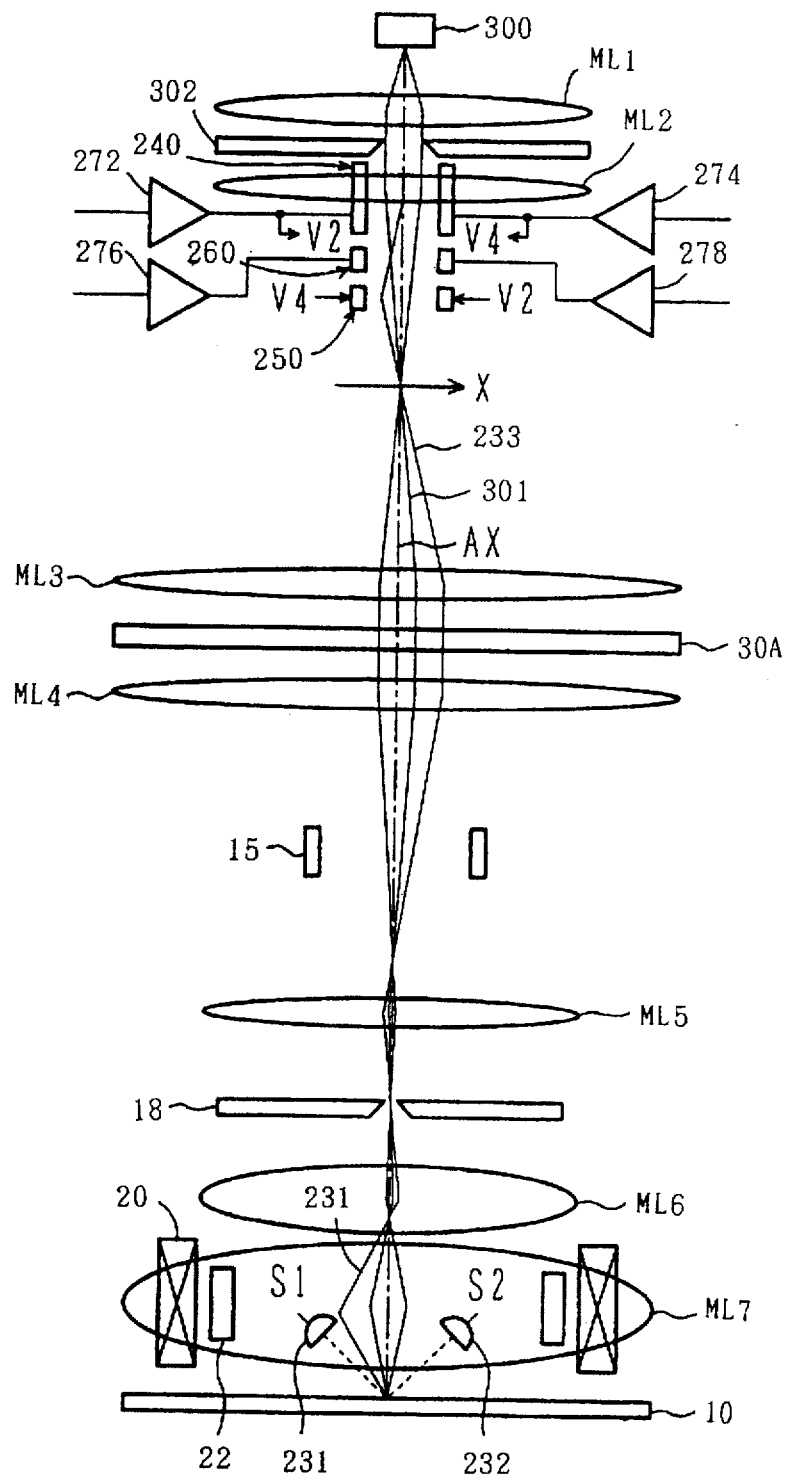
FIG. 34 shows the main portion of a system for charged particle beam exposure in the eleventh embodiment according to the present invention.

FIG. 34 shows the main portion of a system for charged particle beam exposure in an eleventh embodiment according to the present invention. The same reference numbers are assigned to component elements that are identical to those in FIG. 46 and their explanation is omitted.

Figure 35:
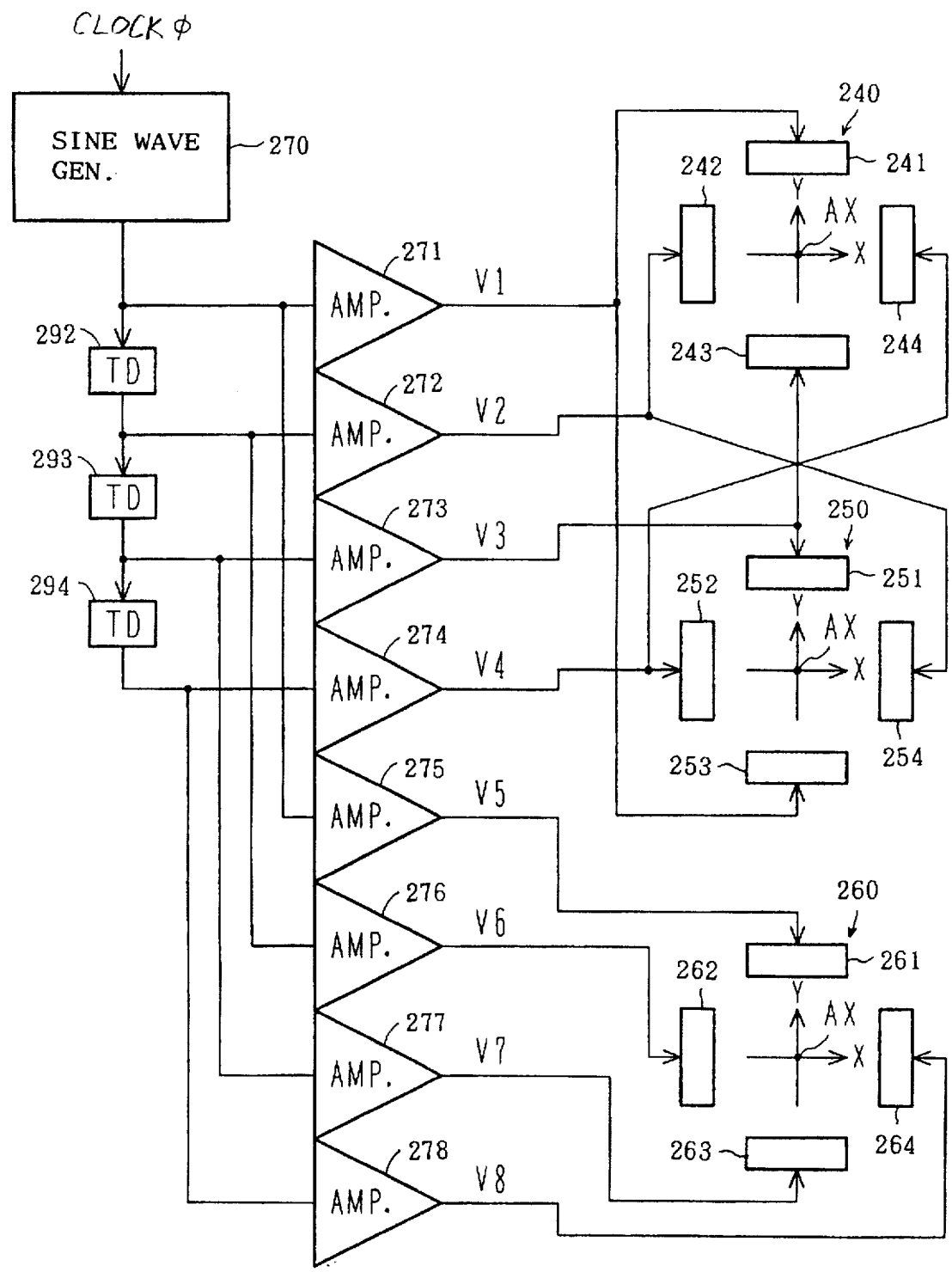
FIG. 35 shows a drive circuit for the deflectors in FIG. 34 for making the beam current density constant.

Electrostatic deflectors 240 and 250 are provided between an aperture stop 302 and an electromagnetic lens ML3 toward the aperture stop 302 along the optical axis AX. An electrostatic deflector 260 is provided between the electrostatic deflector 240 and the electrostatic deflector 250. As shown in FIG. 35, the electrostatic deflectors 240, 250 and 260 all have a 4-electrode structure with the four electrodes provided surrounding the optical axis AX, comprising a pair of electrode plates that face opposite each other in the direction of the X-axis running vertical to the optical axis AX and a pair of electrode plates that face opposite each other in the direction of the optical axis AX, in the direction of the Y-axis which runs vertical to the X-axis.

Exposure is performed in synchronization with the clock$\phi$ and a sine wave is generated by a sine wave generating circuit 270 in synchronization with this clock$\phi$. This sine wave is amplified by amplifiers 271 and 275 on the one hand and, on the other hand, passes through a delay element 292 so that its phase is delayed by 90°. The output of the delay element 292 is amplified by amplifiers 272 and 276 on the one hand and, on the other hand, passes through a delay element 293 so that its phase is delayed by 90°. The output of the delay element 293, in turn, is amplified by amplifiers 273 and 277 on the one hand, and on the other hand, passes through a delay element 294 so that its phase is delayed by 90°. The output of the delay element 294 is amplified by amplifiers 274 and 278.

The output voltages of the amplifiers 271 to 278 are respectively expressed as V1 to V8. The amplitudes of the voltages V1 to V4 are equal to one another and the voltages V5 to V8 have the waveform shown in FIG. 36. The amplitudes of the voltages V5 to V8 are also equal to one another and the voltages V5 to V8 have values that are in proportion to the voltages V1 to V4 respectively. The voltages V1 to V4 are provided to deflecting plates 241 to 244 respectively of the electrostatic deflector 240 on the hand, and are provided to deflecting plates 253 and 254 and deflecting plate 251 and 252 of the electrostatic deflector 250 on the other hand. In other words, voltages at reverse phase from those provided to the electrostatic deflector 240 are provided to the electrostatic deflector 250. The voltages V5 to V8 are provided to deflecting plates 261 to 264 respectively of the electrostatic deflector 260.

Figure 46:
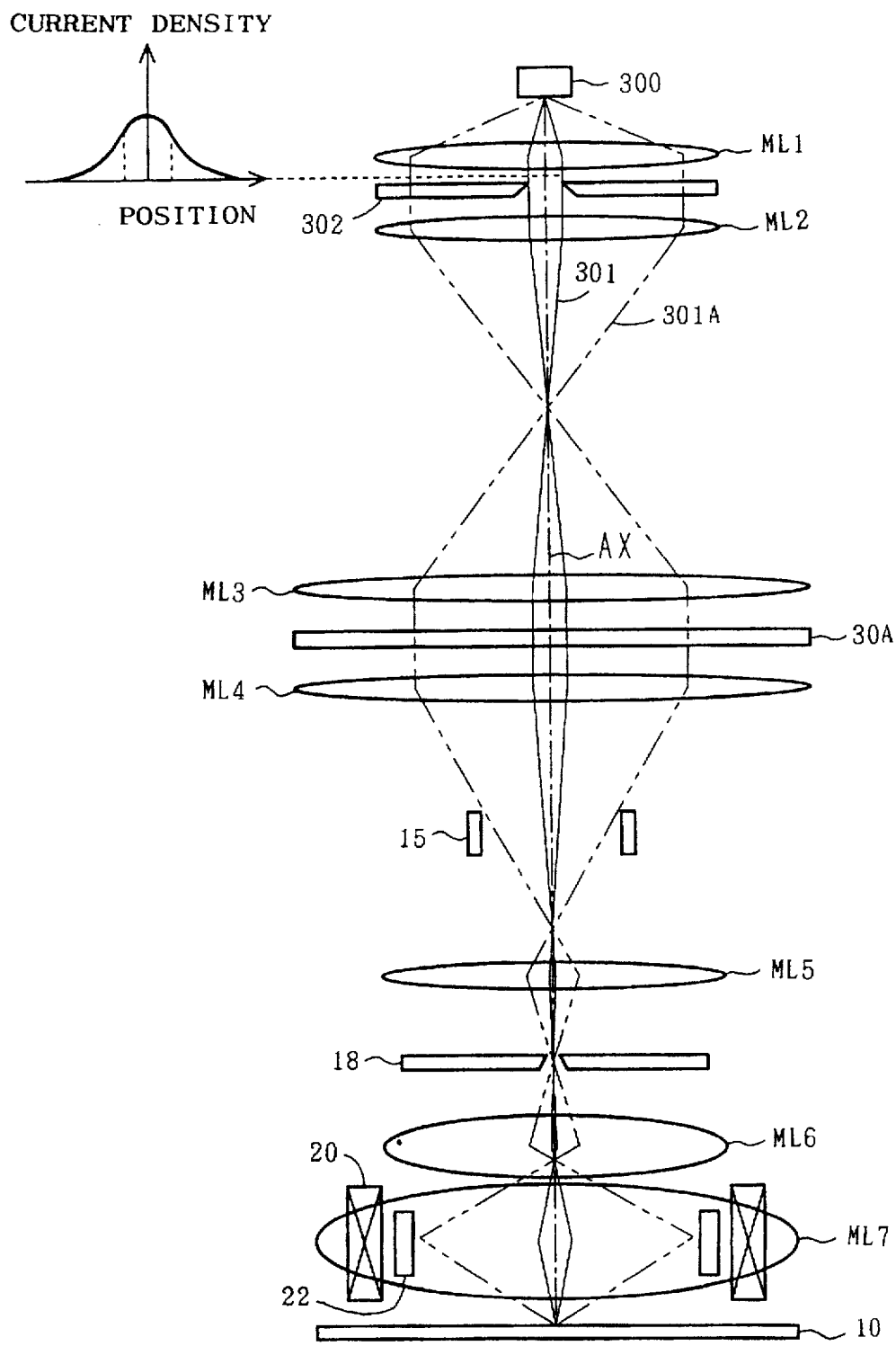
FIG. 46 shows the main portion of a prior art system for charged particle beam exposure.

The locus 301 in FIG. 301 is under the same condition as in FIG. 46. The locus 233 is a polygonal approximation of the locus obtained when a charged particle beam which has passe through the optical axis AX and has entered the electrostatic deflector 240 is deflected by the electrostatic deflectors 240 and 250. Since the direction of the electric field formed by the electrostatic deflector 240 and the direction of the electric field formed by the electrostatic deflector 250 are reversed from each other, the charged particle beam which has been swung by the electrostatic deflector 240 is then bent in the direction in which it is swung back by the electrostatic deflector 250. In ideal case, the cross overs under no deflection are the same under deflection as shown in FIG. 34. The electrostatic deflector 250 is at a distance from the electrostatic deflector 240 in order to bend the charged particle beam in the direction in which it is swung back after waiting for the deviation of the charged beam deflected by the electrostatic deflector 240 from the optic axis AX to reach a specific quantity.

Figure 37A:
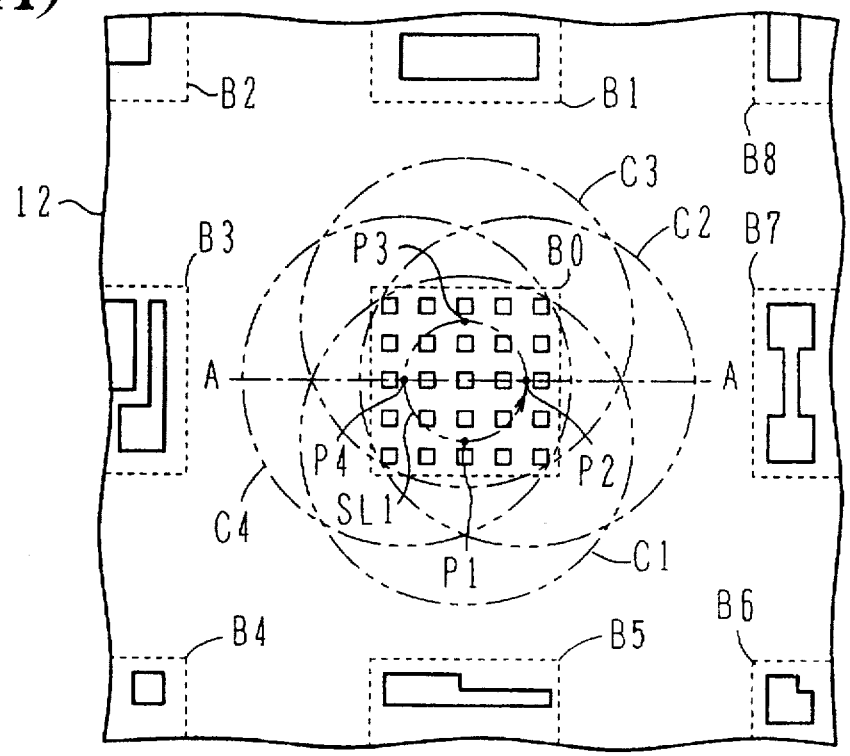
FIG. 37(A) is a plan view showing the scanning of a charge particle beam on a stencil mask.

FIG. 37(A) shows the scanning of charged particle beam on a stencil mask 30A.

Blocks B0 to B8 are all blocks of aperture patterns and the pattern for one block is projected in reduced size on a semiconductor wafer 10 with one shot. This one block is selected, as will be known to persons skilled in the field, with a charged particle beam swung by a deflector (not shown) provided between the electrostatic deflector 250 and the electromagnetic lens ML3 in FIG. 34, and is swung back onto to the optical AX by a deflector (not shown) provided between the electromagnetic lens ML4 and the electromagnetic lens ML5. A case in which the charged particles are electrons and the block B0 is selected is considered below.

Figure 36:
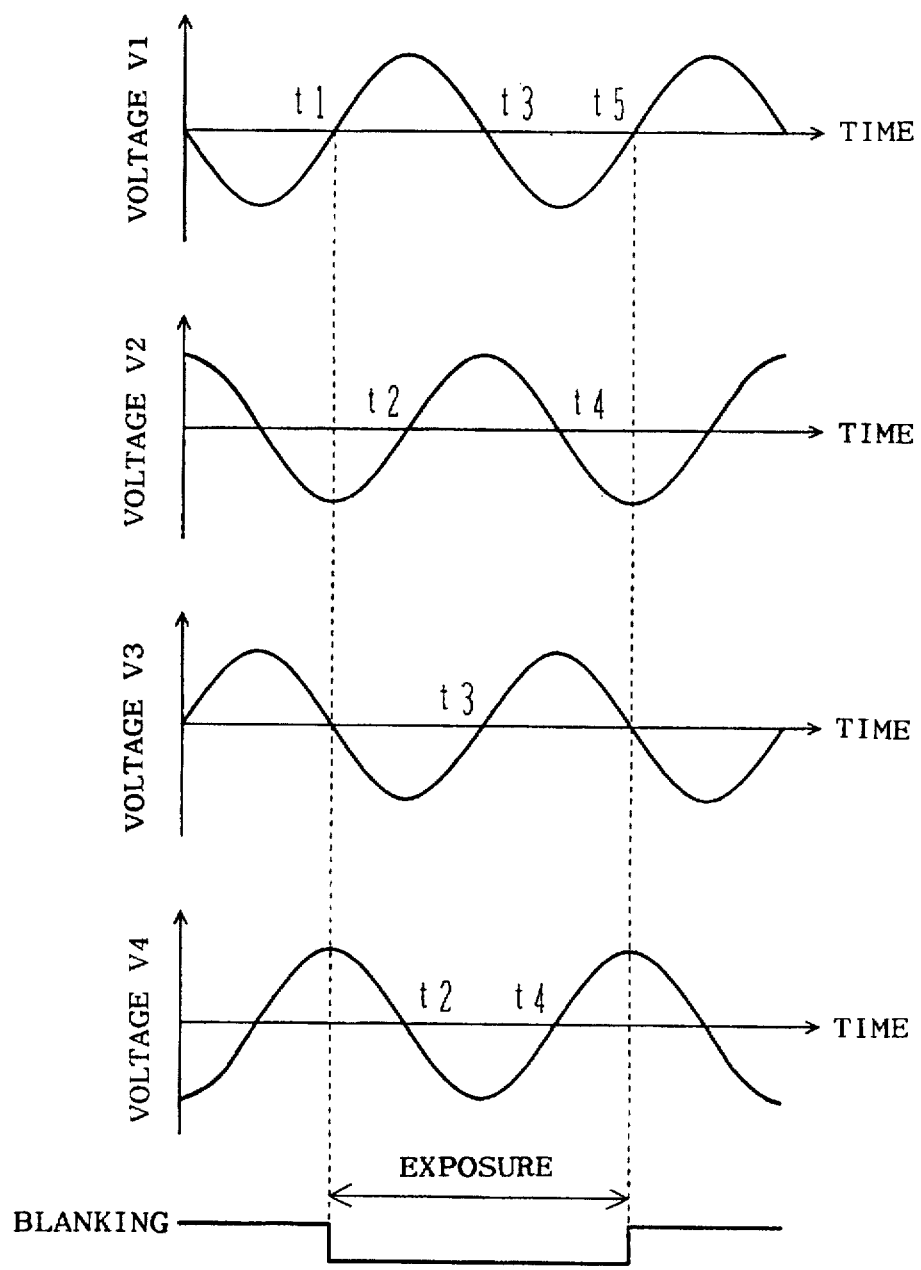
FIG. 36 is a waveform diagram of the voltages provided to the deflector for making the beam current density constant.
Figure 37B:
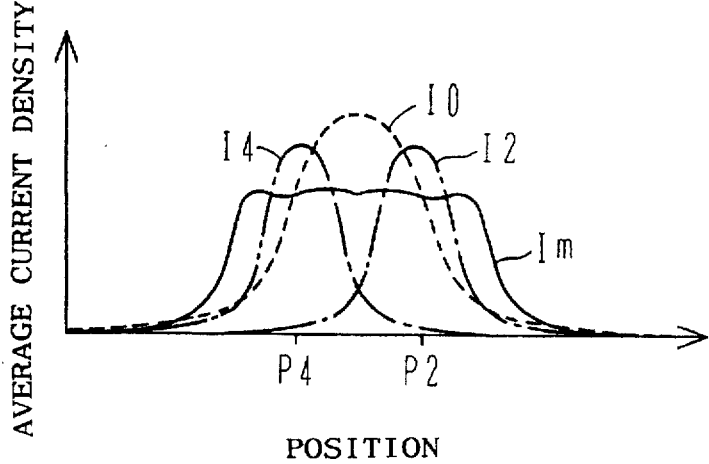
FIG. 37(B) is a diagram showing the time averaged beam current density distribution along the line A—A in FIG. 37(A)

The center of the charged particle beam scans over the circular beam scanning line SL1 which is indicated with the alternate long and short line in FIG. 37(A) at a constant speed and the center is at positions P1 to P4 and back to P1 at time points t1 to t5 respectively in FIG. 36. C1 to C4 are the shapes of the lateral cross sections of the charged particle beam when the center is at positions P1 to P4 respectively. The current density distributions of C4 and C2 along line A—A achieve approximate Gaussian distribution as indicated with I4 and I2 in FIG. 37(B). The time averaged current density for one cycle between time point t1 and t5 is as indicated with the solid line Im in FIG. 37(B) and is made approximately constant in the block B0, since a contribution is made on line A—A when the beam center is at a position other than the position P4 or P2 on the circumference apart from I4 and I2. I0, indicated with a dotted line, represents a case in which the emission intensity of the charged particle gun 300 is increased and the aperture of the aperture stop 302 is widened without using the electrostatic detectors 240, 250 and 260. It is obvious that the even distribution of the beam current density according to the present invention is superior by comparing the current density distribution Im against the current density distribution I0.

In FIG. 36, before the time point t1 or after the time point t5, the charged particle beam is swung by the blanking deflector 15 shown in FIG. 34 and is blocked by the aperture stop 18. During this period of time, the driving quantity of the main deflector 20 or the sub deflector 22 is changed, or the selection of a block on the stencil mask 30A is changed, in order to change the exposure position on the semiconductor wafer 10. Although FIG. 36 shows a case in which one cycle of the sine wave is equal to the exposure time T of one shot, normally one cycle of the sine wave only has to be made approximately equal to T/n, with n being a natural number.

For instance, one side of the block B0 is 0.5 mm and the distance between the electrostatic deflector 250 and the stencil mask 30A is 200 mm, resulting in small quantities of deflection imparted by the electrostatic deflectors 240 and 250. Because of this, exposure can be achieved even at high speed with the exposure time of one shot at 50 nsec and the frequency of the sine wave at 100 MHz (1 cycle=10 nsec).

In FIG. 34, the electrostatic deflector 250 ensures that the beam center passes through the center of the aperture in the aperture stop 18 by bending the charged particle beam which has been swung by the electrostatic deflector 240 in the direction in which it is swung back. The length of the electrostatic deflector 250 in the direction of the optical axis and its mounting position are determined during the design stage so that when the output voltages from the amplifiers 271 to 274 are commonly provided to the electrostatic deflectors 240 and 250, the locus 233 passes through the center of the aperture in the aperture stop 18. However, in reality, the locus 233 is offset from the center of the aperture in the aperture stop 18. The degree of this misalignment is in proportion to the intensity of the electric field of the electrostatic deflector 240 and the actual quantity of misalignment is very slight. Gain adjustment is performed for the amplifiers 275 to 278 to reduce this misalignment to zero. This adjustment is implemented by maximizing the sum S of secondary electron detection quantities S1 and S2 detected by secondary electron detectors 231 and 232, shown in FIG. 34, before exposure.

The gains of the amplifiers 275 to 278 are sufficiently smaller than the gains of the amplifiers 271 to 274. Since the output accuracy of an amplifier improves as the gain is reduced, the accuracy of correction of the misalignment caused by the electrostatic deflector 260 improves. When the phase of the correction quantity is reversed from that in the case shown in FIG. 35, connections should be changed so that the voltages V5 to V8 are provided to deflecting plates 263 and 264 and deflecting plates 261 and 262 respectively.

The electrostatic deflector 260 is provided between the electrostatic deflector 240 and electrostatic deflector 250 so that the free area is efficiently utilized and the entire configuration of the electrostatic deflectors 240, 250 and 260, which are related to each other, can be made more compact.

Next, the adjustment of the diameter of the beam scanning line SL1 in FIG. 37(A), i.e., gain adjustment for the amplifiers 271 to 274 in FIG. 35, is explained.

Figure 38A:
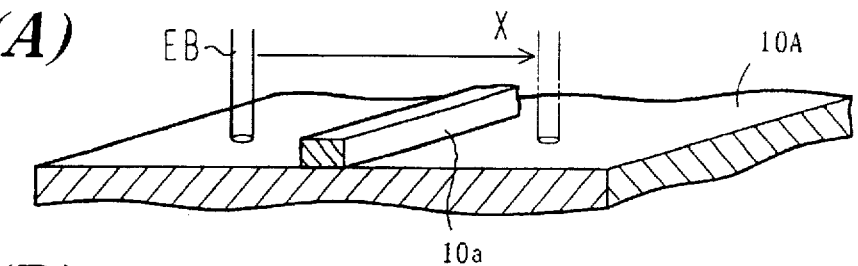
FIGS. 38(A) to 38(F) illustrate a method of gain adjustment for the amplifier in FIG. 35.

As shown in FIG. 38(A), a silicon wafer 10A with a linear pattern 10a formed with a substance in which (the number of secondary electrons emitted)/(the number of incident electrons) is larger than that of silicon, is used. With the lengthwise direction of the linear pattern 10a set as the direction of the Y-axis, In the state in which the cyclical drive voltages described above are provided to the electrostatic deflectors 240, 250 and 260, as explained earlier, and the voltage provided to the blanking deflector 15 at 0, the charged particle beam EB is swung in the direction of the X-axis at a speed which is sufficiently slower than this cyclical drive, by the deflector 22. The current density of the charged particle beam EB shown in FIG. 38(A) is averaged over time, as explained above. FIG. 38(A) shows a case in which the diameter of the time averaged charged particle beam EB is smaller than the width of the liner pattern 10a on the silicon wafer 10A and FIG. 38(D) show the reverse case. The sum of the secondary electron detection quantities S1 and S2 detected by the secondary electron detectors 231 and 232 in FIG. 34 is referred to as S when the charged particle beam is swung in this manner.

Figure 38B:
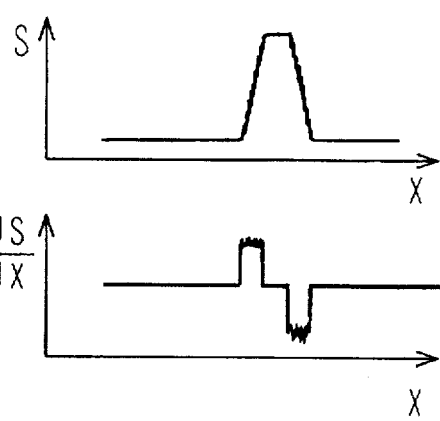
Figure 38C:
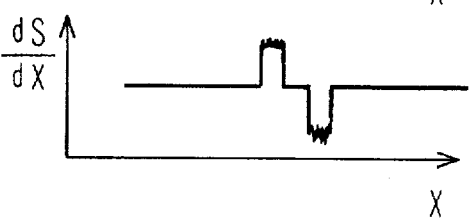
Figure 38D:
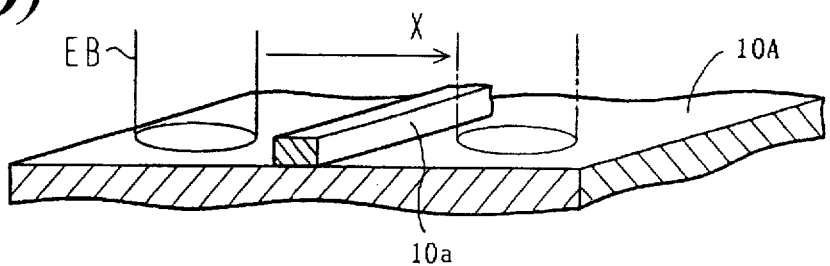
Figure 38E:
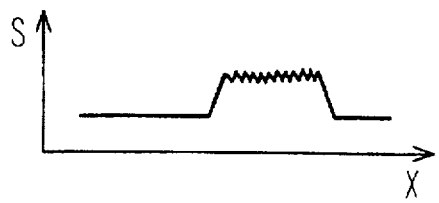
Figure 38F:
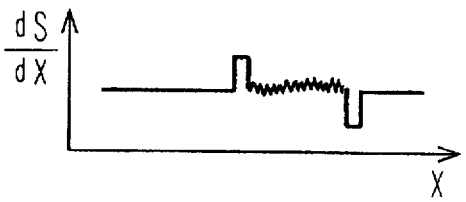

The secondary electron detection quantity S is as shown in FIG. 38(B) in the case illustrated in FIG. 38(A) and as shown in FIG. 38(E) in the case illustrated in FIG. 38(D). When the secondary electron detection quantity S in FIG. 38(B) is differentiated by X or time, the results are as shown in FIG. 38(C) and when the secondary electron detection quantity S in FIG. 38(E) is differentiated by X or time the results are as shown in FIG. 38(F). The portions with minute fluctuations in FIGS. 38(C), 38(E) and 38(F) indicate the degree of uneven distributions of the current density in the time average. Consequently, the gains of the amplifiers 271 to 274 must be adjusted to reduce the amplitude of the minute fluctuations. For this adjustment, the non-differentiated FIG. 38(E) is most desirable, among FIGS. 38(C), 38(E) and 38(F).

In the 11th embodiment according to the present invention, since the time averaged current density distribution of charged particle beam on a block can be made constant without reducing the block size on the stencil mask 30A, it becomes possible to draw more minute patterns without reducing throughput of exposure. In addition, it is possible to improve the throughput of exposure by increasing the lock size.

Variation 1

Figure 39:
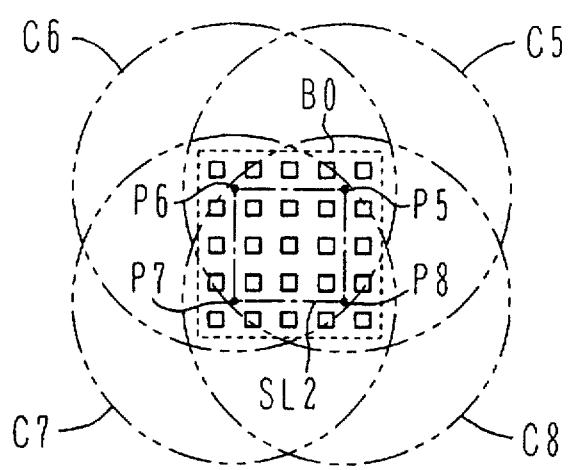
FIG. 39 is a plan view showing the scanning of a charged particle beam on a stencil mask in the first variation.

FIG. 39 shows a variation of the structure described above. Instead of the beam scanning line SL1 in FIG. 37, FIG. 39 features a beam scanning line SL2 with which the external shape of the block B0 is reduced, C5 to C8 are beam cross section shapes obtained when the center of the charged particle beam is at positions P5 to P8 on the beam scanning line SL2 respectively.

The scanning speed on the beam scanning line SL2 does not need to be constant. For Instance, in FIG. 35, one pulse may be provided to the deflecting plates 241 and 242 to set the beam center at the position P6 and then with this pulse delayed at the delay element 292, the delayed pulse may be provided to the deflecting plate 242 and 243 to move the beam center to the position P7. In subsequent operations this procedure is repeated. Also, the number of pulses in one cycle of the beam scanning line SL2 may be more than four. This way an advantage will be achieved in that the employment of pulse waveforms simplifies the circuit structure compared to the structure which employs sine waveforms.

Variation 2

FIG. 40 shows scanning of a charged particle beam on a BAA 30 when the BAA 30 is employed in place of the stencil mask 30A in FIG. 34.

When the BAA 30 is used, continuous exposure is performed for higher speed and the synchronous T for providing the voltage pattern to the mask 30 corresponds to one shot of block exposure employing the stencil mask. The cycle of the scanning of the charged particle beam on the BAA 30 should be approximately equal to T/n with n being a natural number.

In this variation, too, since the time averaged current density distribution of the charged particle beam on the block can be made constant without reducing the size of the BAA 30, it becomes possible to draw a more minute pattern without reducing the throughput of exposure. In addition, by increasing the size of the BAA 30, the throughput of exposure can be achieved. Furthermore, by increasing the rate of reduction of the scaled-down projection, to increase the size of the BAA 30, the service life of the BAA 30 can be lengthened.

Variation 3

Figure 40A:
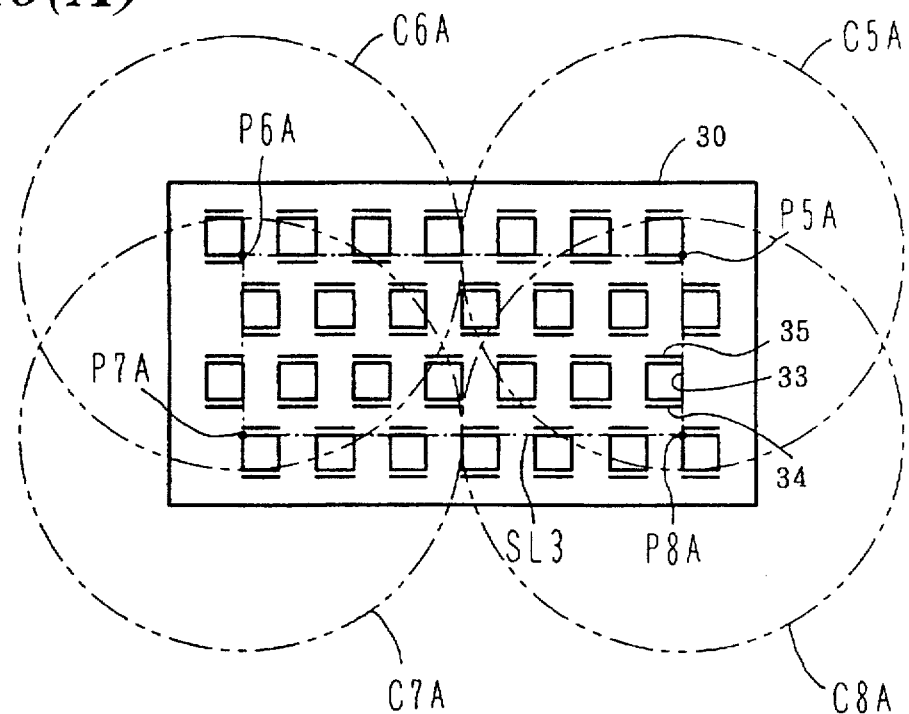
FIG. 40(A) is a plan view showing the scanning of a charged particle beam on a blanking aperture in the second variation.
Figure 40B:
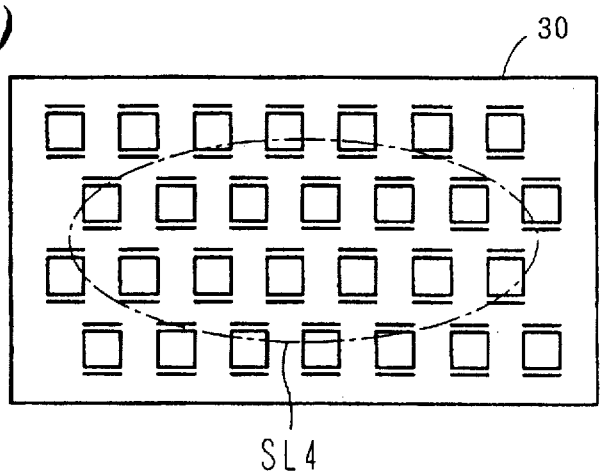
FIG. 40(B) is a plan view showing the scanning of a charged particle beam on a blanking aperture array in the third variation.

FIG. 40(B) shows a variation of FIG. 40(A) with the beam scanning line SL4 in this case being an oval.

12. Twelvest Embodiment

Figure 41:
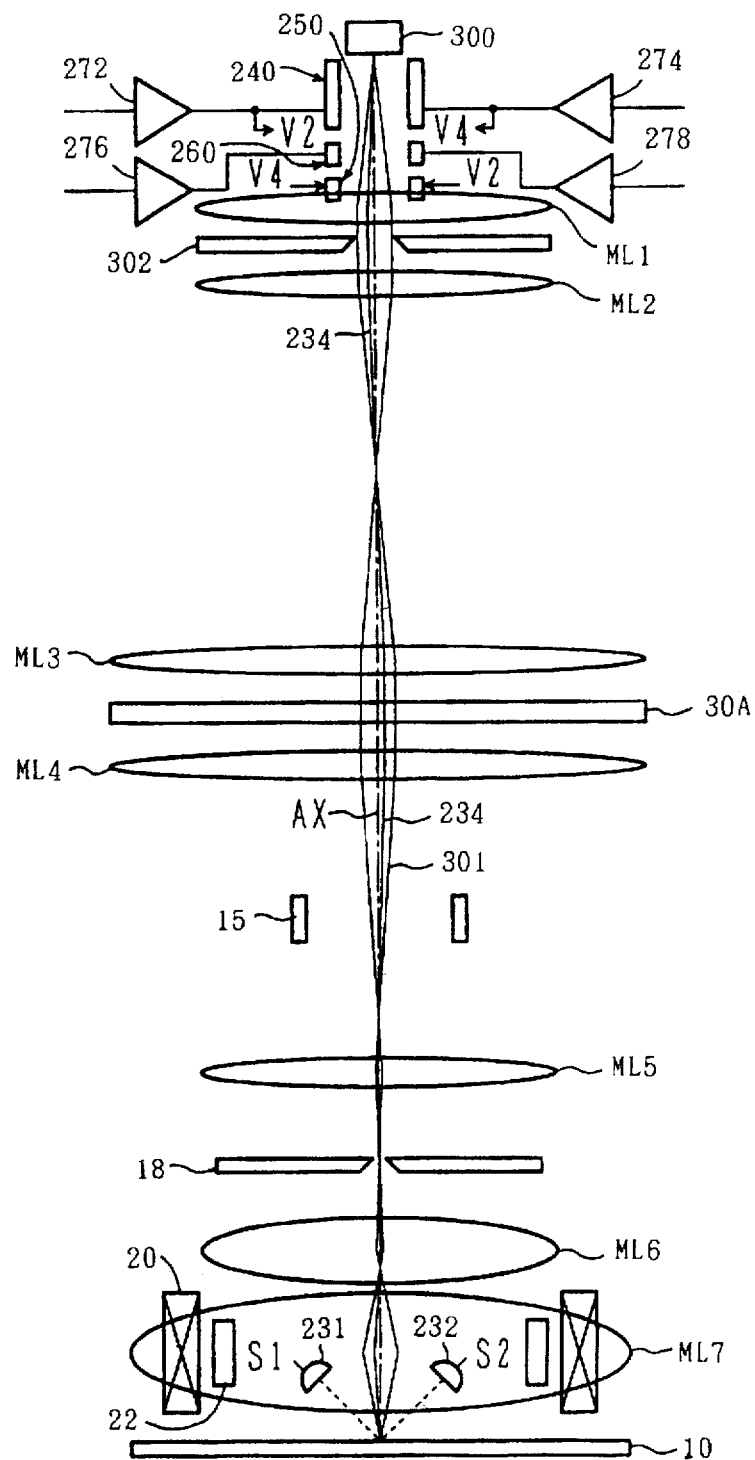
FIG. 41 shows the main portion of a system for charged particle beam exposure in the twelvest embodiment according to the present invention.
Figure 42A:
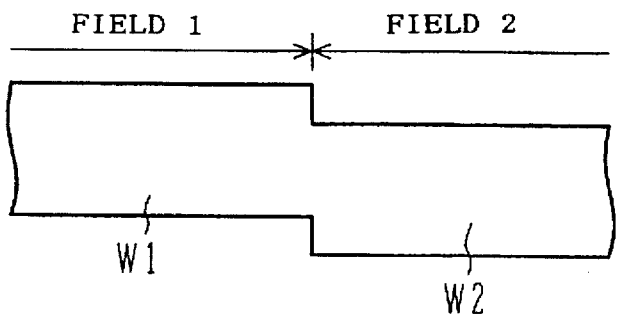
FIGS. 42(A) to 42(C) illustrate prior art exposure methods employed in connecting area between fields.
Figure 42B:
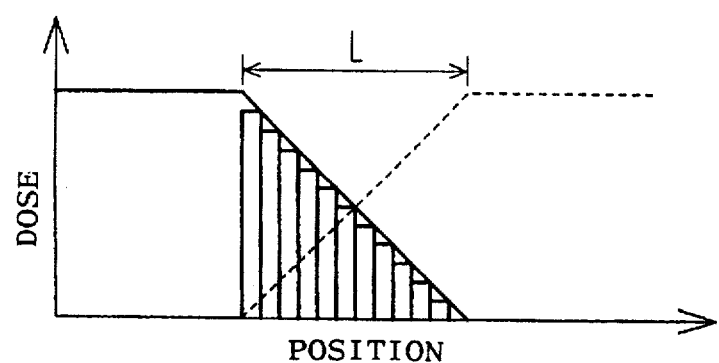
Figure 42C:
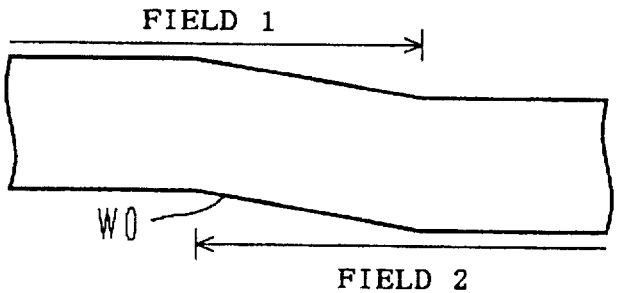

FIG. 41 shows the main portion of a system for charged particle beam exposure in the twelvest embodiment according to the present invention. In this system, the electrostatic deflectors 240, 250 and 260 are positioned between the charged particle gun 300 and the aperture stop 302. Scanning of the charged particle beam is performed on the aperture stop 302, instead of mask 30A, as likely the same as shown in FIG. 37(A), block B0 corresponding to the aperture of the aperture stop 302 in regard to the scanning. The locus 234 is, as the same as locus 233 in FIG. 34, a polygonal approximation of the locus obtained when a charged particle beam which has passed through the optical axis AX and has entered the electrostatic deflector 240 is deflected by the electrostatic deflectors 240 and 250.

With this embodiment, even if the range of scanning expands more than necessary, that portion of the charged particle beam is limited by the aperture stop 302. It is possible to use a mask having one rectangular aperture to make variable shaped beam as well as stencil mask and blanking aperture array mask. It is also possible to enlarge the aperture of the aperture stop 302 corresponding to the size of various masks, not possible in the prior art because of the Gaussian distribution of beam density.

13. Although preferred embodiments of the present invention has been described, it is to be understood that the invention is not limited thereto and that various changes and modifications may be made without departing from the spirit and scope of the invention.

For instance, the circulating shift register group 46 in FIG. 2 may be replaced with shift register groups that correspond to the modulated areas at one end and the other end of the band without satisfying the requirement (b). The modulation of data may be performed at the level preceding the buffer memory 41. In that case, instead of employing circulating shift registers, the present invention may take a structure in which the OR of the modulated data that are identical to the data that would be held in the circulating shift registers and the bit map data of a pattern is calculated simultaneously.

In addition, although FIG. 10 shows a structure in which the outputs from the multibeam control circuits 40A to 40C are parallel, only one multibeam control circuit 40 may be used, with the frequency of the clocks tripled so that data in three bits at the same exposure point are output in series, to be selected by a selector to achieve the same outcome as that in the second embodiment.

Furthermore, the present invention can be applied when forming band areas by scanning a charged particle beam In a linear direction through various methods of scanning. These band areas may be formed by, for instance, stopping the movement of the main deflector and scanning the charged particle beam linearly with the sub deflector.

Moreover, in order to further improve throughput, measures may be taken to ensure that the modulated area is formed in an area where it is clear that there is no pattern that runs astride band areas that are adjacent in the lengthwise direction. Or, the lengths or modulated areas may be changed in correspondence to the lengths of the band areas.

Although the range of the patent claims is limited to a desirable case in which the sum of the values of corresponding bits on a line that runs at a right angle to the linear direction of the first modulation data and the second modulated data increases or decreases approximately along the direction which corresponds to that linear direction, more complex changes such as initially increasing monotonically along that direction and then becoming reduced or, after becoming reduced, starting to increase, for instance, may be included.

The present invention includes a number of other variations. For instance, instead of the multilayer wiring board described earlier, a single layer wiring board may be employed. Also, in place of the cooling pipe, a Peltier element may be used. Furthermore, the hemispheres 64 and the pads 801 may be reversed. The pad array may be a regular terminal array and may be, for instance, an array at the front end surface of a conducting body embedded in a contact hole. Moreover, the hemispheres 64 are provided to ensure reliable contact and their shape does not have to be a hemisphere as long as the front end is smaller than the bottom surface.

In reference to the sixth embodiment, a case in which the address specifying part 93 and the shift bit number specifying part 97 are constituted with hardware, is explained, however, they may be constituted with software. Also in reference to the sixth embodiment, a case in which one standard isosceles right triangle that is registered in the library memory 91 is used, as a desirable example, but the triangle may be any other triangle.

The only positional requirement for the electrostatic deflector 240 is that it be positioned between the charged particle gun 300 and the mask 30A in principle. Since the quantities of deflection imparted by the electrostatic deflectors 240, 250 and 260 are small and the voltages provided and the deflection quantities are in a linear relationship, the only positional requirement for the electrostatic deflector 260 is that it be positioned between the charged particle gun 300 and the mask 30A in principle, and the only positional requirement for the electrostatic deflector 250 is that it be positioned between the electrostatic deflector 240 and the mask 30A in principle.

In addition, the waveform provided to the deflector for making the beam current density constant may be a Lissajous waveform or the like, as long as it can make the beam current density more constant than in the prior art.

The logic operation includes various types of operations. For instance, by reversing bits '1' and bits '0' in FIG. 30(B), an exclusive OR may be used instead of the AND. In addition, if the bits '1' and the bits '0' in both the bit map data which are to be corrected and the bit map data for correction are reversed, the AND will be used instead of the OR and the OR will be used instead of the AND.

What is claimed is:

1. A method of exposing a pattern on an object using pattern bit map data formed from individual bits, a charged particle beam, a blanking aperture array means having a plate, an aperture array on said plate, and a pair of electrodes on said plate for each aperture of said aperture array, said blanking aperture array means being positioned in a path of said charged particle beam, a charged particle beam radiating apparatus for making a multibeam by projecting said charged particle beam on to said blanking aperture array means, a multibeam control means for selectively providing voltage between each of said pairs of electrodes, based upon the pattern bit map data, to radiate said charged particle beam through said aperture array on to said object, and a deflector for deflecting said multibeam, said method comprising the steps of:

forming a first band area having a first end by scanning aid multibeam in a band direction, forming a second band area having a second end by scanning said multibeam in said band direction such that the first an second ends overlap by using pattern bit map data corresponding to the first end and the second end;

modulating pattern bit map data corresponding to the first end by validating/invalidating individual bits of said pattern bit map data with first modulation data; and modulating pattern bit map data corresponding to the second end by validating/invalidating individual bits of said pattern bit map data with second modulation data, wherein said first and said second modulation data are approximately complementary at corresponding bits, and a sum of bit values, on a line running at a right angle to said band direction increase or decrease along said band direction.

2. A method according to claim 1, further comprising a plurality of sets of said pattern bit map data to vary radiation of said charged particle beam, wherein said first and second modulation data are provided for each of said plurality of sets.

3. A method according to claim 2, wherein said first and second modulation data are obtained by alternately reversing said band direction.

4. A method according to claim 1, further comprising a mobile stage for mounting said object, wherein said first and second band areas are formed by continuously deflecting said multibeam in said band direction, while continuously moving said mobile stage at a right angle to said band direction and detecting said multibeam corresponding to movement of said mobile stage.

5. A system for exposing a pattern on an object using pattern bit map data formed from individual bits and a charged particle beam to form a multibeam, comprising:

blanking aperture array means having a plate and an aperture array positioned in said charged particle beam on said plate;

a pair of electrodes on said plate for each aperture of said aperture array;

a charged particle beam radiating apparatus for forming the multibeam by projecting said charged particle beam on to said blanking aperture array means;

a deflector for deflecting said multibeam;

deflecting control means for providing a drive signal to said deflector to form a first band area having an end by scanning aid multibeam in a band direction with said deflector, and a second band area having an end by scanning said multibeam in said band direction with said deflector, and for making the end of said second band area overlap the end of said first band area;

bit map data outputting means for outputting said bit map data, said bit map data outputting means outputting same bit map data corresponding to said ends;

modulating means having first modulation data and second modulation data for modulating said pattern bit map data corresponding to the end of said first band area by validating/invalidating the individual bits of said pattern bit map data with said first modulation data and to the end of said second band area by validating/ invalidating individual bits of said pattern bit map data with said second modulation data, wherein said first and second modulation data are approximately complementary at corresponding bits, and a sum of values of bits along a line running at a right angle to said band direction varies corresponding to said band direction; and multibeam control means for selectively providing a voltage based upon pattern bit map data modulated by said modulating means partially.

6. A system for exposing a pattern on an object using a charged particle beam to form a multibeam having an on-beam and a deflected off-beam, comprising:

a blanking aperture array means, having a downstream side and an aperture array, positioned in said charged particle beam;

a pair of electrodes corresponding to each aperture of said aperture array;

a charged particle beam radiating apparatus to form said multibeam by projecting said charged particle beam on to said blanking aperture array means;

an aperture plate for blocking said deflected off-beam, positioned at said downstream side of said blanking aperture array means and having an aperture array for allowing said on-beam to pass therethrough;

multibeam control means for making said on-beam and said deflected off-beam by providing a voltage corresponding to pattern bit map data;

a holder for holding said blanking aperture array means having a holder surface around said aperture array, a first terminal array having a front end and a bottom formed on said holder surface, a wiring pattern to connect s id first terminal array to said blanking aperture array means;

a lens barrel that forms a vacuum;

a wiring board having an inner portion and a wiring board surface facing said first terminal array a second terminal array having a front end and a bottom, formed on said wiring board surface corresponding to said first terminal array, formed in said wiring board corresponding to said aperture arrays a wiring pattern extending out from said second terminal array to provide a voltage from outside said lens barrel to said blanking aperture array means;

a supporter for fixing said wiring board to said lens barrel, said wiring board extending out of said lens barrel; and a Z stage for holding and moving said holder to connect said first terminal array to said second terminal array, wherein said front end of either of said first or second terminal array is thinner than a bottom surface thereof and said blanking aperture array means, said holder, said Z stage, the inner portion of said wiring board and said aperture plate are provided inside said lens barrel.

7. A system according to claim 6, further comprising:

an upstream side portion and a downstream side portion of said lens barrel, wherein said supporter further comprises:

a first member, having an outer end portion jointed to said upstream side portion of said lens barrel, adhered to said upstream side portion;

a second member, having an outer end portion jointed to said downstream side portion of said lens barrel, adhere to said downstream side surface;

a first sealing member for sealing said first member and said wiring board; and a second sealing member for sealing said second member and said wiring board.

8. A system according to claim 7, further comprising:

a terminating resistor connected to said wiring pattern of said wiring board;

a coaxial cable connected to said wiring pattern, said coaxial cable being out of said lens barrel; and a cooling device for cooling said wiring board.

9. A system according to claim 8, further comprising:

an outer end of said wiring board; and a connector mounted at said outer end to connect said wiring pattern with said coaxial cables.

10. A system according to claim 7, further comprising:

a driver, having an output, positioned at said wiring board outside said lens barrel, the output of said driver being connected to said wiring pattern of said wiring board; and cooling device for cooling said driver.

11. A system according to claim 10, further comprising:

a heater for heating said wiring board corresponding to supplied electric power to said wiring pattern; and a heater control device for supplying electric power to said heater corresponding to the number of said on-beams to reduce temperature fluctuations of said wiring board.

12. A system according to claim 11, wherein said electric power is (aσ+b) where σ is the number of on-beams and a and b are variable constants corresponding to the heater.

13. A system according to claim 11, further comprising:

a pair of electrodes for each array in said aperture array;

a standby; and a blanking deflector, provided between said blanking aperture array means and said aperture plate, for deflecting said multibeam to block said multibeam by said aperture plate during said standby, wherein said multibeam control means provides a deflecting voltage simultaneously to approximately half of said pairs of electrodes of said blanking aperture array means during said standby.

14. A system according to claim 13, further comprising:

a first group corresponding to approximately half of said pairs of electrodes; and a second group of pairs of electrodes corresponding to pairs of electrodes other than said first group; and a deflecting voltage, wherein said multibeam control device provides said deflecting voltage alternately to said first and second group during said standby.

15. A method of exposing a pattern on an object using a system that includes a charged particle beam to form a multibeam having an on-beam and a deflected off-beam, said system comprising:

a blanking aperture array means, having a downstream side and an aperture array, positioned in said charged particle beam;

a charged particle beam radiating apparatus to form said multibeam by projecting said charged particle beam on to said blanking aperture array means;

an aperture plate for blocking said deflected off-beam positioned at said downstream side of said blanking aperture array means and having an aperture for allowing said on-beam to pass therethrough;

multibeam control means for making said on-beam and deflected off-beam by providing a voltage corresponding to pattern bit map data;

a holder for holding said blanking aperture array means, having a holder surface around said aperture array, a first terminal array, having a front end and a bottom, formed on said holder surface, a wiring pattern to connect said first terminal array to said blanking aperture array means;

a lens barrel;

a wiring board having an inner portion and a wiring board surface facing said first terminal array, a second terminal array, having a front end and a bottom, formed on said holder surface corresponding to said first terminal array, an opening formed in said wiring board corresponding to said aperture array, a wiring pattern extending out from said second terminal array to provide a voltage from outside said lens barrel to said blanking aperture array means;

a supporter for fixing said wiring board to said lens barrel, said wiring board extending out of said lens barrel;

a Z stage for holding and moving said holder to connect said first terminal array to said second terminal array;

a driver, having an output positioned at said wiring board outside said lens barrel, said output being connected to said wiring pattern of said wiring board;

a heater for heating said wiring board; and a cooling device for cooling said driver, wherein said method comprises the step of:

supplying electric power to said heater corresponding to a number of said on-beams to reduce temperature fluctuations of said wiring board.

16. A method according to claim 15, wherein said electric power is (aσ+b), where σ is the number of on-beams and a and b are variable constants, said method further comprising the steps of:

changing said number of on-beams prior to actual exposure; and determining said constants a and b to reduce fluctuation of said charged particle beam on said object.

17. A method according to claim 16, wherein said system further comprises a pair of electrodes corresponding to each array in said aperture array, and a blanking deflector, provided between said blanking aperture array means and said aperture plate, for deflecting said multibeam to block said multibeam by said aperture plate during standby, wherein said method further comprises the step of:

providing a deflecting voltage simultaneously to approximately half of said pairs of electrodes of said blanking aperture array means during said standby.

18. A method according to claim 16, wherein said system further comprises:

a deflecting voltage;

a pair of electrodes corresponding to each array in said aperture array;

a first group corresponding to approximately half of said pairs of electrodes, a second group corresponding to pairs of electrodes other than said first group; and a blanking deflector, provided between said blanking aperture array means and said aperture plate, for deflecting said multibeam to block said multibeam by said aperture plate during standby, wherein said method further comprises the steps of:

providing a deflecting voltage alternately to said first and second group.

19. A method of expanding figure data corresponding to an exposure pattern into bit map data, comprising the steps of:

registering bit map data for a proximity effect correction in a storage in advance;

extracting a portion of said bit map data in said storage corresponding to a size of an object pattern to be corrected and a degree of proximity effect of said object pattern; and performing a logic operation between bit map data of said object pattern and said portion extracted.

20. A method according to claim 19, wherein said logic operation is (bit A) AND NOT(bit B), where bit A is from said object pattern, and bit B is said portion extracted.

21. A method of exposing a pattern, using a charged particle beam having a cross section, on an object using a system that includes a charged particle gun for emitting said charged particle beam, a first aperture stop having a first aperture for allowing said charged particle beam to pass through, a mask having an aperture for shaping the cross section of said charged particle beam passed through said first aperture, a second aperture stop having a second aperture for allowing said charged particle beam having passed through said first aperture to pass through, an electron lens system for making said charged particle beam cross over at said second aperture, and for getting demagnificated projection of said charged particle beam on said object, a first electrostatic deflector, positioned between said charged particle gun and said mask, for deflecting said charged particle beam, and a second electrostatic deflector, positioned between said first electrostatic deflector and said mask, for deflecting said charged particle beam, said method comprising the step of:

scanning said charged particle beam on said mask to make a time averaged current density of said charged particle beam approximately constant, within an area where said charged particle beam is radiated on said mask, by providing a first voltage to said first electrostatic deflector and a second voltage to said second electrostatic deflector to ensure that said charged particle beam passes through said second aperture, said second voltage being proportional to said first voltage.

22. A method according to claim 21, wherein said system includes a third electrostatic deflector, positioned between said charged particle gun and said second aperture stop, for deflecting said charged particle beam, and said method further comprises:

providing a third voltage to said third electrostatic deflector to correct positional misalignment of said charged particle beam at said second aperture, said third voltage being proportional to said first voltage.

23. A method according to claim 22, wherein said mask is a stencil mask having blocks of aperture patterns, and wherein said scanning is performed approximately an integer number of times.

24. A method according to claim 22, wherein said mask is a blanking aperture array mask having an aperture array and a pair of blanking electrodes formed for each aperture of said aperture array, and wherein said scanning is performed approximately an integer number of times on said blanking aperture array mask during one cycle of a voltage pattern provided to all of said pairs of blanking electrodes.

25. A method according to claim 22, said system further including a second amplifier for said third electrostatic deflector, said method further comprising the pre-exposure steps of:

adjusting a gain of said second amplifier so that an electric current of said charged particle beam having passed through said second aperture is maximized.

26. A method according to claim 21, said system further including a first amplifier for said first electrostatic deflector, said method further comprising the pre-exposure steps of:

irradiating said charged particle beam having passed through said second aperture on an object having a pattern on a substrate, the pattern having a secondary electron emission rate higher than a secondary electron emission rate of said substrate, and making said charged particle beam swing to cross said pattern;

measuring a quantity S of said secondary electrons from said object during a swing of said charged particle beam; and adjusting a gain of said first amplifier so that an amplitude of oscillation contained in S, or a differential for S, is minimized.

27. A system for exposing a pattern on an object using a charged particle beam having a cross section and a time averaged current density, comprising:

a charged particle gun for emitting said charged particle beam;

a first aperture stop having a first aperture for allowing said charged particle beam to pass through;

a mask having an aperture for shaping the cross section of said charged particle beam having passed through said first aperture; an area of said mask where said charged particle beam is to be radiated;

a second aperture stop having a second aperture for allowing said charged particle beam having passed through said first aperture to pass through; and an electron lens system for making said charged particle beam cross over at said second aperture, and for getting demagnificated projection of said charged particle beam on said object;

a first electrostatic deflector, positioned between said charged particle gun and said mask, for deflecting said charged particle beam;

a second electrostatic deflector, positioned between said first electrostatic deflector and said mask, for deflecting said charged particle beam; and a deflecting control circuit having a first, a second, and a third voltage, the second and third voltage proportional to the first voltage, for scanning said charged particle beam on said mask to make the time averaged current density of said charged particle beam within the area where said charged particle beam is to be radiated on said mask approximately constant, wherein the deflecting control circuit provides the first voltage to said first electrostatic deflector and the second voltage to said second electrostatic deflector to ensure that said charged particle beam passes through said second aperture.

28. A system according to claim 27, further comprising:

a third electrostatic deflector, positioned between said charged particle gun and said second aperture stop, for deflecting said charged particle beam, wherein said deflecting control circuit provides the third voltage to said third electrostatic deflector to correct positional misalignment of said charged particle beam at said second aperture.

29. A system according to claim 28, wherein said first, second and third electrostatic deflectors are positioned at first aperture stop, wherein said third electrostatic deflector is positioned between said first electrostatic deflector and said second electrostatic deflector, and wherein said deflecting control circuit further comprises:

a circuit for generating a periodic signal;

a first amplifier for amplifying said periodic signal to provide said first and second voltage to said first and second electrostatic deflectors respectively to make said first and second voltages become reverse phase relative to each other; and a second amplifier for amplifying said periodic signal to provide said third voltage to said third electrostatic deflector.

30. A method of exposing a pattern on an object using pattern bit map data formed from individual bits having a sum value, and radiating a charged particle beam from a charged particle beam radiating unit to form a multibeam, comprising the steps of:

forming a first band area having a band direction and a first end by scanning said multibeam in a band direction;

forming a second band area having a second end by scanning said multibeam in a reverse band direction, such that the first and second ends overlap by using corresponding pattern bit map data;

modulating said pattern bit map data corresponding to said end of said first band area by validating/invalidating individual bits of said pattern bit map data with first modulation data; and modulating said pattern bit map data corresponding to said end of said second band area by validating/invalidating individual bits of said pattern bit map data with second modulation data, wherein said first and second modulation data are approximately complementary at corresponding bits, and the sum of bits perpendicular to said band direction varies along said band direction.

31. A method of exposing a pattern on an object using pattern bit map data formed from individual bits having a sum value, and radiating a charged particle beam from a charged particle beam radiating unit to form a multibeam, comprising the steps of:

forming a first band area having a band direction and a first end by scanning said multibeam in a band direction;

forming a second band area having a second end by scanning said multibeam in said band direction, such that the first and second ends overlap by using corresponding pattern bit map data;

modulating said pattern bit map data corresponding to said end of said first band area by validating/invalidating individual bits of said pattern bit map data with first modulation data; and modulating said pattern bit map data corresponding to said end of said second band area by validating/invalidating individual bits of said pattern bit map data with second modulation data, wherein said first and second modulation data are approximately complementary at corresponding bits, and the sum of bits perpendicular to said band direction varies along said band direction.

32. A method of expanding figure data corresponding to an exposure pattern into bit map data, comprising the steps of:

registering bit map data of a first figure in a storage in advance;

setting a value for a leading address, AO and an expansion ratio, RA;

(1) addressing said storage with read address A to read out a portion of said bit map data of said first figure, where A=AO+[RA·i], where AO and i are integers and [ ] is an operator for rounding a value to an integer;

(2) incrementing or decrementing i one by one; and repeating a loop of said steps (1) and (2) to generate bit map data of a second figure by multiplying said first figure by approximately 1/RA in a data read-out direction Y.

33. A method according to claim 32, further comprising the step of:

(3) masking a word of said data read from said address A to get bit map data of a third figure, wherein said step (3) is in said loop of said steps (1) and (2), after said step (1).

34. A method according to claim 32, further comprising the steps of:

(4) loading a word of said bit map data of said second or third figure to a shift register; and (5) obtaining bit map data from said shift register corresponding to a fourth figure by transforming said second or third figure in a direction X perpendicular to said data read-out direction Y by shifting said shift register by S bit(s), where S=SO+[RS−i], RS is a shearing deformation ratio and SO is an integer, wherein said steps (4) and (5) are in said loop of said steps (1) and (2), after said step (1).

35. A method according to claim 34, wherein said first figure is a right triangle having sides extending in said directions X and Y.

36. A method according to claim 35, wherein said portion of said bit map data read from said storage in step (1) is trapezoid to make said fourth figure trapezoid.

37. A method according to claim 35, wherein said portion of said bit map data read from said storage in step (1) is a line to make said fourth figure a parallelogram.

38. A method according to claim 34, further comprising the steps of:

(6) addressing a canvas memory with a read address AC YS+i, where YS is a leading address;

(7) performing a logic operation between a word of said bit map data of said fourth figure and a word read from said canvas memory; and (8) writing a result of said logic operation to said address AC of said canvas memory;

said steps (6) to (8) being in said loop of said steps (1) and (2) and after said step (5) to make a block of exposure bit map data in said canvas memory.

39. A method according to claim 38, wherein said fourth figure is expressed by a record having items of IDC, OPC, XS, said YS, COI, said RA and said RS, where IDC is an identification code of said first figure:

OPC is a operation code of said logic operation,

XS is a bit position, in said X direction, of an origin of said fourth figure in said canvas memory, and COI is cut out (read out) information of said portion from said first figure.

40. A method according to claim 39, wherein said item COI has sub-items W and H, where W is a width of said fourth figure in said direction X and relates to said masking and H is a width of said fourth figure in said direction Y equal to a repeat number of said loop.

41. A method according to claim 39, wherein said bit map data of said first figure is bit map data for proximity effect correction;

wherein said logic operation of step (7) is for said proximity effect correction, and wherein said cut out information is determined corresponding to a size of an object pattern to be corrected and a degree of proximity effect of said object pattern.

42. A method according to claim 38, further comprising a first record and a second record, said first record having items of IDC, OPC, XS, said YS and COI, where IDC is an identification code of said first figure, OPC is a operation code of said logic operation, XS in a bit position, in said direction X, of an origin of said fourth figure in said canvas memory, COI is cut out information of said portion from said first figure, and said second record having said expansion ratio RA and said shearing deformation ratio RS, said second record being usable in common with a plurality of said first records until renewal.

43. A method according to claim 42, wherein said bit map data of said first figure is bit map data for proximity effect correction, wherein said logic operation of step (7) is for said proximity effect correction, and said cut out information is determined corresponding to a size or an object pattern to be corrected and a degree of proximity effect of said object pattern.

44. A method according to claim 38, wherein said bit map data of said first figure is bit map data for proximity effect correction, and wherein said logic operation of step (7) is for said proximity effect correction.

45. An apparatus for expanding figure data, corresponding to an exposure pattern into bit map data having words, comprising:

a storage for storing bit map data;

a first figure having bit map data registered in said storage in advance;

addressing means for addressing said storage with a read address A to read a portion of said bit map data of said first figure as bit map data of a second figure by multiplying said first figure by approximately 1/RA in a data read-out direction Y, where RA is an expansion ratio, and A=A0+[RA·i], where A0 is a leading address and i is a count, A0 and i being integers and being an operator for rounding to an integer;

masking means for masking one of said words of said data read from said address A with mask bit pattern to get bit map data of a third figure;

a shift register to load one of said words of said bit map data of said second or third figure;

shift count means for making said shift register shift by S bit(s), where S=S0+[RS·i], where S0 is an initial shift bit number and RS is a shearing deformation ratio, to get bit map data of a fourth figure by transforming said second or third figure in a direction X perpendicular to said data read-out direction Y;

a block of exposure bit map data having words;

a canvas memory for making said block of exposure bit map data;

a read address AC=YS+i, where YS is a leading address; a pattern writing means for addressing said canvas memory with said read address AC for performing a logic operation between one of said words of said bit map data of said fourth figure and one of said words read from said canvas memory, and for writing a result of said logic operation to said address AC of said canvas memory; and control means for incrementing or decrementing said count i one by one, for providing said AO and RA to said addressing means, for providing said mask bit pattern to said masking means, for providing said SO and RS to said shift count means, and for providing said YS to said pattern writing means.

\* \* \* \* \*

UNITED STATES PATENT AND TRADEMARK OFFICE
CERTIFICATE OF CORRECTION

PATENT NO. : 5,841,145

DATED : November 24, 1998

INVENTOR(S) : Satoh et al.

It is certified that error appears in the above-identified patent and that said Letters Patent is hereby corrected as shown below:

Col. 2, line 47, change "10 g" to --10g--.

Col. 3, line 22, after "effect" insert --becomes more pronounced. The proximity effect is where--.

Col. 7, line 48, after "board," insert --an--;
line 64, change "expose" to --exposure---.

Col. 9, line 18, change "contaction" to --contraction--;
line 31, change "a lowing" to --allowing--.

Col. 12, line 15, change "a dressing" to --addressing--;
line 37, change "or" (second occurrence) to --for--;
line 45, change "or" to --for--;
line 53, change "or" to --for--;
line 58, change "or" to --for--.

Col. 14, line 51, delete "further".

Col. 15, line 50, change "election" to --electron--.

Col. 19, line 34, change "canned" to --scanned--.

Col. 20, line 19, change "expose" to --exposed--;
line 38, change "direct on" to --direction--.

UNITED STATES PATENT AND TRADEMARK OFFICE
CERTIFICATE OF CORRECTION

PATENT NO. : 5,841,145

DATED : November 24, 1998

INVENTOR(S) : Satoh et al.

It is certified that error appears in the above-identified patent and that said Letters Patent is hereby corrected as shown below:

Col. 34, line 1, change "In" to --in--.

Col. 36, line 65, change "In" to --in--.

Col. 37, line 9, change "show" to --shows--.

Col. 38, line 56, change "clocks" to --clock φ--;
line 61, change "In" to --in--.

Col. 39, line 3, change "or" to --of--.

Col. 40, line 7, change "aid" to --said--;
line 11, change "an" to --and--;
line 57, change "aid" to --said--.

Col. 41, line 36, change "s id" to --said--;
line 44, after "array" insert --an opening--;
line 45, change "arrays" to --array--;
Col. 42, line 61, change "blacking" to --blocking--.

Col. 47, line 48, after "AC" insert -- = --.

Signed and Sealed this

Fourteenth Day of March, 2000

Attest:

*Attesting Officer*

Q. TODD DICKINSON

*Commissioner of Patents and Trademarks*